(12) United States Patent
Fujimoto

(10) Patent No.: US 8,198,661 B2
(45) Date of Patent: Jun. 12, 2012

(54) SEMICONDUCTOR DEVICE AND METHOD OF FORMING SEMICONDUCTOR DEVICE

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 237 days.

(21) Appl. No.: 12/637,480

(22) Filed: Dec. 14, 2009

(65) Prior Publication Data

US 2010/0148233 A1 Jun. 17, 2010

(30) Foreign Application Priority Data

Dec. 15, 2008 (JP) ................................ 2008-318618

(51) Int. Cl.
*H01L 27/108* (2006.01)
(52) U.S. Cl. ............... 257/296; 257/302; 257/E21.658
(58) Field of Classification Search .......... 257/301–305, 257/E27.088, E27.096, E21.658
See application file for complete search history.

(56) References Cited

U.S. PATENT DOCUMENTS

| 6,627,940 | B1 | 9/2003 | Schumann et al. |
| 7,064,373 | B2 * | 6/2006 | Goebel et al. ................. 257/301 |
| 7,749,840 | B2 * | 7/2010 | Yun et al. ..................... 438/262 |

FOREIGN PATENT DOCUMENTS

| JP | 07-273221 | 10/1995 |
| JP | 2002-541667 | 12/2002 |
| JP | 2007-329480 | 12/2007 |

* cited by examiner

*Primary Examiner* — Michael Lebentritt
*Assistant Examiner* — Raj R Gupta
(74) *Attorney, Agent, or Firm* — Young & Thompson

(57) ABSTRACT

A semiconductor device include a semiconductor substrate comprising a substrate body, a base over the substrate body and a pillar over a first region of the base; a buried line adjacent to a side surface of the base; a first diffusion layer over a second region of the base; a second diffusion layer over the pillar, the second diffusion layer being higher in level than the first diffusion layer; and a third diffusion layer disposed between the buried line and the semiconductor substrate. The third diffusion layer is different in level from the first diffusion layer. The top level of the third diffusion layer is lower than the top level of the first diffusion layer.

17 Claims, 61 Drawing Sheets

FIG. 5A
FIG. 5B
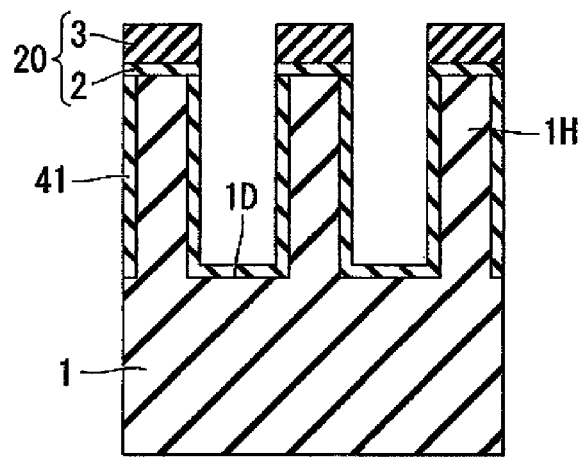
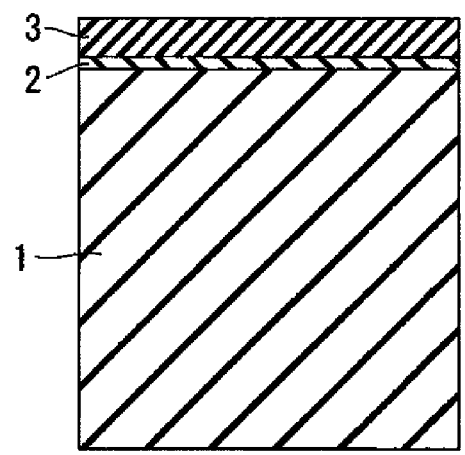
FIG. 5C
FIG. 5D
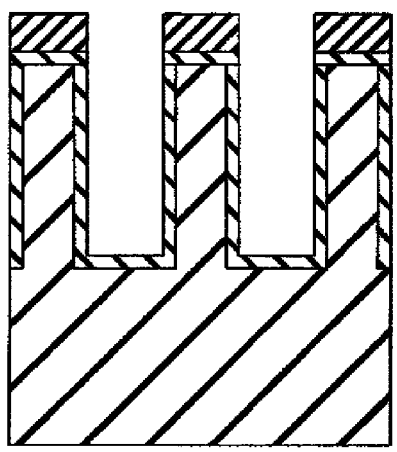
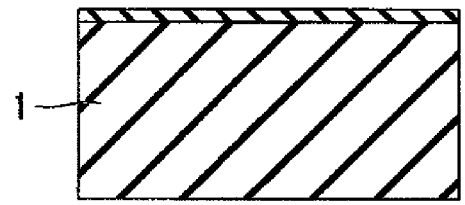

FIG. 25A
FIG. 25B
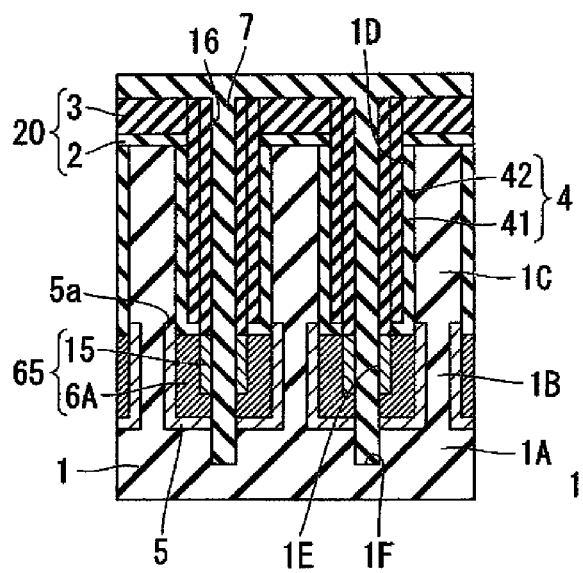
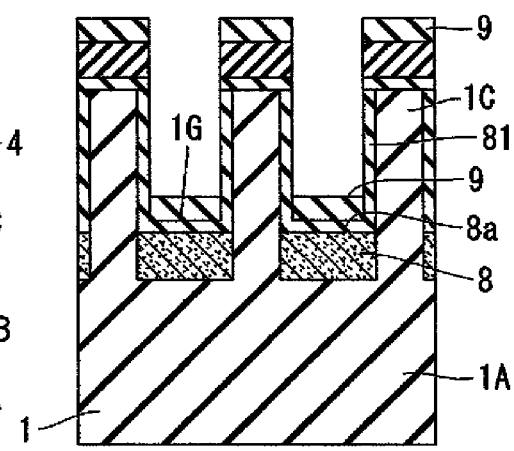
FIG. 25C
FIG. 25D

FIG. 36A
FIG. 36B
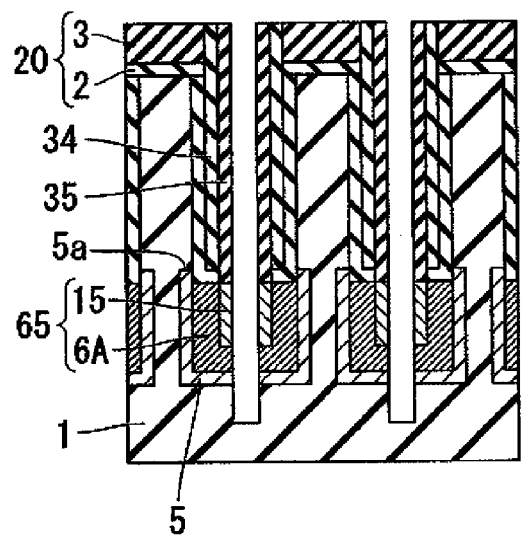
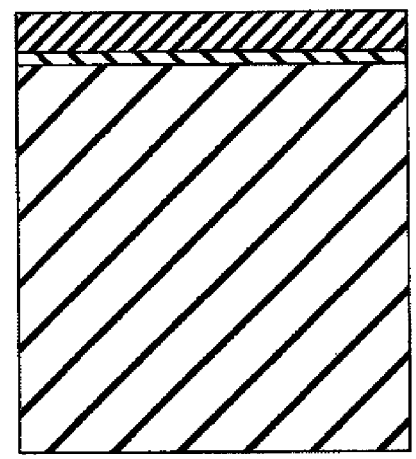
FIG. 36C
FIG. 36D
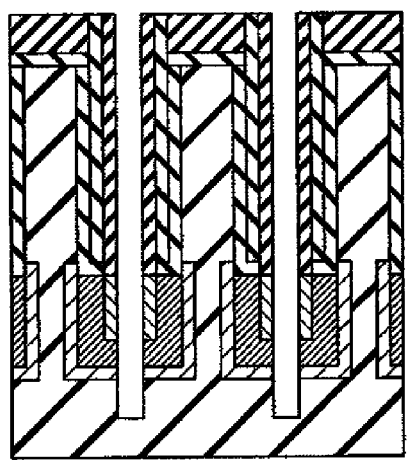

SEMICONDUCTOR DEVICE AND METHOD OF FORMING SEMICONDUCTOR DEVICE

BACKGROUND OF THE INVENTION

1. Field of the Invention

The present invention relates to a semiconductor device and a method of manufacturing the semiconductor device.

Priority is claimed on Japanese Patent Application No. 2008-318618, filed Dec. 15, 2008, the content of which is incorporated herein by reference.

2. Description of the Related Art

In recent years, there has been increased the degree of integration of semiconductor devices such as a dynamic random access memory (DRAM) or a parameter random access memory (PRAM), due to increasing the requirements for advanced functions of the semiconductor devices.

Japanese Unexamined Patent Application, First Publications, Nos. JP-A-7-273221 and JP-T-2002-541667 address that the past semiconductor device had a problem in that the area occupied two-dimensionally by the semiconductor device decreased with the increase in degree of integration and thus the size of a region in which a transistor is formed, that is, an active region, gradually decreases. Specifically, the channel length of a planar transistor decreased with the decrease in size of the active region, thereby causing a so-called short channel effect. Accordingly, to increase the channel length and the width in a limited region, a semiconductor device was suggested in which a three-dimensional transistor such as a vertical transistor is formed instead of the past planar transistor. Specifically, a semiconductor has been suggested which has a configuration in which a silicon substrate is formed in a pillar shape and an MOS transistor having an upper diffusion layer at the uppermost, a channel region surrounded with a gate electrode at the center, and a lower diffusion layer close to the substrate is formed therein.

Japanese Unexamined Patent Application, First Publication, No. JP-A-2007-329480 discloses that in such a vertical transistor, a method of forming an embedded bit line using an ion introducing method was employed and a method of forming the embedded bit line as a silicide layer was suggested.

SUMMARY

In one embodiment, a semiconductor device may include, but is not limited to, a semiconductor substrate comprising a substrate body, a base over the substrate body and a pillar over a first region of the base; a buried line adjacent to a side surface of the base; a first diffusion layer over a second region of the base; a second diffusion layer over the pillar, the second diffusion layer being higher in level than the first diffusion layer; and a third diffusion layer disposed between the buried line and the semiconductor substrate. The third diffusion layer is different in level from the first diffusion layer. The top level of the third diffusion layer is lower than the top level of the first diffusion layer.

In another embodiment, a semiconductor device may include, but is not limited to, a semiconductor substrate comprising a substrate body, a base over the substrate body and a pillar over a first region of the base; a buried line adjacent to a side surface of the base; a first diffusion layer over a second region of the base; a second diffusion layer over the pillar, the second diffusion layer being higher in level than the first diffusion layer; and a third diffusion layer disposed between the buried line and the semiconductor substrate. The buried line is different in level or depth from the first diffusion layer, and the top level of the buried line is lower than the top level of the first diffusion layer.

In still another embodiment, a method of forming a semiconductor device may include, but is not limited to, forming a fin on a semiconductor substrate; forming a buried line in the semiconductor substrate, the buried line being lower in level than the fin; forming a first groove in the fin to form at least one pillar, and the first groove having a bottom which is higher in level than the buried line; introducing an impurity into a bottom surface of the first groove to form a first diffusion layer; forming a second diffusion layer over the pillar; and forming a third diffusion layer between the buried line and the semiconductor substrate. The third diffusion layer is different in level from the first diffusion layer. The top level of the third diffusion layer is lower than the top level of the first diffusion layer.

BRIEF DESCRIPTION OF THE DRAWINGS

The above features and advantages of the present invention will be more apparent from the following description of certain preferred embodiments taken in conjunction with the accompanying drawings, in which:

FIGS. 2A through 17D are fragmentary cross sectional elevation views illustrating a method of forming a semiconductor device shown in FIGS. 1A, 1B, 1C, 1D, 42 and 43 in accordance with the first embodiment of the present invention;

FIGS. 19A through 30D are fragmentary cross sectional elevation views illustrating a method of forming a semiconductor device shown in FIGS. 18A, 18B, 18C, 18D, 42 and 43 in accordance with the second embodiment of the present invention;

FIGS. 36A through 36D are fragmentary cross sectional elevation view illustrating a semiconductor device shown in FIGS. 42 and 43 in accordance with a fifth embodiment of the present invention;

DETAILED DESCRIPTION OF THE PREFERRED EMBODIMENTS

Figure 1A:
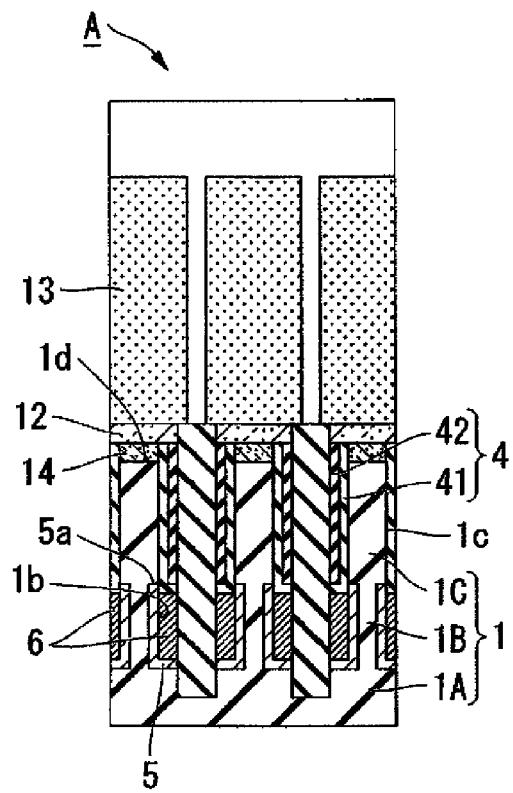
FIGS. 1A through 1D are fragmentary cross sectional elevation views illustrating a semiconductor device shown in FIGS. 42 and 43 in accordance with a first embodiment of the present invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

A semiconductor device has a three-dimensional structure. The semiconductor device includes a buried line (a bit line) and a bottom diffusion layer. The buried line (the bit line) and the bottom diffusion layer are different in level or depth from each other. A first depth for etching a semiconductor substrate is deeper than a second depth for etching the semiconductor substrate. The first etching process is carried out at the first depth in the direction parallel to the buried line (the bit line) which is to be formed. The second etching process is carried out at the second depth in the direction parallel to the gate line (the word line) which is to be formed. The second etching process is carried out so that the second depth is shallower than the first depth. This will cause a distance between the buried line (the bit line) and a bottom diffusion layer, thereby causing a difference in level between the top level of the buried line (the bit line) and the top level of the bottom diffusion layer.

A first ion-implantation process is carried out after the first etching process. The first etching process is carried out in the direction parallel to the buried line (the bit line) which is to be formed. The first ion-implantation process is carried out to form a silicide layer of the buried line (the bit line) which is to be formed. A second ion-implantation process is carried out after the second etching process. The second etching process is carried out at the second depth in the direction parallel to the gate line (the word line) which is to be formed. The second etching process is carried out so that the second depth of the second etching process is shallower than the first depth of the first etching process. The second ion-implantation process is carried out to form a bottom diffusion layer (first diffusion layer) which may be important for the characteristics or performances of the transistor. First and second lithography processes are carried out to form pillars on the semiconductor substrate. The second lithography process is carried out, wherein the etching depth of the etching process is controlled so that the top level of the buried line (the bit line) is higher than the top level of the bottom diffusion layer (first diffusion layer). This structure can suppress the silicide layer of the buried line (the bit line) from being diffused to the bottom diffusion layer (first diffusion layer).

A semiconductor device according to an embodiment may include, but is not limited to, a semiconductor substrate which includes a substrate body, a base and a pillar. The base is disposed over the substrate body. The base has first and second regions. The pillar is disposed over the first region of the base. The semiconductor device may further include a buried line which is adjacent to a side surface of the base. The buried line may perform as a bit line. The semiconductor device may further include a gate insulating film which covers a side surface of the pillar. The semiconductor device may further include a first diffusion layer over the base. The first diffusion layer is disposed over the second region of the base. The semiconductor device may further include a second diffusion layer over the pillar. The second diffusion layer is higher in level than the first diffusion layer. The semiconductor device may further include a third diffusion layer disposed between the buried line and the semiconductor substrate. The third diffusion layer is different in level or depth from the first diffusion layer. The top level of the third diffusion layer is lower than the top level of the first diffusion layer. The buried line is different in level or depth from the first diffusion layer. The top level of the buried line is lower than the top level of the first diffusion layer. The semiconductor device may further include a gate electrode which is separated by the gate insulating film from the side surface of the pillar.

The difference in level between the buried line and the first diffusion layer or the difference in the top level between the buried line and the first diffusion layer will create a spatial distance enough to effectively suppress a diffusion of a silicide layer to the first diffusion layer even if the buried line includes the silicide layer.

The above-described structure allows that the process for forming the first diffusion layer (bottom diffusion layer) important for the characteristics of the transistor is carried out independently from an impurity introducing process which is carried out to reduce the interface resistance between the silicide layer of the buried line (bit line) and the semiconductor substrate. This will increase the design flexibility for each of plural transistors. A wiring which is electrically connected to the first diffusion layer (bottom diffusion layer) may perform as a general wiring as well as a bit line.

A method of forming a semiconductor device according to an embodiment may include, but is not limited to, the following process. A fin is formed on a semiconductor substrate. A buried line is formed in the semiconductor substrate. The buried line is lower in level than the fin. A groove is formed in the fin. The groove divides the fin into pillars. The pillar is defined by the groove. The groove has a bottom which is higher in level than the buried line (bit line). An impurity is introduced into a bottom surface of the groove to form a first diffusion layer under the bottom of the groove. A gate insulating film is formed which covers a side surface of the pillar. A gate electrode is formed which is separated by the gate insulating film from the side surface of the pillar. A second diffusion layer is formed over the pillar. A third diffusion layer is formed between the buried line and the semiconductor substrate including the pillars. The third diffusion layer is different in level or depth from the first diffusion layer. The top level of the third diffusion layer is lower than the top level of the first diffusion layer. The buried line is different in level or depth from the first diffusion layer. The top level of the buried line is lower than the top level of the first diffusion layer.

The above-described processes can suppress the silicide layer of the buried line (the bit line) from being diffused to the bottom diffusion layer (first diffusion layer). This will increase the design flexibility for each of plural transistors. This will further increase the productivity and the yield of the semiconductor device.

Plural etching processes for selectively etching the semiconductor substrate are carried to form pillars on the semiconductor substrate. The pillars are defined by grooves of the semiconductor substrate. A first etching process for selectively etching the semiconductor substrate is carried out to form a first groove having a first depth from the surface of the semiconductor substrate. A first impurity introduction process is carried out to introduce a first impurity into the bottom of the first groove of the semiconductor substrate, thereby forming a first diffusion region under the first groove of the semiconductor substrate. A second etching process for selectively etching the semiconductor substrate is carried out to form a second groove having a second depth from the surface of the semiconductor substrate. The second depth is different from the first depth. A second impurity introduction process is carried out to introduce a second impurity into the bottom of the second groove of the semiconductor substrate, thereby forming a second diffusion region under the second groove of the semiconductor substrate. The second impurity may be the same as or may be different from the first impurity. The second diffusion region is different in level or depth from the first diffusion region. A shallower one of the first and second diffusion regions may perform as a bottom diffusion region of the vertical transistor. A deeper one of the first and second diffusion regions may be used to reduce a contact resistance or used as a wiring.

The difference in level between the buried line and the first diffusion layer or the difference in the top level between the buried line and the first diffusion layer will create a spatial distance enough to effectively suppress a diffusion of a silicide layer to the first diffusion layer even if the buried line includes the silicide layer.

The above-described structure allows that the process for forming the first diffusion layer (bottom diffusion layer) important for the characteristics of the transistor is carried out independently from an impurity introducing process which is carried out to reduce the interface resistance between the silicide layer of the buried line (bit line) and the semiconductor substrate. This will increase the design flexibility for each of plural transistors. A wiring which is electrically connected to the first diffusion layer (bottom diffusion layer) may perform as a general wiring as well as a bit line.

In one embodiment, a semiconductor device may include, but is not limited to, a semiconductor substrate comprising a substrate body, a base over the substrate body and a pillar over a first region of the base; a buried line adjacent to a side surface of the base; a first diffusion layer over a second region of the base; a second diffusion layer over the pillar, the second diffusion layer being higher in level than the first diffusion layer; and a third diffusion layer disposed between the buried line and the semiconductor substrate. The third diffusion layer is different in level from the first diffusion layer. The top level of the third diffusion layer is lower than the top level of the first diffusion layer.

The buried line is different in level or depth from the first diffusion layer, and the top level of the buried line is lower than the top level of the first diffusion layer.

The semiconductor device may further include, but is not limited to, a gate insulating film covering a side surface of the pillar; and a gate electrode separated by the gate insulating film from the side surface of the pillar.

The semiconductor substrate may be made of, but is not limited to, single crystal silicon. The third diffusion layer may have a low potential barrier.

The buried line may include a silicide layer.

The buried line may include, but is not limited to, at least one of a single crystal silicon, a polycrystal silicon and an amorphous silicon.

The buried line may include, but is not limited to, a silicide layer and a metal layer. The metal layer may include, but is not limited to, at least one of a tungsten layer and a tungsten nitride layer.

The buried line may include, but is not limited to, a silicide layer includes at least one of $CoSi_2$, $NiSi$, $Ni_2Si$, $Ni_3Si$, $NiSi_2$, $WSi_2$, $TiSi_2$, $VSi_2$, $CrSi_2$, $ZrSi_2$, $NbSi_2$, $MoSi_2$, $TaSi_2$, $CoSi$, $CoSi_2$, $PtSi$, $Pt_2Si$, and $Pd_2Si$.

The semiconductor device may further include, but is not limited to, a contact connected to the second diffusion layer; and a capacitor connected through the contact to the second diffusion layer.

The semiconductor substrate may include, but is not limited to, an additional base over the substrate body and an additional pillar over a first region of the additional bases. The semiconductor device may include, but is not limited to, an additional first diffusion layer over the second region of the additional bases, the first diffusion layer and the additional first diffusion layer forming first and second transistor regions included in first and second memory cells. The first diffusion layer and the additional first diffusion layer may be different in impurity concentration from each other, and the first and second transistor regions are each connected to the buried line. The first and second transistor regions may each have a floating body cell structure.

The semiconductor device may include, but is not limited to, an additional third diffusion layer which is different in impurity concentration than the third diffusion layer, and the third diffusion layer and the additional third diffusion layer are each connected to the buried line.

In another embodiment, a semiconductor device may include, but is not limited to, a semiconductor substrate comprising a substrate body, a base over the substrate body and a pillar over a first region of the base; a buried line adjacent to a side surface of the base; a first diffusion layer over a second region of the base; a second diffusion layer over the pillar, the second diffusion layer being higher in level than the first diffusion layer; and a third diffusion layer disposed between the buried line and the semiconductor substrate. The buried line is different in level or depth from the first diffusion layer, and the top level of the buried line is lower than the top level of the first diffusion layer.

In still another embodiment, a method of forming a semiconductor device may include, but is not limited to, forming a fin on a semiconductor substrate; forming a buried line in the semiconductor substrate, the buried line being lower in level than the fin; forming a first groove in the fin to form at least one pillar, and the first groove having a bottom which is higher in level than the buried line; introducing an impurity into a bottom surface of the first groove to form a first diffusion layer; forming a second diffusion layer over the pillar; and forming a third diffusion layer between the buried line and the semiconductor substrate. The third diffusion layer is different in level from the first diffusion layer. The top level of the third diffusion layer is lower than the top level of the first diffusion layer.

The buried line is different in level or depth from the first diffusion layer and the top level of the buried line is lower than the top level of the first diffusion layer.

The method of forming a semiconductor device may further include, but is not limited to, forming a gate insulating film which covers a side surface of the pillar; and forming a gate electrode separated by the gate insulating film from the side surface of the pillar.

The method of forming a semiconductor device may further include, but is not limited to, forming a contact over the second diffusion layer, the contact being connected to the second diffusion layer; and forming a capacitor over the contact, the capacitor being connected through the contact to the second diffusion layer.

First Embodiment

Figure 42:
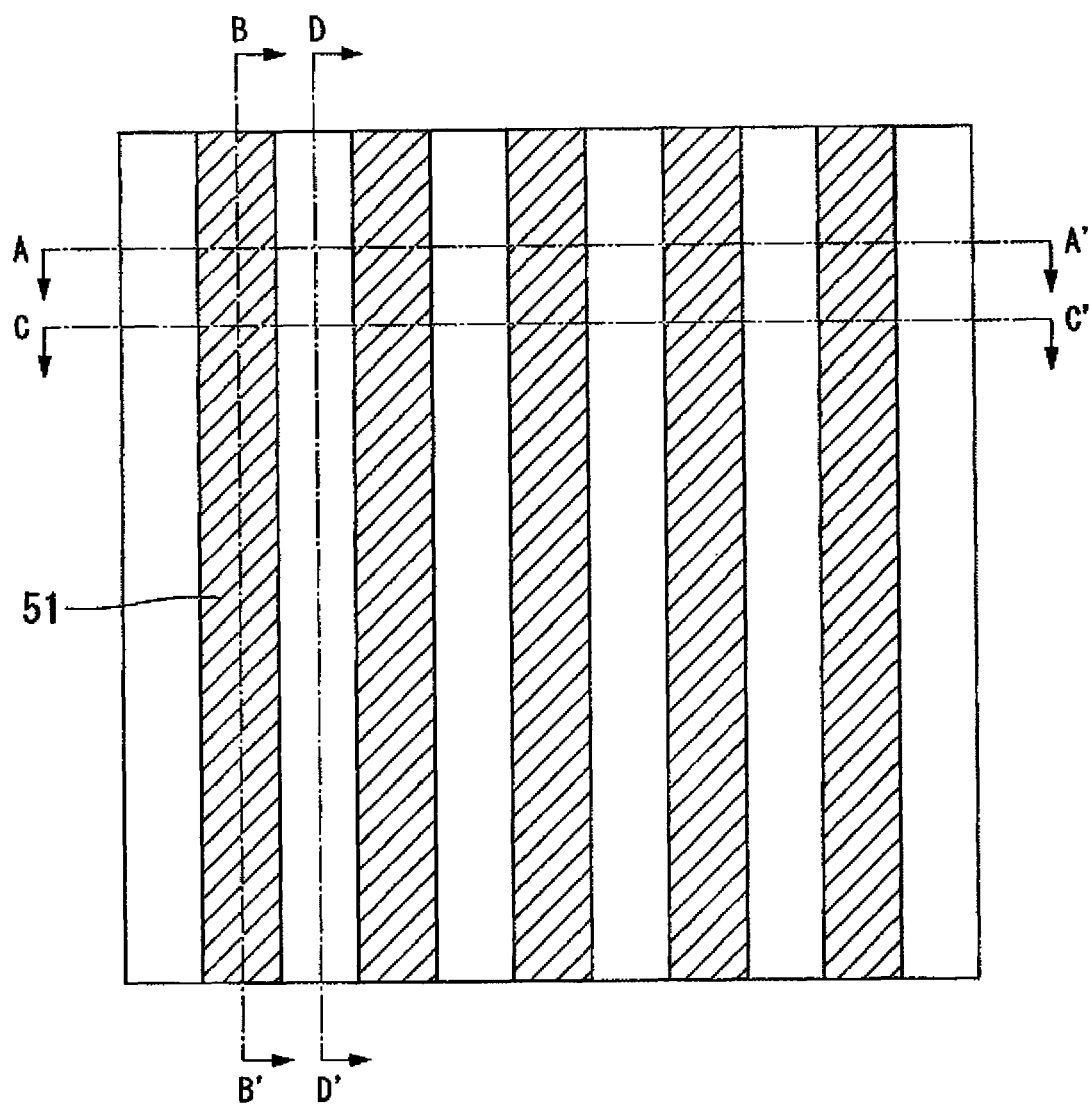
FIG. 42 is a fragmentary plan view illustrating a semiconductor device in accordance with first, second, third, fourth and fifth embodiments of the present invention.
Figure 43:
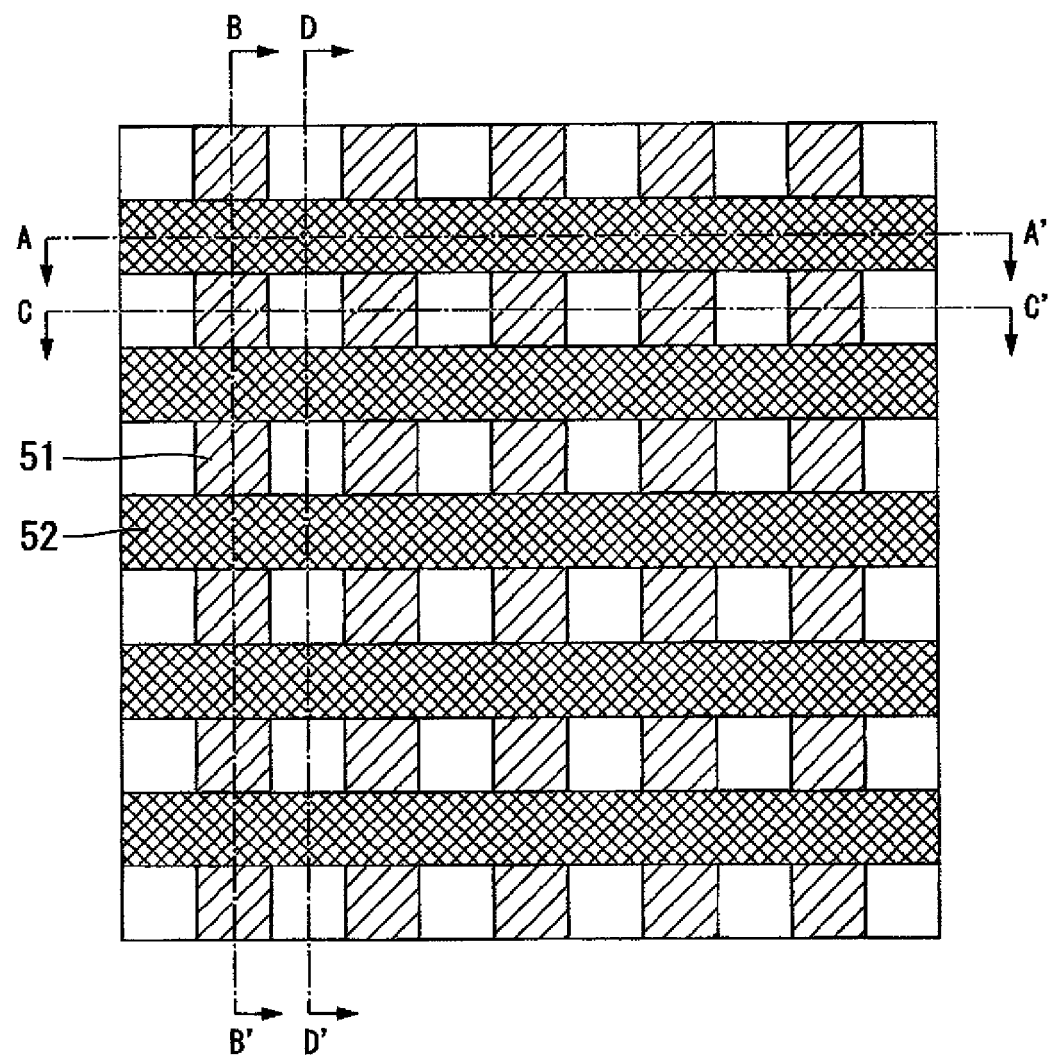
FIG. 43 is a fragmentary plan view illustrating a semiconductor device in accordance with first, second, third, fourth and fifth embodiments of the present invention.

FIG. 42 is a fragmentary plan view illustrating a semiconductor device in accordance with first, second, third, fourth and fifth embodiments of the present invention. FIG. 43 is a fragmentary plan view illustrating a semiconductor device in accordance with first, second, third, fourth and fifth embodiments of the present invention. FIGS. 1A to 1D are sectional views schematically illustrating a semiconductor device A according to a first embodiment of the invention. FIGS. 2A to 17D are diagrams schematically illustrating steps of the method of manufacturing a semiconductor device according to the first embodiment. FIGS. 1A to 17D are sectional views taken along the section indicating lines in the schematic plan views of FIGS. 42 and 43. In FIGS. 42 and 43, a processed pattern in a direction parallel to a bit line is a pattern 51 and a processed pattern in a direction parallel to a word line is a pattern 52. In FIG. 43, the processed patterns 52 in the direction parallel to the word line overlap with the patterns 51. The patterns 51 and 52 are residual patterns not etched.
Semiconductor Device The structure of the semiconductor device according to the first embodiment will be described.

Figure 1B:
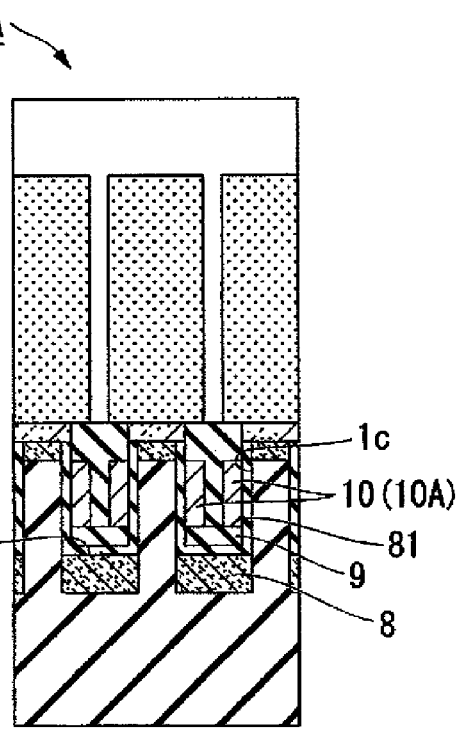
Figure 1C:
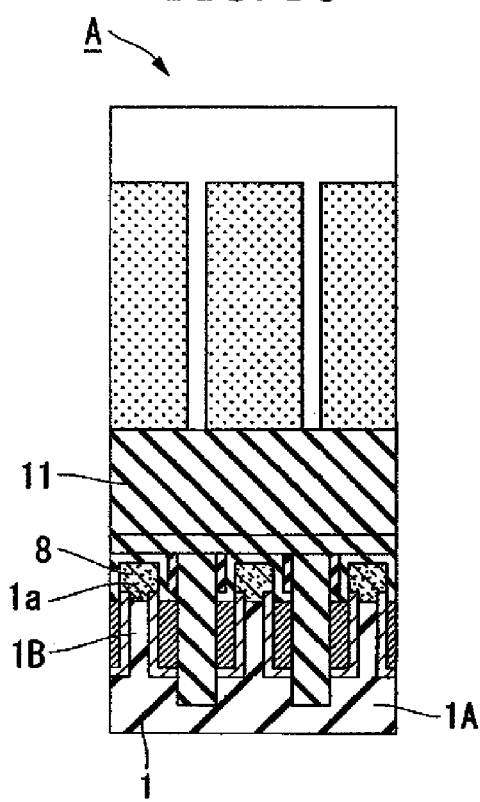
Figure 1D:
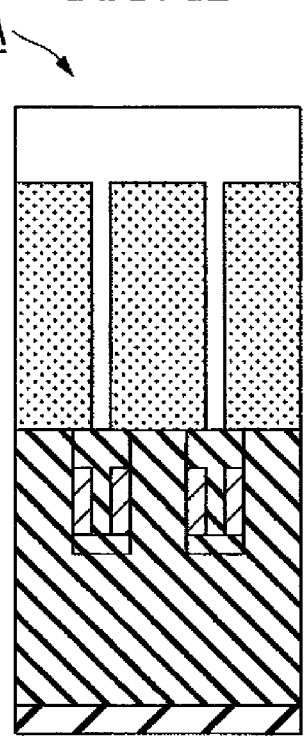

FIG. 1A is a fragmentary cross sectional elevation view illustrating a semiconductor device shown in FIGS. 42 and 43, taken along an A-A' line of FIGS. 42 and 43 in accordance with a first embodiment of the present invention. FIG. 1B is a fragmentary cross sectional elevation view illustrating the semiconductor device shown in FIGS. 42 and 43, taken along a B-B' line of FIGS. 42 and 43 in accordance with the first embodiment of the present invention. FIG. 1C is a fragmentary cross sectional elevation view illustrating the semiconductor device shown in FIGS. 42 and 43, taken along a C-C' line of FIGS. 42 and 43 in accordance with the first embodiment of the present invention. FIG. 1D is a fragmentary cross sectional elevation view illustrating the semiconductor device shown in FIGS. 42 and 43, taken along a D-D' line of FIGS. 42 and 43 in accordance with the first embodiment of the present invention.

As shown in FIGS. 1A to 1D, the semiconductor device A according to the first embodiment may include, but is not limited to, a substrate 1, bit lines (embedded line) 6, gate insulating films 4, first diffusion layers 8, second diffusion layers 14, third diffusion layers 5, and gate electrodes 10A. The substrate 1 may be, but is not limited to, a silicon substrate 1. The substrate 1 may include, but is not limited to, a body 1A, a base 1B and pillars 1C. The body 1A is a bulk region of the silicon substrate 1. The base 1B is positioned over the body 1A. The pillars 1C extend upwardly from the base 1B. The pillars 1C may be, but are not limited to, column-shaped. The bit lines (embedded lines) 6 extend along side surfaces $1b$ of the base 1B. The gate insulating films 4 extend along side surfaces $1c$ of the pillars 1C. The first diffusion layers 8 are disposed over top surfaces $1a$ of the bases 1B, provided that the first diffusion layers 8 are formed in places other than where the pillars 1C are formed. The second diffusion layers 14 are disposed on top surfaces $1d$ of the pillars 1C. The third diffusion layers 5 are disposed between the bit lines 6 and the silicon substrate 1. The third diffusion layers 5 separate the bit lines 6 from the silicon substrate 1. There is a difference in level between the third diffusion layers 5 and the first diffusion layers 8. The third diffusion layers 5 have top ends $5a$ which are lower in level than top ends $8a$ of the first diffusion layers 8. The gate electrode 10A forms a part of a word line (gate line) 10 which is formed close to the side surfaces $1c$ of the pillars 1C.

Since the semiconductor device A according to this embodiment includes plural first diffusion layers 8 as described above, plural vertical transistor regions are formed in the silicon substrate 1.

The semiconductor device A can be, but is not limited to, a memory cell in which each of the plural vertical transistor regions may form a floating body cell (FBC) structure.

The substrate 1 may include the body 1A having a flat surface, the base 1B disposed over the body 1A, and plural columnar pillars 1C extending upwardly from the base 1B. The substrate 1 may be single crystal silicon.

The base 1B is formed over the body 1A as a base for the columnar pillars 1C.

The pillars 1C are a columnar portion of silicon. The top surface $1d$ of the pillars 1C may have, for example, an elliptical shape. The levels of the top surfaces $1d$ are substantially uniform.

As a modification, it is possible that the base and the pillars may be formed by silicon layers.

In this embodiment, the bit line (embedded line) 6 includes a silicide layer formed by the silicide reaction of a silicon layer having impurities diffused therein and extends in a bit-line extending direction to cover the side surfaces $1b$ of the base 1B. In this embodiment, the bit line 6 is formed of only a silicide layer, but the invention is not limited to the configuration. For example, as described in embodiments below, the bit line may be formed of other conductive materials.

The material of the silicide layer constituting the bit line 6 is not particularly limited, but may be formed of any material including one or more selected from $CoSi_2$, $NiSi$, $Ni_2Si$, $Ni_3Si$, $NiSi_2$, $WSi_2$, $TiSi_2$, $VSi_2$, $CrSi_2$, $ZrSi_2$, $NbSi_2$, $MoSi_2$, $TaSi_2$, $CoSi$, $CoSi_2$, $PtSi$, $Pt_2Si$, and $Pd_2Si$. The bit line 6 can include at least one of monocrystalline silicon, polycrystalline silicon, and amorphous silicon.

The gate insulating film 4 is formed to cover the side surfaces of the pillars 1C and includes two layers of a first oxide film 41 and a second nitride film 42.

The gate insulating film in this embodiment is not limited to the above configuration, but may include any one of, for example, an oxide film, a nitride film, an oxynitride film, and a high-dielectric gate insulating film containing Hf. The gate insulating film may include any one of SiON and SiOC.

An interlayer insulating film 7 is formed to cover at least a part of the side surfaces of the base 1B and the pillars 1C with the gate insulating film 4 interposed between them and to cover the bit lines 6.

The interlayer insulating film 7 can be formed of, for example, a silicon nitride film and can be filled in gaps among the bases 1B and the pillars 1C.

The first diffusion layer 8 is an impurity-diffused region into which dopant (impurity) is ion-implanted and is formed in the regions, on the top surface 1a of the base 1B of the silicon substrate 1, other than the positions in which the pillars 1C are formed.

Arsenic (As) can be introduced into the first diffusion layer 8 according to this embodiment with a concentration of about $1E^{15}$ atoms/cm$^2$.

The second diffusion layer 14 is an impurity-diffused region into which dopant is ion-implanted and is disposed on the top surfaces 1d of the pillars 1C of the silicon substrate 1.

Arsenic (As) can be introduced into the second diffusion layer 14 according to this embodiment with a concentration of about $2.5E^{15}$ atoms/cm$^2$.

The word line (gate line) 10 is formed to cover the side surfaces of the pillars 1C with the gate insulating film 4 interposed between them, and includes a gate electrode 10A.

The word line 10 can be formed of a DOPOS (Doped Polycrystalline Silicon) layer doped with, for example, phosphorus, but is not limited to this configuration. For example, the word line 10 may be formed of at least one of a silicide layer, a metal layer, and a material including DOPOS, and may properly employ known gate electrode materials.

The third diffusion layer 5 is an impurity-diffused region into which impurities are ion-implanted, similarly to the first diffusion layer 8 and the second diffusion layer 14, and is formed as a layer having a low electric potential between the bit line 6 and the silicon substrate 1. As described above, the third diffusion layer 5 has a height difference from the first diffusion layer 8 and the top end 5a thereof is lower than the top end 8a of the first diffusion layer 8.

A contact 12 is a layer formed to connect all the top surfaces 14a of the second diffusion layers 14, and the material thereof is not particularly limited but may include, for example, three layers of Ti, TiN, and W.

A capacitor 13 is a layer disposed on the contact 12. Various materials and structures of a capacitor may be employed for the capacitor 13 without any restriction. The materials and structures can be suitably employed in consideration of characteristics of the semiconductor device.

In the semiconductor device A according to this embodiment, plural types of transistor regions are formed on the silicon substrate 1 by diffusing the impurities with different concentrations to form the plural first diffusion layers 8. In the semiconductor device A, the respective types of transistor regions are connected to one bit line 6.

In the semiconductor device A according to this embodiment, the impurities with different concentrations are diffused to form the plural third diffusion layers 5. Accordingly, plural types of transistor regions are formed on the silicon substrate 1 and the respective types of transistor regions are connected to one bit line 6.

In the semiconductor device A according to this embodiment, as shown in FIGS. 17A to 17D, a height difference is formed between the first diffusion layer 8 and the third diffusion layer 5 and the bit line 6, and the top end 5a of the third diffusion layer 5 is disposed at a position lower than the top end 8a of the first diffusion layer 8. In the semiconductor device A, since a sufficient distance is guaranteed between the first diffusion layer 8 and the third diffusion layer 5 and the bit line by the above-mentioned configuration, it is possible to suppress the silicide layer constituting the third diffusion layer 5 and the bit line 6 from being enlarged up to the first diffusion layer 8.

Since the top surface of the bit line (embedded line) 6 formed of the silicide layer is covered with an oxide film and the short-circuit between the neighboring bit lines is avoided due to the high-concentration pn junction in the bottom surface thereof, it is possible to embody a semiconductor device with high reliability.

Method of Manufacturing Semiconductor Device

The method of manufacturing the semiconductor device A according to the first embodiment of the invention will be described now with reference to FIGS. 2A through 17D, and also reference again to FIGS. 1A through 1D.

The method of manufacturing the semiconductor device A according to this embodiment may include the following processes. Plural fins 1H are formed. The bit lines (embedded lines) 6 are formed under the fins 1H. The respective fins 1H are divided into plural portions to form the pillars 1C. The process for dividing the respective fins 1H into plural portions to form the pillars 1C can be carried out by forming fourth grooves 1G in the fins 1H. The fourth grooves 1G each have a bottom surface which is higher in level than the bit lines 6. An impurity is introduced into the bottom surface of the fourth grooves 1G to form the first diffusion layers 8 under the bottom surface of the fourth grooves 1G. The gate insulating film 4 is formed. The gate electrode 10A is formed as a part of the word lines (gate lines) 10. The second diffusion layer 14 is formed in the respective pillars 1C. The third diffusion layers 5 are formed between the bit lines 6 and the silicon substrate 1 including the pillars 1C.

More specifically, the method of manufacturing the semiconductor device A according to this embodiment may include the following processes. (1) A fin forming process is to form the fins 1H. A first oxide film 2 and a first nitride film 3 are sequentially formed over the silicon substrate 1 to form a hard mask 20 over the silicon substrate 1. The silicon substrate 1 is etched using the hard mask 20 to form first trenches 1D. The first trenches 1D extend in parallel to the extending direction of a bit-line (embedded line) prescribed line. (2) A bottom diffusion process is to form third diffusion layers 5 in the silicon substrate 1. The bottom diffusion process may be carried out to introduce the impurities into the bottoms of the first trenches 1D, thereby forming the third diffusion layers 5 in the silicon substrate 1. (3) A base formation process is to form the base 1B on the body 1A of the silicon substrate 1. The base 1B is disposed on the body 1A of the silicon substrate 1. The third diffusion layers 5 are formed on the surfaces thereof by etching the third diffusion layers 5 to form second trenches 1E communicating with the first trenches 1D. (4) A bit line (embedded line) forming process is to form a bit line (embedded line) 6. The bit line (embedded line) forming process may include, but is not limited to, depositing and heating a metal material on the third diffusion layers 5 to form the bit lines 6. The bit lines 6 may include the silicide layer. The bit lines 6 then etch the bit lines 6 and the body 1A to form third trenches 1F communicating with the second trenches 1E. (5) A pillar forming process is to form pillars 1C. The pillar forming process may include, but is not limited to, forming the plural pillars 1C as follows. The fins 1H are etched in the extending direction of the word-line (gate line) prescribed line perpendicular to the bit lines 6 to form fourth grooves 1G having a bottom surface higher than the bit lines 6. (6) A lower diffusing process is to form first diffusion layers 8. The lower diffusing process can be carried out by introducing the impurities into the top surface of the base 1B to form the first diffusion layers 8. (7) A word line (gate line) forming process is to form a word line (gate line). The word line (gate line) forming process may include, but is not limited to, filling the fourth grooves 1G with the gate electrode material to form the word lines 10 including the gate electrodes 10A. (8) A word line (gate line) etching process is to etch the word lines 10 and divide the word lines 10. The word line (gate line) etching process is carried out by etching the word lines 10 to divide the word lines 10 so as to cover the side surfaces of the fourth grooves 1G and etching and removing the upper portions of the word lines 10. (9) An upper diffusion process is to form the second diffusion layers 14. The upper diffusion process is carried out by introducing the impurities into the top surfaces 1d of the pillars 1C to form the second diffusion layers 14 and removing the hard mask 20 to expose the second diffusion layers 14.

Each of the above described process will be described in detail.

(1) Fin Forming Process

In the fin forming process, the hard mask 20 obtained by sequentially stacking the first oxide film 2 and the first nitride film 3 on the silicon substrate 1 is formed. Then, the silicon substrate 1 is etched using the hard mask 20 to form the first trench 1D in the extending direction of the prescribed line of the bit line 6, whereby the fins 1H are formed.

Figure 2A:
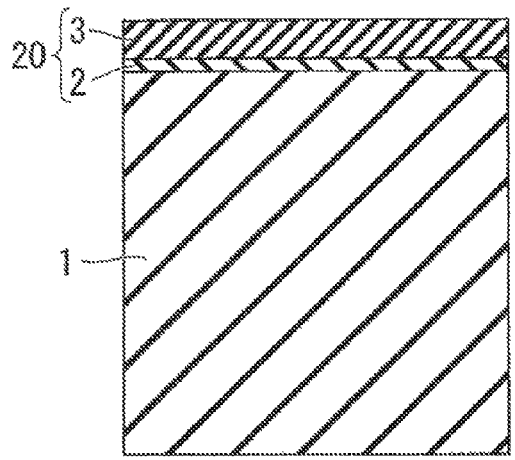
Figure 2B:
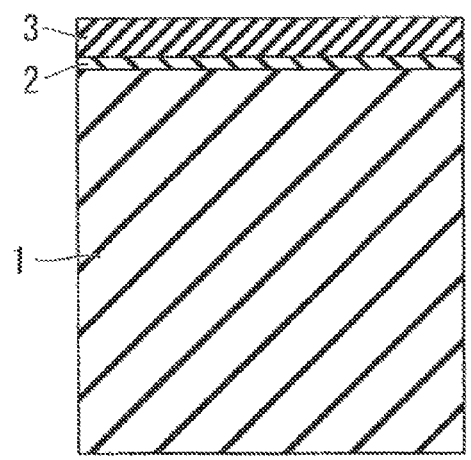
Figure 2C:
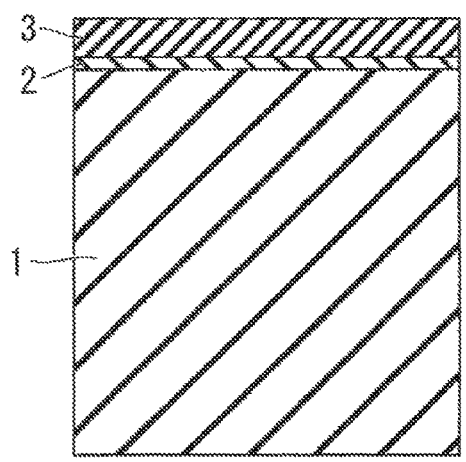
Figure 2D:
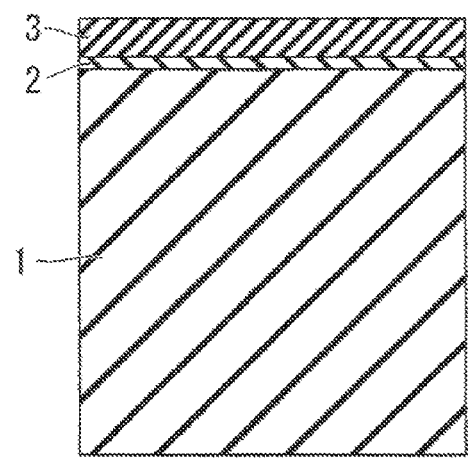

FIG. 2A is a fragmentary cross sectional elevation view illustrating a step involved in a method of forming a semiconductor device shown in FIGS. 1A, 1B, 1C, 1D, 42 and 43, taken along an A-A' line of FIGS. 1A, 1B, 1C, 1D, 42 and 43. FIG. 2B is a fragmentary cross sectional elevation view illustrating the step involved in a method of forming the semiconductor device shown in FIGS. 1A, 1B, 1C, 1D, 42 and 43, taken along a B-B' line of FIGS. 1A, 1B, 1C, 1D, 42 and 43. FIG. 2C is a fragmentary cross sectional elevation view illustrating the step involved in a method of forming the semiconductor device shown in FIGS. 1A, 1B, 1C, 1D, 42 and 43, taken along a C-C' line of FIGS. 1A, 1B, 1C, 1D, 42 and 43. FIG. 2D is a fragmentary cross sectional elevation view illustrating the step involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 2A to 2D, the first oxide film 2 may be formed by thermally oxidizing the silicon substrate 1. The thermal oxidization may be performed at 950° C. for about 10 minutes.

The first nitride film 3 is made to grow, for example, to a thickness of 50 nm using a CVD method.

Figure 3A:
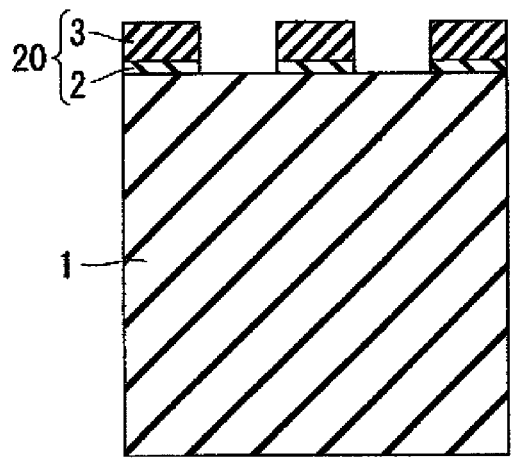
Figure 3B:
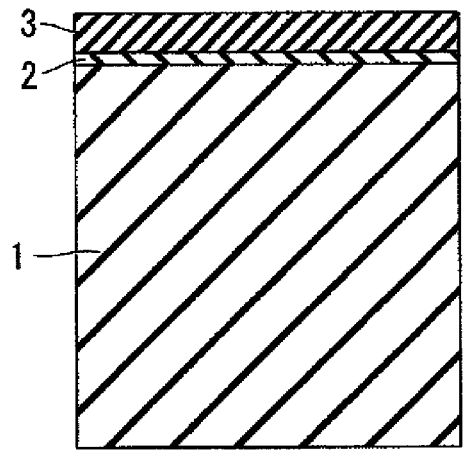
Figure 3C:
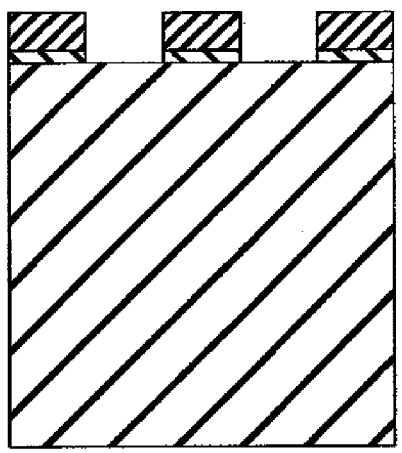
Figure 3D:
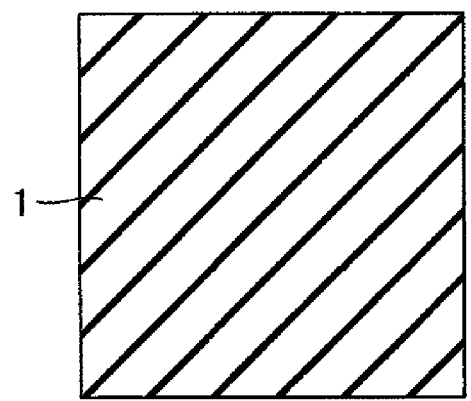

FIG. 3A is a fragmentary cross sectional elevation view illustrating a step, subsequent to the step of FIG. 2A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 3B is a fragmentary cross sectional elevation view illustrating the step, subsequent to the step of FIG. 2B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 3C is a fragmentary cross sectional elevation view illustrating the step, subsequent to the step of FIG. 2C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 3D is a fragmentary cross sectional elevation view illustrating the step, subsequent to the step of FIG. 2D, involved in a method of forming the semiconductor device shown in FIGS. 1A, 1B, 1C, 1D, 42 and 43, taken along a D-D' line of FIGS. 1A, 1B, 1C, 1D, 42 and 43.

As shown in FIGS. 3A to 3D and FIGS. 42 and 43, the resultant structure is patterned in lines and spaces using a lithography method, the first nitride film 3 and the first oxide film 2 are dry-etched, and then the resist is removed.

Figure 4A:
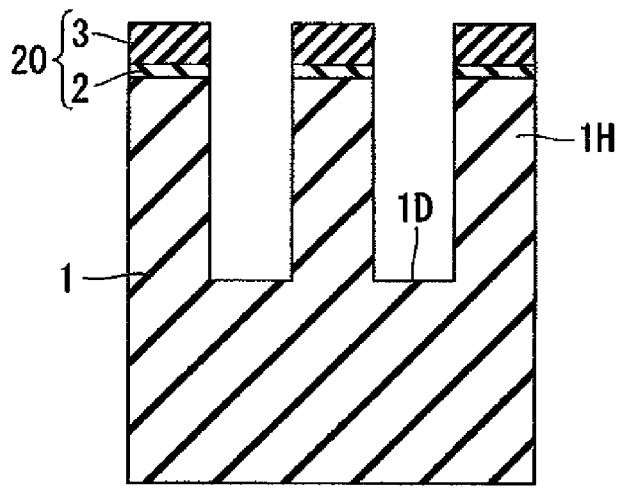
Figure 4B:
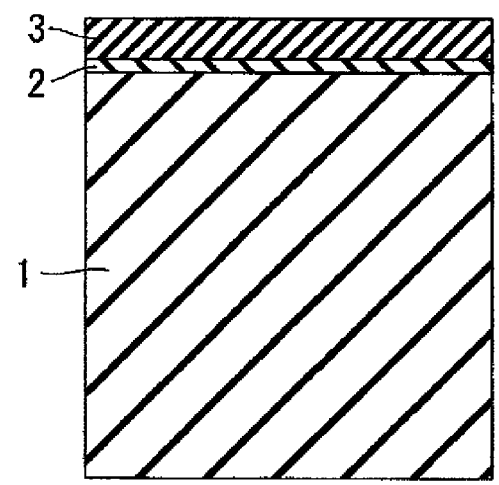
Figure 4C:
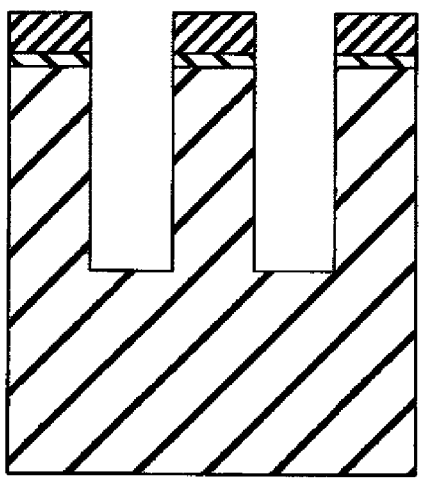
Figure 4D:
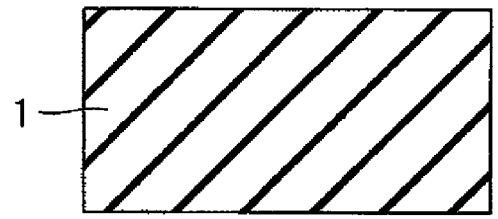

FIG. 4A is a fragmentary cross sectional elevation view illustrating a step, subsequent to the step of FIG. 3A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 4B is a fragmentary cross sectional elevation view illustrating the step, subsequent to the step of FIG. 3B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 4C is a fragmentary cross sectional elevation view illustrating the step, subsequent to the step of FIG. 3C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 4D is a fragmentary cross sectional elevation view illustrating the step, subsequent to the step of FIG. 3D, involved in a method of forming the semiconductor device shown in FIGS. 1A, 1B, 1C, 1D, 42 and 43, taken along a D-D' line of FIGS. 1A, 1B, 1C, 1D, 42 and 43.

Then, as shown in FIGS. 4A to 4D, the silicon substrate 1 is dry-etched using the hard mask 20 including the first oxide film 2 and the first nitride film 3 to form the first trench 1D. The depth of the first trench 1D is, for example, about 150 mm. In this way, by etching and removing the region of the silicon substrate 1 not covered with the hard mask 20, convex and concave portions are formed in the surface of the silicon substrate 1. That is, the fins 1H are formed in the regions covered with the hard mask 20.

(2) Bottom Diffusion Process

In the bottom diffusion process, the third diffusion layer 5 is formed in the silicon substrate 1 by introducing the impurities into the bottom 1e of the first trench 1D.

FIG. 5A is a fragmentary cross sectional elevation view illustrating a step, subsequent to the step of FIG. 4A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 5B is a fragmentary cross sectional elevation view illustrating the step, subsequent to the step of FIG. 4B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 5C is a fragmentary cross sectional elevation view illustrating the step, subsequent to the step of FIG. 4C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 5D is a fragmentary cross sectional elevation view illustrating the step, subsequent to the step of FIG. 4D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 5A to 5D, the inside of the first trench 1D is thermally oxidized in advance to form the second oxide film 41, for example, with a thickness of 5 nm in the inside of the first trench 1D including the side surfaces of the fin 1H.

Figure 6A:
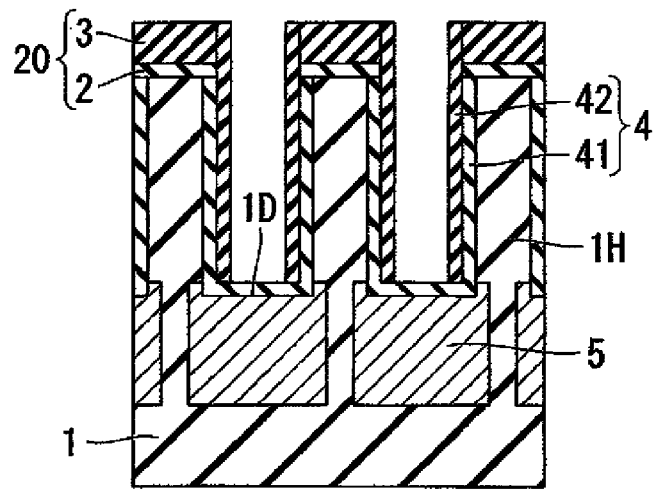
Figure 6B:
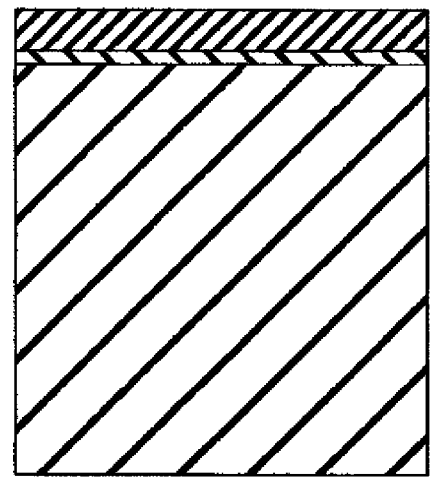
Figure 6C:
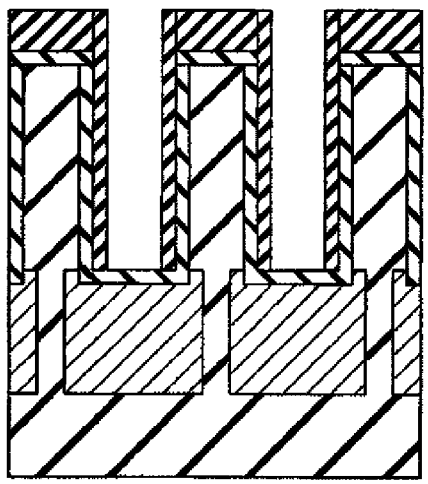
Figure 6D:
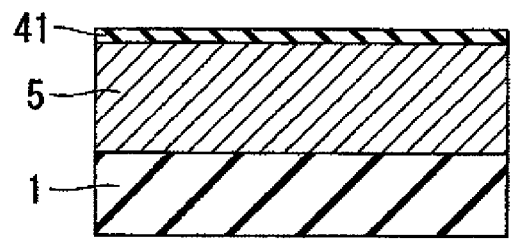

FIG. 6A is a fragmentary cross sectional elevation view illustrating a step, subsequent to the step of FIG. 5A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 6B is a fragmentary cross sectional elevation view illustrating the step, subsequent to the step of FIG. 5B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 6C is a fragmentary cross sectional elevation view illustrating the step, subsequent to the step of FIG. 5C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 6D is a fragmentary cross sectional elevation view illustrating the step, subsequent to the step of FIG. 5D, involved in a method of forming the semiconductor device shown in FIGS. 1A, 1B, 1C, 1D, 42 and 43, taken along a D-D' line of FIGS. 1A, 1B, 1C, 1D, 42 and 43.

As shown in FIGS. 6A to 6D, by forming the second nitride film 42, for example, with a thickness of 10 nm on the surface of the second oxide film 41 and the side surface of the hard mask 20 using the CVD method, the gate insulating film 4 including the second oxide film 41 and the second nitride film 42 is formed.

By removing the second nitride film 42 in the bottom of the first trench 1D and then introducing the impurities into the bottom of the first trench 1D through the second oxide film 41, the third diffusion layer 5 is formed in the silicon substrate 1. At this time, the formation of the third diffusion layer can be carried out using As (arsenic) as the impurities under the conditions of 15 KeV and $1E^{15}$ atoms/cm$^2$.

(3) Base Formation Process

In the base formation process, by etching the third diffusion layer 5 to form the second trench 1E communicating with the first trench 1D, the base 1B which is disposed on the body 1A of the silicon substrate 1 and in which the third diffusion layer 5 is formed on the side surface thereof is formed.

Figure 7A:
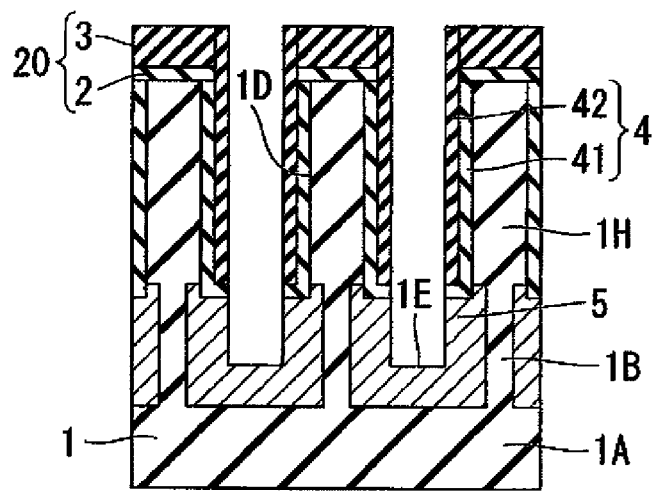
Figure 7B:
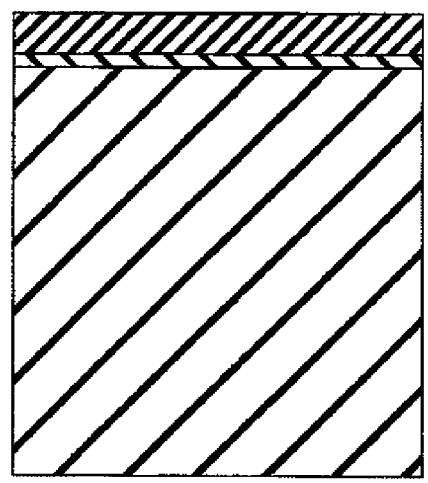
Figure 7C:
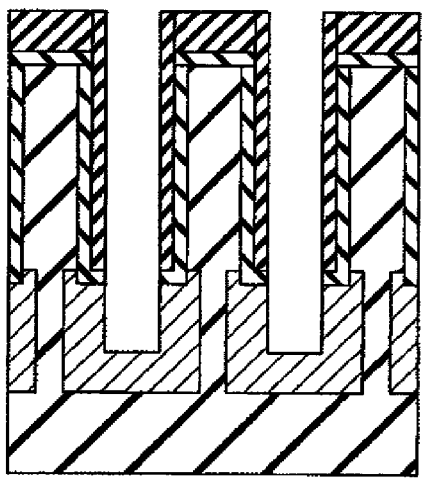
Figure 7D:
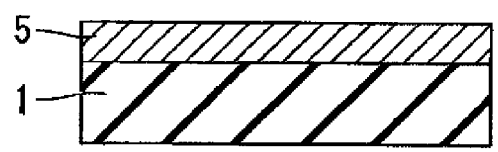

FIG. 7A is a fragmentary cross sectional elevation view illustrating a step, subsequent to the step of FIG. 6A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 7B is a fragmentary cross sectional elevation view illustrating the step, subsequent to the step of FIG. 6B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 7C is a fragmentary cross sectional elevation view illustrating the step, subsequent to the step of FIG. 6C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 7D is a fragmentary cross sectional elevation view illustrating the step, subsequent to the step of FIG. 6D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 7A to 7D, the second oxide film 41 on the bottom of the first trench 1D is removed in advance. Then, by etching the third diffusion layer 5 to form the second trench 1E communicating with the first groove 1D, the base 1B which is disposed on the body 1A of the silicon substrate 1 and in which the third diffusion layer 5 is formed on the side surface thereof is formed.

(4) Bit Line (Embedded Line) Formation Process

In the bit line (embedded line) formation process, a metal material is deposited on the third diffusion layer 5 and thermally processed to form the bit line 6 formed of a silicide layer and then the bit line 6 and the body 1A are etched to form the third trench 1F communicating with the second trench 1E.

Figure 8A:
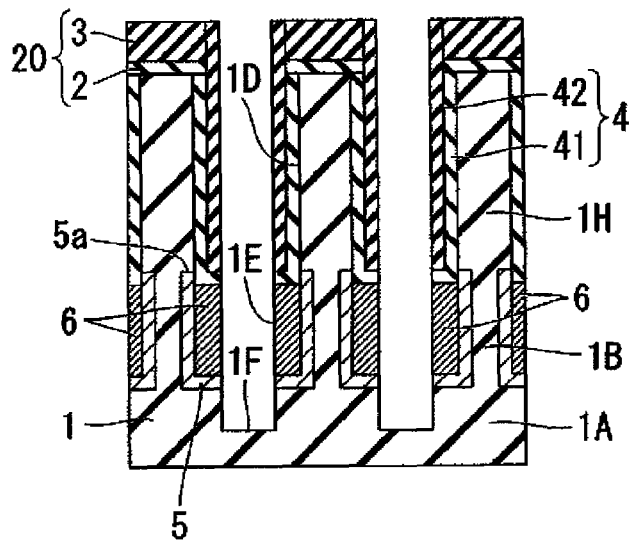
Figure 8B:
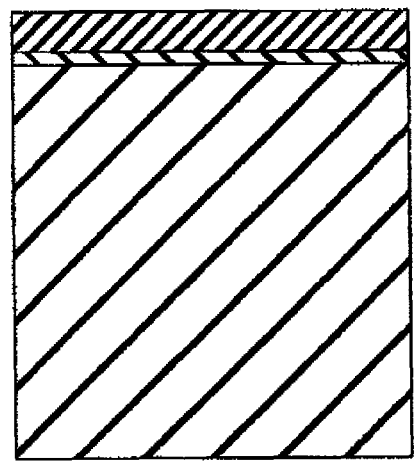
Figure 8C:
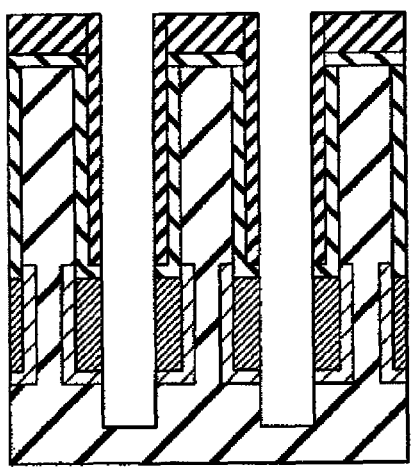
Figure 8D:

FIG. 8A is a fragmentary cross sectional elevation view illustrating a step, subsequent to the step of FIG. 7A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 8B is a fragmentary cross sectional elevation view illustrating the step, subsequent to the step of FIG. 7B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 8C is a fragmentary cross sectional elevation view illustrating the step, subsequent to the step of FIG. 7C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 8D is a fragmentary cross sectional elevation view illustrating the step, subsequent to the step of FIG. 7D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 8A to 8D, cobalt as the metal material is deposited with a thickness of about 20 nm on the third diffusion layer 5. Then, for example, the resultant structure is thermally processed at 850° C. to form the bit line 6 formed of a cobalt silicide layer and then cobalt not participating in the silicide reaction is removed.

Then, the bit line 6 and the body 1A are etched to form the third trench 1F communicating with the second trench 1E.

(5) Pillar Forming Process

In the pillar forming step, each fin 1H is etched in the extending direction of the word-line prescribed line perpendicular to the bit line 6 to form the fourth groove 1G having a bottom higher than the bit line 6, whereby the plural pillars 1C are formed.

Figure 9A:
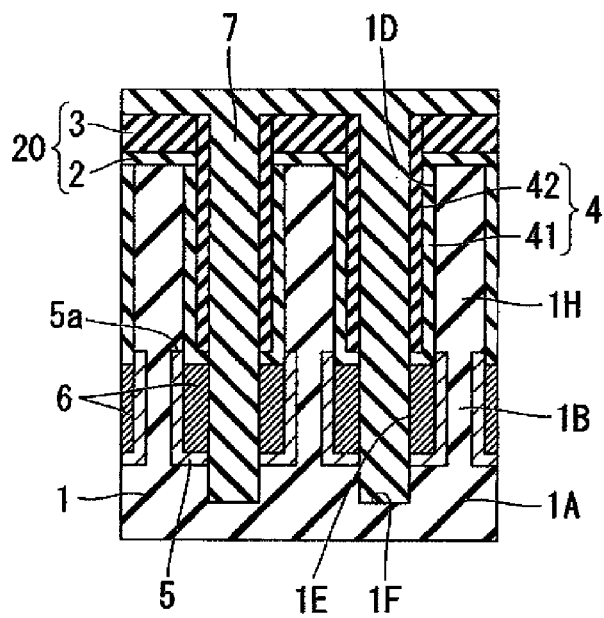
Figure 9B:
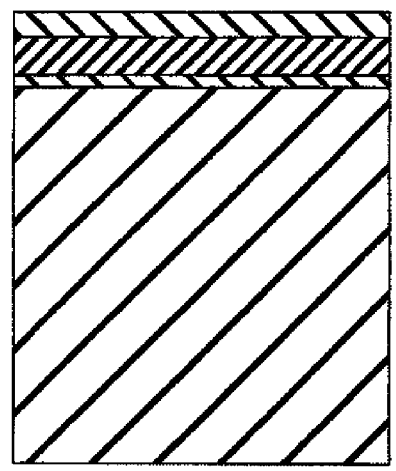
Figure 9C:
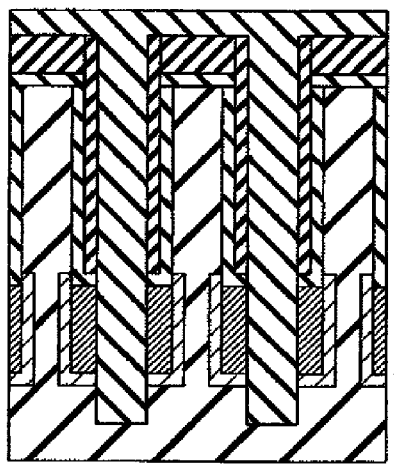
Figure 9D:
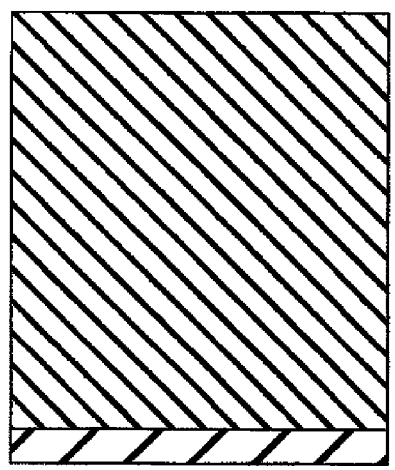

FIG. 9A is a fragmentary cross sectional elevation view illustrating a step, subsequent to the step of FIG. 8A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 9B is a fragmentary cross sectional elevation view illustrating the step, subsequent to the step of FIG. 8B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 9C is a fragmentary cross sectional elevation view illustrating the step, subsequent to the step of FIG. 8C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 9D is a fragmentary cross sectional elevation view illustrating the step, subsequent to the step of FIG. 8D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 9A to 9D, an oxide film is made to grow and is filled in the first trench 1D, the second trench 1E, and the third trench 1F in advance using the CVD method. An oxide film, for example, with a thickness of about 50 nm is made to grow on the first nitride film 3 and the second nitride film 42 using the CVD method. By performing a planarization process using a known method such as a CMP method, the interlayer insulating film 7 is formed. At this time, the CMP process is performed, for example, using silica as a polishing agent.

Figure 10A:
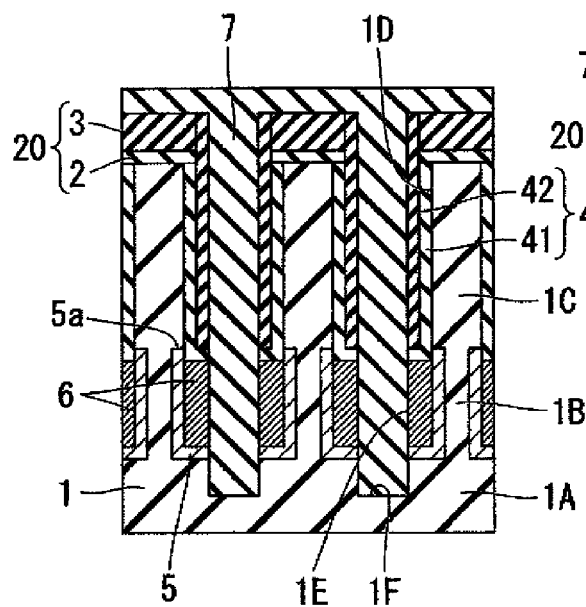
Figure 10B:
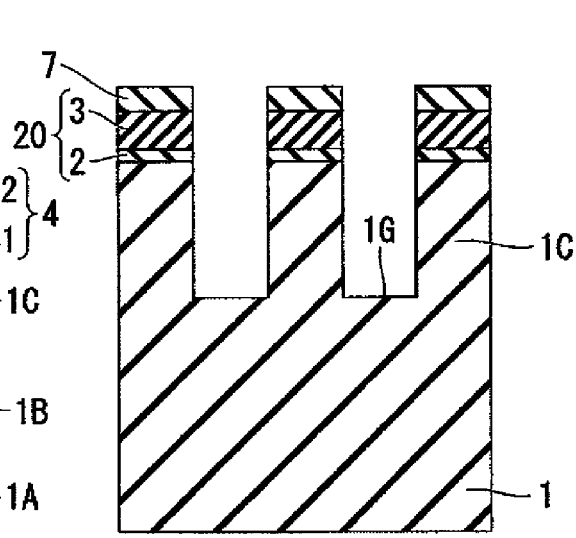
Figure 10C:
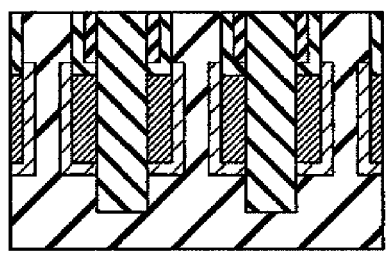
Figure 10D:
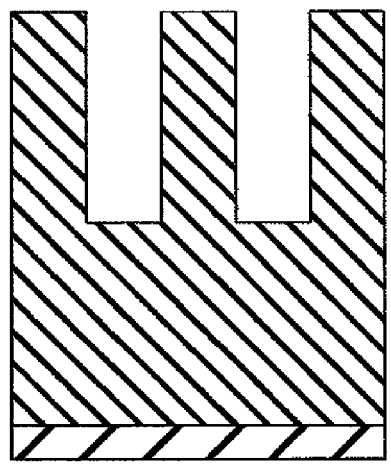

FIG. 10A is a fragmentary cross sectional elevation view illustrating a step, subsequent to the step of FIG. 9A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 10B is a fragmentary cross sectional elevation view illustrating the step, subsequent to the step of FIG. 9B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 10C is a fragmentary cross sectional elevation view illustrating the step, subsequent to the step of FIG. 9C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 10D is a fragmentary cross sectional elevation view illustrating the step, subsequent to the step of FIG. 9D, involved in a method of forming the semiconductor device shown in FIGS. 1A, 1B, 1C, 1D, 42 and 43, taken along a D-D' line of FIGS. 1A, 1B, 1C, 1D, 42 and 43.

As shown in FIGS. 10A to 10D and FIG. 43, the interlayer insulating film 7 is patterned and etched in the prescribed line of the word line 10 perpendicular to the bit line 6. Then, the plural pillars 1C are formed by etching the silicon substrate 1 using the interlayer insulating film 7 as a mask to form the fourth groove 1G.

(6) Lower Diffusion Process

In the lower diffusing step, the impurities are introduced into the top surface 1a of the base 1B to form the first diffusion layer 8.

Figure 11A:
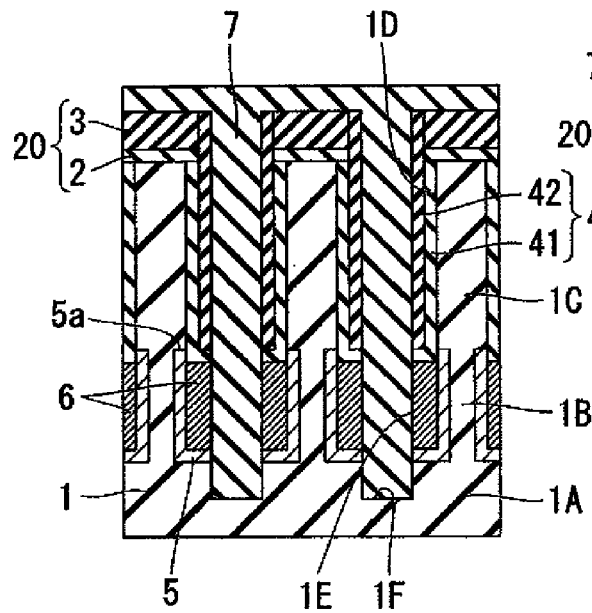
Figure 11B:
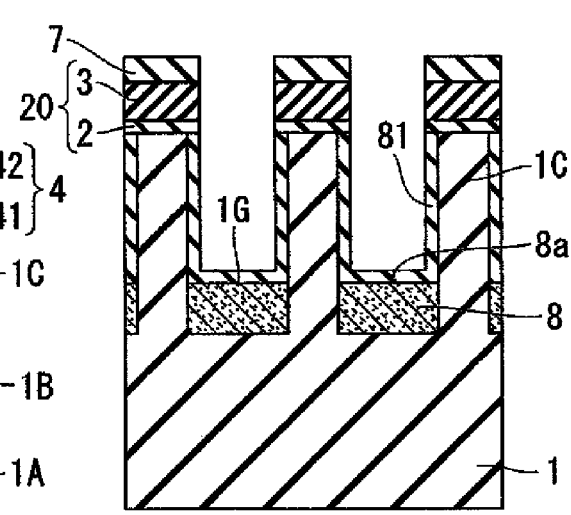
Figure 11C:
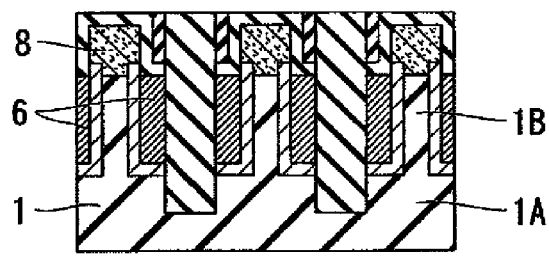
Figure 11D:
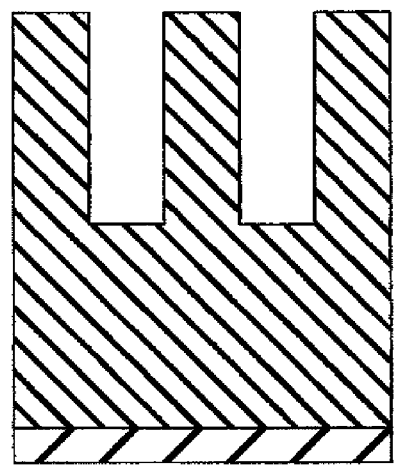

FIG. 11A is a fragmentary cross sectional elevation view illustrating a step, subsequent to the step of FIG. 10A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 11B is a fragmentary cross sectional elevation view illustrating the step, subsequent to the step of FIG. 10B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 11C is a fragmentary cross sectional elevation view illustrating the step, subsequent to the step of FIG. 10C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 11D is a fragmentary cross sectional elevation view illustrating the step, subsequent to the step of FIG. 10D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 11A to 11D, the inside of the fourth groove 1G is thermally oxidized to make the fourth oxide film 81 to grow to, for example, a thickness of 5 nm. Then, by introducing the impurities into the top surface 1a of the base 1B through the fourth oxide film 81, the first diffusion layer 8 is formed. At this time, for example, As is used as the impurity and the ion implantation is performed under the conditions of 10 KeV and $1E^{14}$ atoms/cm$^2$.

(7) Word Line (Gate Line) Formation Process

In the word line (gate line) forming process, the inside of the fourth groove 1G is filled with the gate electrode material to form the word line 10 including the gate electrode 10A.

Figure 12A:
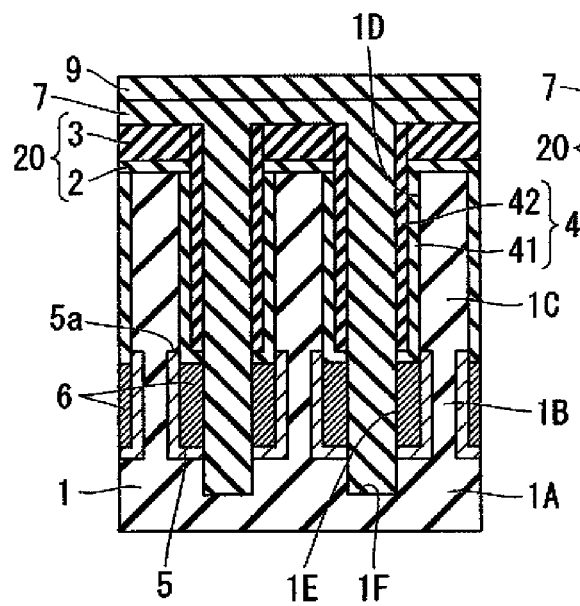
Figure 12B:
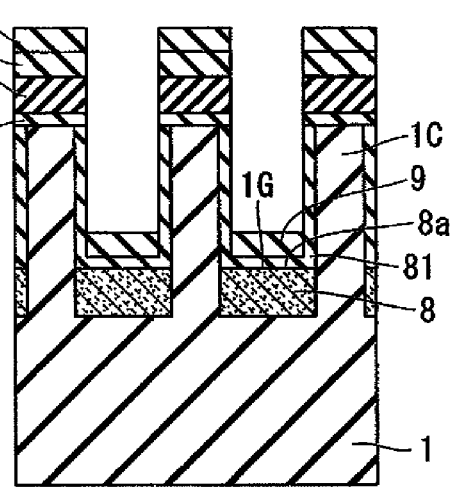
Figure 12C:
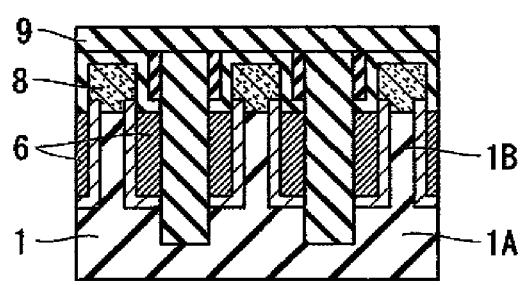
Figure 12D:
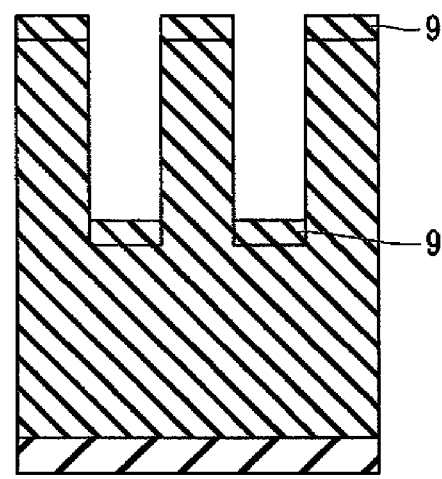

FIG. 12A is a fragmentary cross sectional elevation view illustrating a step, subsequent to the step of FIG. 11A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 12B is a fragmentary cross sectional elevation view illustrating the step, subsequent to the step of FIG. 11B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 12C is a fragmentary cross sectional elevation view illustrating the step, subsequent to the step of FIG. 11C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 12D is a fragmentary cross sectional elevation view illustrating the step, subsequent to the step of FIG. 11D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 12A to 12D, the fifth oxide film 9 is formed on the interlayer insulating film 7 and in the fourth groove 1G using a HDP method.

Figure 13A:
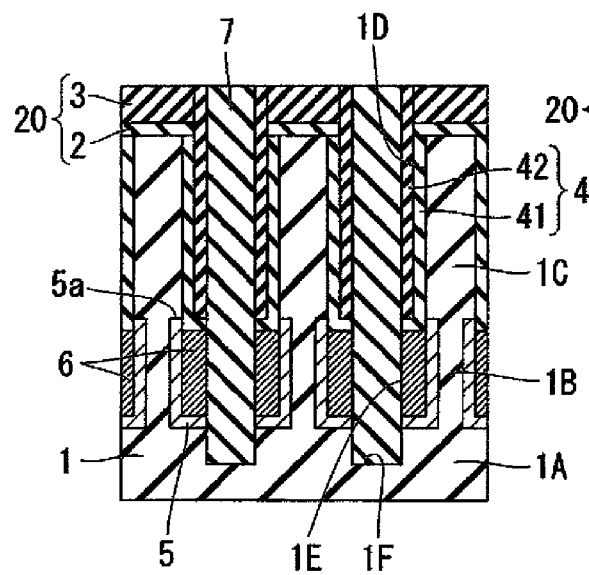
Figure 13B:
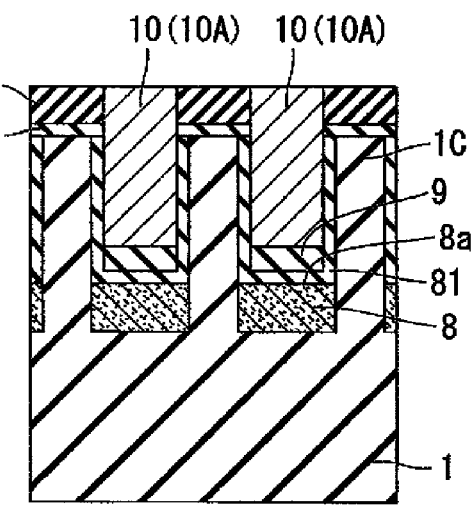
Figure 13C:
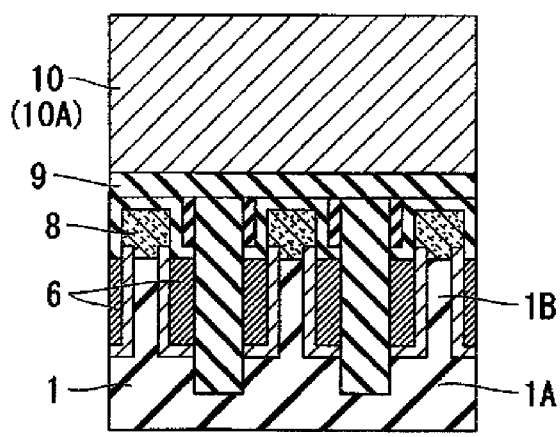
Figure 13D:
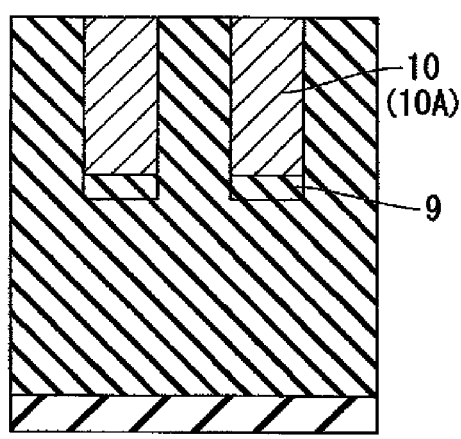

FIG. 13A is a fragmentary cross sectional elevation view illustrating a step, subsequent to the step of FIG. 12A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 13B is a fragmentary cross sectional elevation view illustrating the step, subsequent to the step of FIG. 12B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 13C is a fragmentary cross sectional elevation view illustrating the step, subsequent to the step of FIG. 12C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 13D is a fragmentary cross sectional elevation view illustrating the step, subsequent to the step of FIG. 12D, involved in a method of forming the semiconductor device shown in FIGS. 1A, 1B, 1C, 1D, 42 and 43, taken along a D-D' line of FIGS. 1A, 1B, 1C, 1D, 42 and 43.

Then, as shown in FIGS. 13A to 13D, the fifth oxide film 9 and the upper portion of the interlayer insulating film 7 are removed by a wet etching and then the gate oxide film not shown is formed, for example, with a thickness of 5 nm by performing a gate oxidizing process. Then, the gate electrode material is filled in the fourth groove 1G using the CVD method and then planarized by the CMP method, whereby the word line 10 is formed.

(8) Word Line (Gate line) Etching Process

In the word line (gate line) etching step, the word line 10 is divided to cover the side surfaces of the fourth groove 1G by the etching, and then the upper portions of the word line 10 are removed by the etching.

Figure 14A:
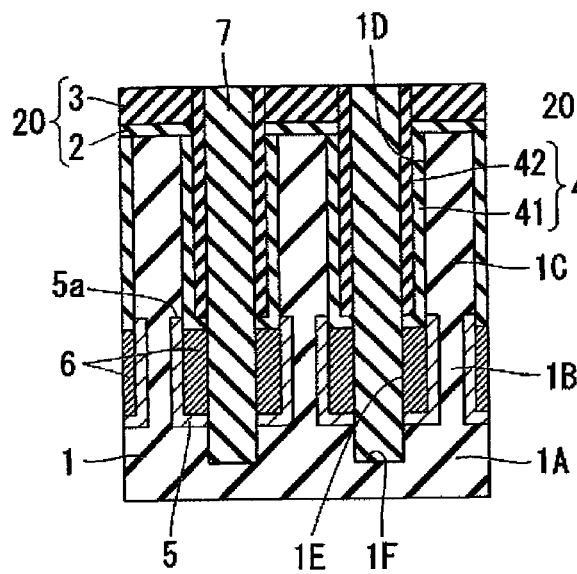
Figure 14B:
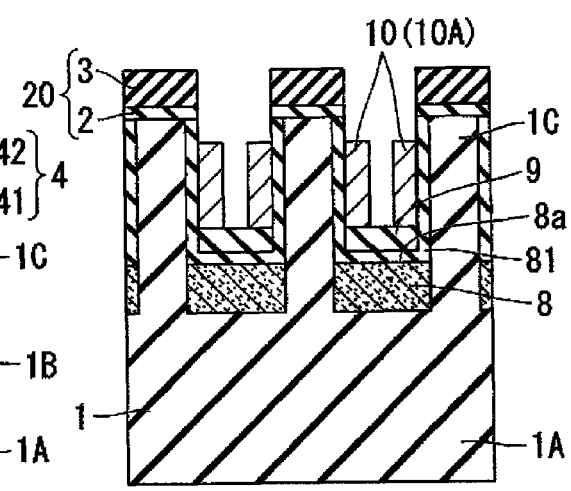
Figure 14C:
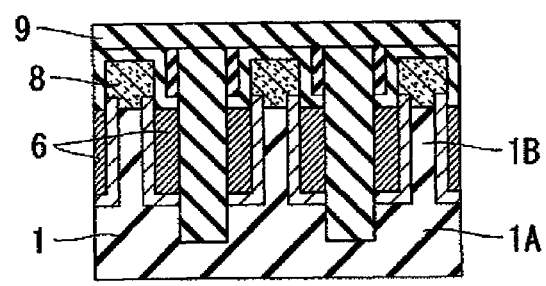
Figure 14D:
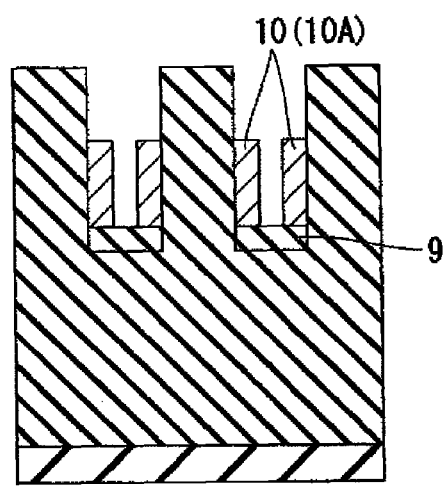

FIG. 14A is a fragmentary cross sectional elevation view illustrating a step, subsequent to the step of FIG. 13A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 14B is a fragmentary cross sectional elevation view illustrating the step, subsequent to the step of FIG. 13B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 14C is a fragmentary cross sectional elevation view illustrating the step, subsequent to the step of FIG. 13C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 14D is a fragmentary cross sectional elevation view illustrating the step, subsequent to the step of FIG. 13D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 14A to 14D, the word line 10 is patterned in the direction parallel to the gate line using the lithography method. Then, the word line 10 is divided into lines so as to cover the side surfaces of the fourth groove 1G by etching the word line, and then the resist is removed. Then, the top portions of the word lines 10 are etched and removed, whereby the height of the word lines 10 is reduced.

In this embodiment, the word line may be formed by forming the word lines as the side walls of the fourth trench and then processing the word lines by an etch-back process.

(9) Upper Diffusion Process

In the upper diffusing step, impurities are introduced into the top surface 1d of the pillar 1C to form the second diffusion layer 14, and the hard mask 20 is then removed to expose the second diffusion layer 14.

Figure 15A:
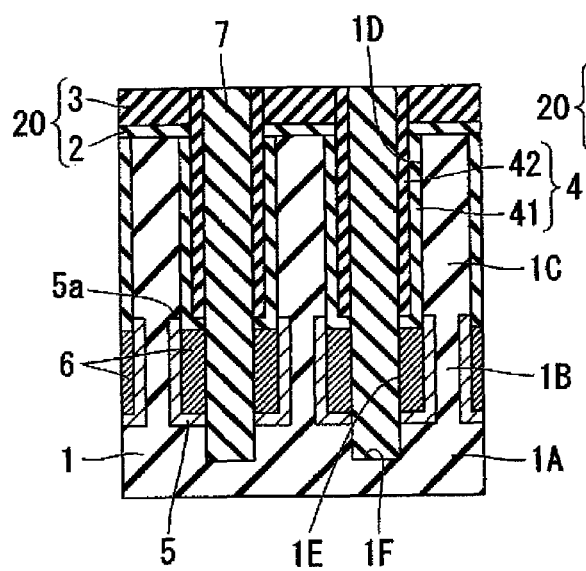
Figure 15B:
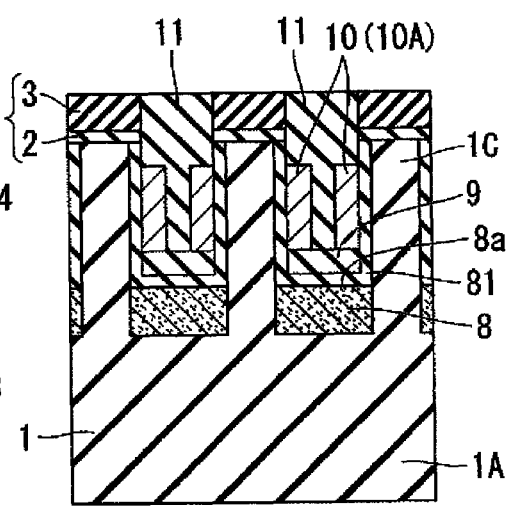
Figure 15C:
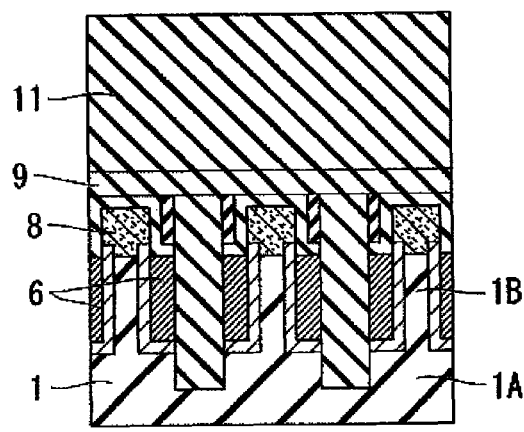
Figure 15D:
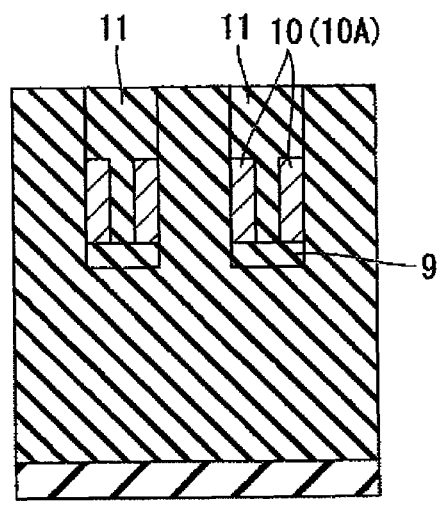

FIG. 15A is a fragmentary cross sectional elevation view illustrating a step, subsequent to the step of FIG. 14A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 15B is a fragmentary cross sectional elevation view illustrating the step, subsequent to the step of FIG. 14B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 15C is a fragmentary cross sectional elevation view illustrating the step, subsequent to the step of FIG. 14C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 15D is a fragmentary cross sectional elevation view illustrating the step, subsequent to the step of FIG. 14D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 15A to 15D, an upper interlayer film 11 is deposited in advance in the fourth groove 1G so as to cover the word line 10 and is then planarized by the CMP method.

Figure 16A:
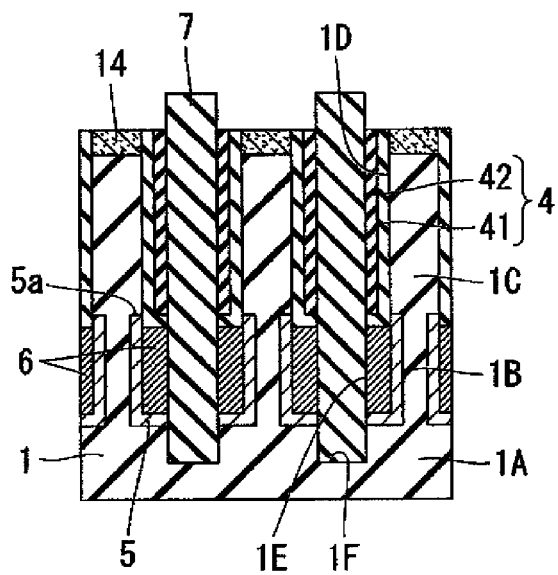
Figure 16B:
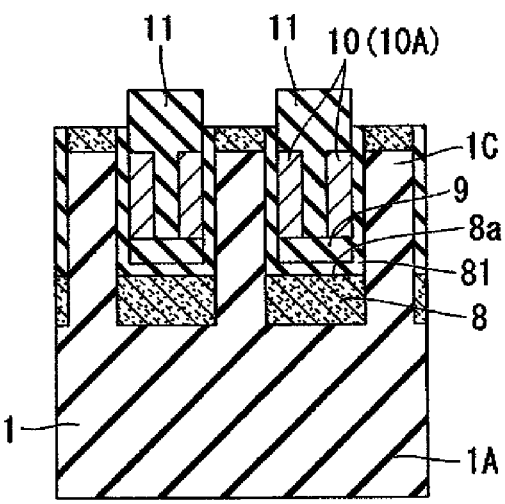
Figure 16C:
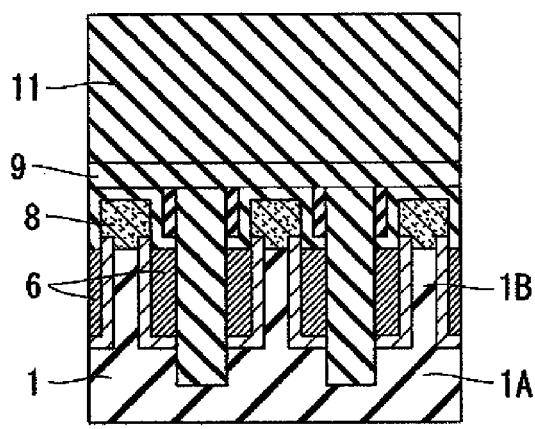
Figure 16D:
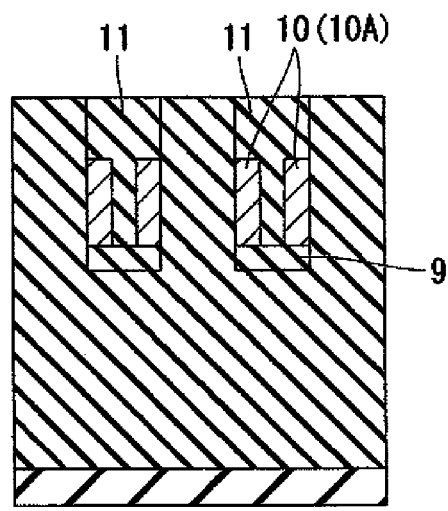

FIG. 16A is a fragmentary cross sectional elevation view illustrating a step, subsequent to the step of FIG. 15A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 16B is a fragmentary cross sectional elevation view illustrating the step, subsequent to the step of FIG. 15B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 16C is a fragmentary cross sectional elevation view illustrating the step, subsequent to the step of FIG. 15C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 16D is a fragmentary cross sectional elevation view illustrating the step, subsequent to the step of FIG. 15D, involved in a method of forming the semiconductor device shown in FIGS. 1A, 1B, 1C, 1D, 42 and 43, taken along a D-D' line of FIGS. 1A, 1B, 1C, 1D, 42 and 43.

Then, as shown in FIGS. 16A to 16D, the first nitride film 3 is removed by the wet etching process using a thermal phosphoric acid. Then, impurities are introduced into the top surface 1d of the pillar 1C through the first oxide film 2 to form the second diffusion layer 14. At this time, As is used as the impurities and the impurity introducing process can be carried out under the conditions of 15 KeV and $1E^{14}$ atoms/cm$^2$.

Then, the first oxide film 2 is removed by the dry etching process to expose the second diffusion layer 14.
Contact and Capacitor Formation Process The manufacturing method according to this embodiment may include a step of forming the contacts 12 on the top surface of the second diffusion layer 14 so as to fill spaces between the interlayer insulating layers 7 of which the top portions are exposed by removing the first oxide film 2 and the first nitride film 3 and a step of forming the capacitor 13 so as to cover the contacts 12 and the interlayer insulating films 7.

Figure 17A:
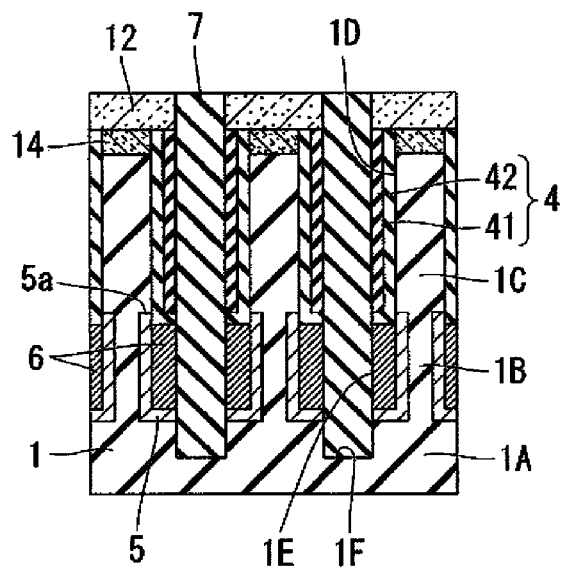
Figure 17B:
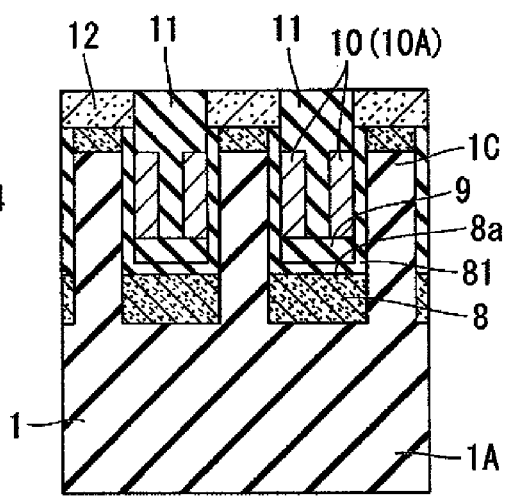
Figure 17C:
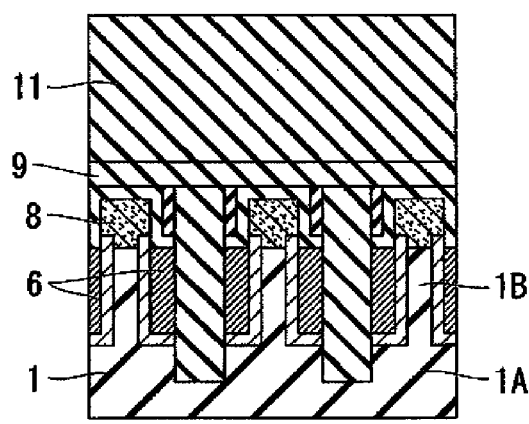
Figure 17D:
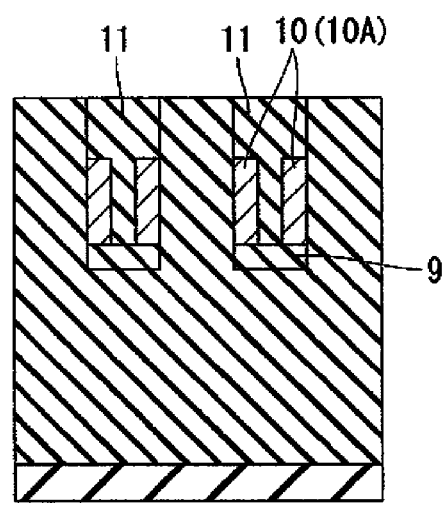

FIG. 17A is a fragmentary cross sectional elevation view illustrating a step, subsequent to the step of FIG. 16A, involved in a method of forming a semiconductor device shown in FIGS. 1A, 1B, 1C, 1D, 42 and 43, taken along an A-A' line of FIGS. 1A, 1B, 1C, 1D, 42 and 43. FIG. 17B is a fragmentary cross sectional elevation view illustrating the step, subsequent to the step of FIG. 16B, involved in a method of forming the semiconductor device shown in FIGS. 1A, 1B, 1C, 1D, 42 and 43, taken along a B-B' line of FIGS. 1A, 1B, 1C, 1D, 42 and 43. FIG. 17C is a fragmentary cross sectional elevation view illustrating the step, subsequent to the step of FIG. 16C, involved in a method of forming the semiconductor device shown in FIGS. 1A, 1B, 1C, 1D, 42 and 43, taken along a C-C' line of FIGS. 1A, 1B, 1C, 1D, 42 and 43. FIG. 17D is a fragmentary cross sectional elevation view illustrating the step, subsequent to the step of FIG. 16D, involved in a method of forming the semiconductor device shown in FIGS. 1A, 1B, 1C, 1D, 42 and 43, taken along a D-D' line of FIGS. 1A, 1B, 1C, 1D, 42 and 43.

Specifically, as shown in FIGS. 17A to 17D, the contact 12 is formed by causing a contact material to grow on the top surface of the second diffusion layer 14 and then planarizing the contact material using the CMP method.

As shown in FIGS. 1A through 1D, the capacitor 13 is formed to cover the contact 12 and the interlayer insulating film 7.

The contact 12 and the capacitor 13 can be formed by using known materials and structures and using known methods without any restriction.

The semiconductor device A according to this embodiment can be manufactured by the above-mentioned processes.

In the above-mentioned semiconductor device A according to this embodiment, since a satisfactory distance is guaranteed between the set of the third diffusion layer 5 and the bit line 6 and the first diffusion layer 8, it is possible to suppress silicide constituting the third diffusion layer 5 and the bit line 6 from being diffused to the first diffusion layer 8. Since the lower diffusing and introducing process, that is, the first diffusion layer forming process, performed to determine the characteristic of the transistor can be carried out independent of the impurity introducing process performed to reduce the interface resistance between the silicide layer of the bit line 6 and the silicon substrate 1, it is possible to freely design plural types of transistors since the embedded line connected to the first diffusion layer can be or cannot be used as the bit line, or can be used as a general line. The top surface of the bit line 6 formed of the silicide layer is covered with an oxide film and the short-circuit between the neighboring bit lines can be avoided by the high-concentration pn junction in the bottom surface thereof, it is possible to embody a semiconductor device with high reliability.

In the method of manufacturing the semiconductor device A according to this embodiment, it is possible to efficiently manufacture a semiconductor device with excellent productivity, which can suppress the silicide layer from being diffused to the first diffusion layer and can enable the free design of plural types of transistors.

In the manufacturing method according to this embodiment, it is possible to easily form the bit lines using the method of forming the bit line as an embedded line below a vertical MOS transistor, dividing the side surfaces of the bit lines with an oxide film, and then dividing the lower portion of the bit line with a PN junction.

The semiconductor device A and the manufacturing method thereof according to this embodiment have the following features.

(1) Pillars are formed by etching the semiconductor substrate (silicon substrate).

(2) A layer (third diffusion layer) having a low potential barrier is disposed between the silicon substrate or well and the transistor body.

(3) The concentration of the lower diffused layer (first diffusion layer) can be determined independently regardless of the impurity concentration for reducing the contact resistance between the embedded line and the lower diffused layer or the lateral distance between the embedded line and the pillars.

(4) The lateral distance between the silicide and the lower diffused layer can be guaranteed when the material of the embedded line is silicide or a material including the silicide.

In this embodiment, as described above, it is possible to form a device in which the pillars are formed by etching the silicon substrate and in which the concentration of the lower diffused layer can be determined independently regardless of the impurity concentration for reducing the contact resistance between the embedded line and the lower diffused layer or the lateral distance between the embedded line and the pillars. That is, it is possible to satisfy both the first and third features (1) and (3).

It is possible to form a device in which the third diffusion layer formed of a layer having a low potential barrier exists between the silicon substrate or well and the transistor body and in which the concentration of the lower diffused layer can be determined independently regardless of the impurity concentration for reducing the contact resistance between the embedded line and the lower diffused layer or the lateral distance between the embedded line and the pillars. That is, it is possible to satisfy both the second and third features (2) and (3).

Even when the material of the embedded line is an diffusion layer, it is possible to independently determine the concentration of the lower diffused layer, regardless of "the impurity concentration for reducing the contact resistance between the embedded line and the lower diffused layer" or the lateral distance between the embedded line and the pillars. That is, this is an example of a device satisfying both the first and third features (1) and (3) or a device satisfying both the second and third features (2) and (3).

By suppressing the lower diffused layer from being diffused in the lateral direction or increasing the diameter of the pillars, a transistor having a small floating body effect may be constructed. By allowing the lower diffused layer to be diffused in the lateral direction or decreasing the diameter of the pillars, a transistor having a great floating body effect may be constructed.

Since the crystallization of the pillars is improved using the method of etching the silicon substrate, the leak current is reduced. Since holes can be gathered in the body of the transistor having a great floating body effect, the transistor may be used as a floating body cell (FBC) structure. That is, by combining the condition of the great floating body cell effect with the device satisfying both the first and third features (1) and (3), it is possible to form the FBC structure with an excellent characteristic.

When the material of the embedded line is silicide or a material containing silicide, it is possible to form a device in which the distance between the silicide and the lower diffused layer can be guaranteed. That is, it is possible to satisfy the fourth feature (4).

Even when the embedded line includes a silicide layer and a metal layer, it is possible to form a device in which the distance between the silicide and the lower diffused layer can be guaranteed. That is, this is an example of the device satisfying the fourth feature (4).

Second Embodiment

A semiconductor device B according to a second embodiment of the invention will be described now with reference to FIGS. 18A through 30D.

FIGS. 18A to 18D are sectional views schematically illustrating the semiconductor device B according to the second embodiment of the invention. FIGS. 19A to 30D are diagrams schematically illustrating the steps of the method of manufacturing a semiconductor device according to the second embodiment and are sectional views taken along the section indicating lines in the schematic plan views of FIGS. 42 and 43, similarly to the first embodiment.

In this embodiment, like elements common to those of the semiconductor device A according to the first embodiment are referenced by like reference numerals and detailed description thereof is not repeated.

Figure 18A:
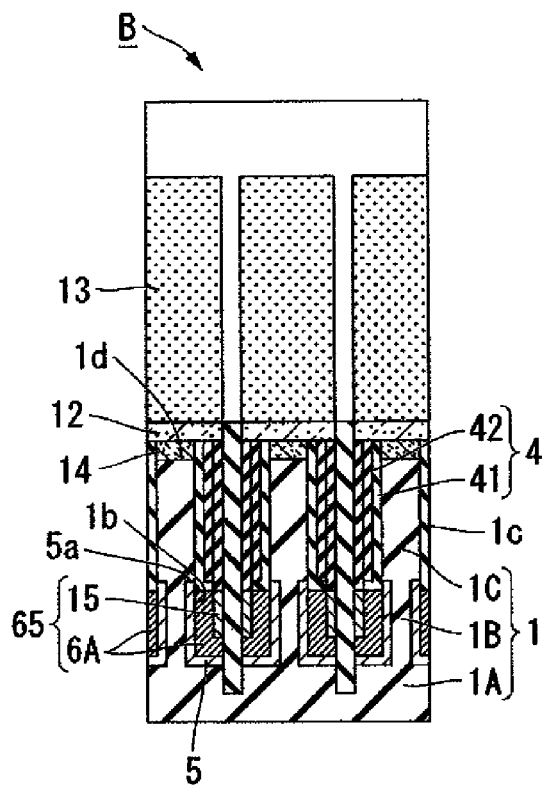
FIGS. 18A through 18D are fragmentary cross sectional elevation view illustrating a semiconductor device shown in FIGS. 42 and 43 in accordance with a second embodiment of the present invention.
Figure 18B:
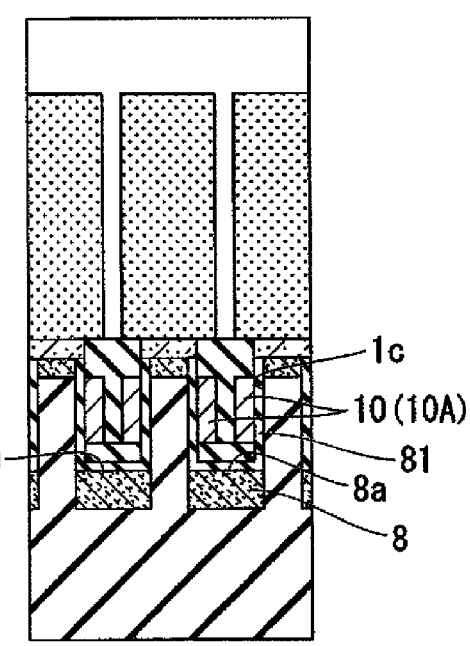
Figure 18C:
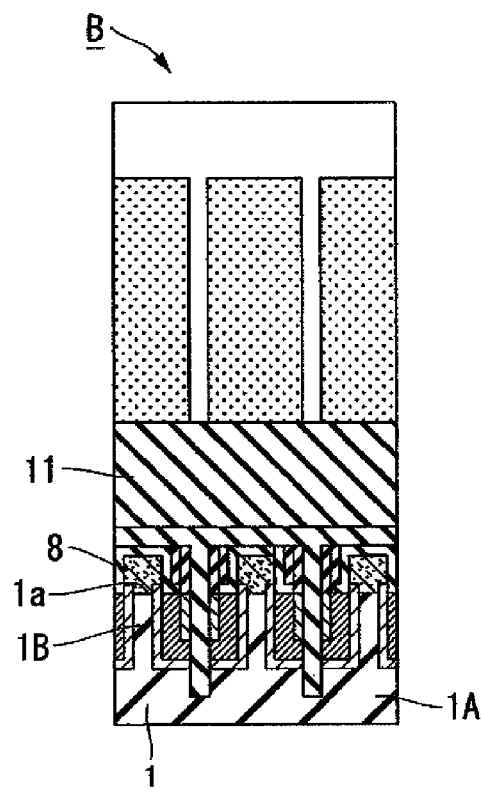
Figure 18D:
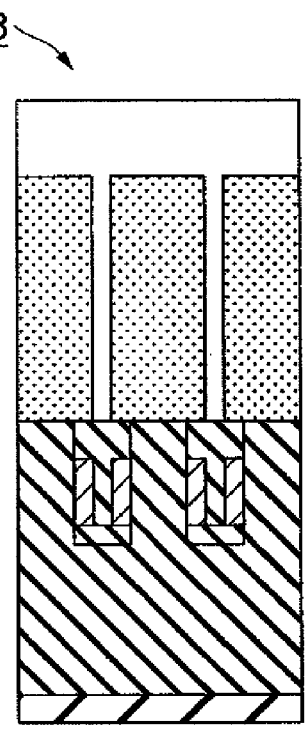

FIG. 18A is a fragmentary cross sectional elevation view illustrating a semiconductor device shown in FIGS. 42 and 43, taken along an A-A' line of FIGS. 42 and 43. FIG. 18B is a fragmentary cross sectional elevation view illustrating the semiconductor device shown in FIGS. 42 and 43, taken along a B-B' line of FIGS. 42 and 43. FIG. 18C is a fragmentary cross sectional elevation view illustrating the semiconductor device shown in FIGS. 42 and 43, taken along a C-C' line of FIGS. 42 and 43. FIG. 18D is a fragmentary cross sectional elevation view illustrating the semiconductor device shown in FIGS. 42 and 43, taken along a D-D' line of FIGS. 42 and 43.

As shown in FIGS. 18A to 18D, the semiconductor device B according to this embodiment is different from the semiconductor device A according to the first embodiment, in that a bit line (embedded line) 65 includes a silicide layer 6A and a metal layer 15.

In the bit line 65 of the semiconductor device B according to this embodiment, the metal layer 15 is formed on the surface of the silicide layer 6A formed by the same flow of the bit line 6 described in the first embodiment.

The material of the metal layer 15 is not particularly limited, and for example, the metal layer may be formed of one or both of a tungsten layer and a tungsten nitride layer.

The method of manufacturing the semiconductor device B according to this embodiment will be described now.

In this embodiment, in (4) the bit line (embedded line) forming process according to the first embodiment, a silicide layer 6A is formed by depositing and thermally processing a metal material on the third diffusion layer 5, a bit line 65 including the silicide layer 6A and the metal layer 15 is then formed by filling the second trench 1E with a metal material, and the third trench 1F communicating with the second trench 1E is formed by etching the bit line 65 and the body 1A.

Figure 19A:
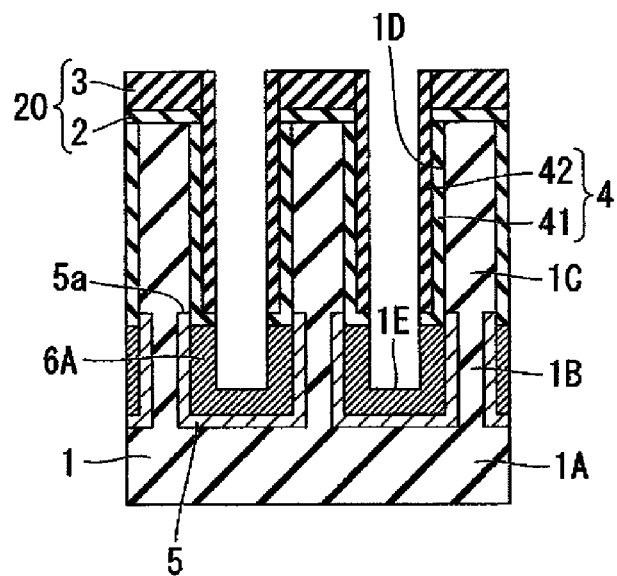
Figure 19B:
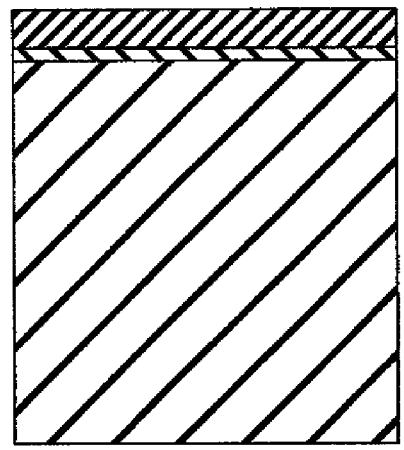
Figure 19C:
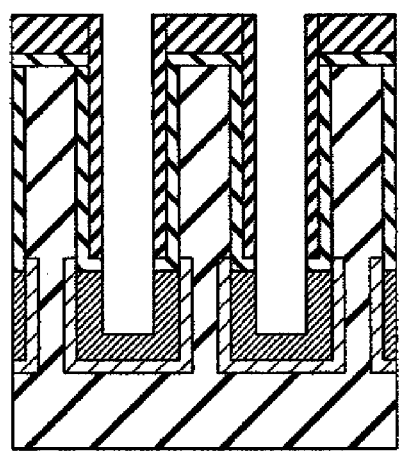
Figure 19D:

FIG. 19A is a fragmentary cross sectional elevation view illustrating a step involved in a method of forming a semiconductor device shown in FIGS. 18A, 18B, 18C, 18D, 42 and 43, taken along an A-A' line of FIGS. 18A, 18B, 18C, 18D, 42 and 43. FIG. 19B is a fragmentary cross sectional elevation view illustrating the step involved in a method of forming the semiconductor device shown in FIGS. 18A, 18B, 18C, 18D, 42 and 43, taken along a B-B' line of FIGS. 18A, 18B, 18C, 18D, 42 and 43. FIG. 19C is a fragmentary cross sectional elevation view illustrating the step involved in a method of forming the semiconductor device shown in FIGS. 18A, 18B, 18C, 18D, 42 and 43, taken along a C-C' line of FIGS. 18A, 18B, 18C, 18D, 42 and 43. FIG. 19D is a fragmentary cross sectional elevation view illustrating the step involved in a method of forming the semiconductor device shown in FIGS. 18A, 18B, 18C, 18D, 42 and 43, taken along a D-D' line of FIGS. 18A, 18B, 18C, 18D, 42 and 43.

In this embodiment, the process until forming the silicide layer 6A shown in FIGS. 19A to 19D can be the same as the processes (1) to (3), for example, the fin forming process, the bottom diffusion process, and the base formation process according to the first embodiment.

Figure 20A:
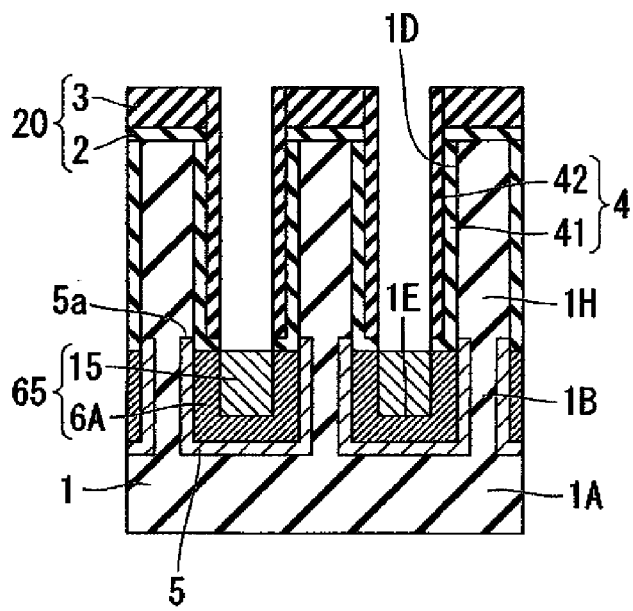
Figure 20B:
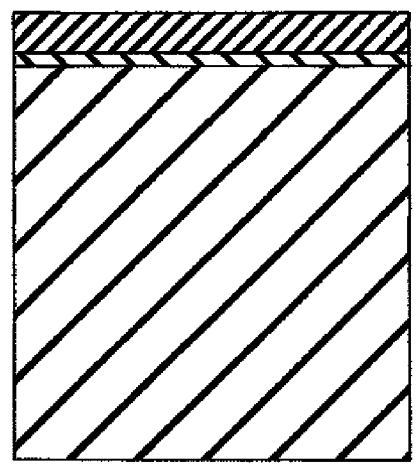
Figure 20C:
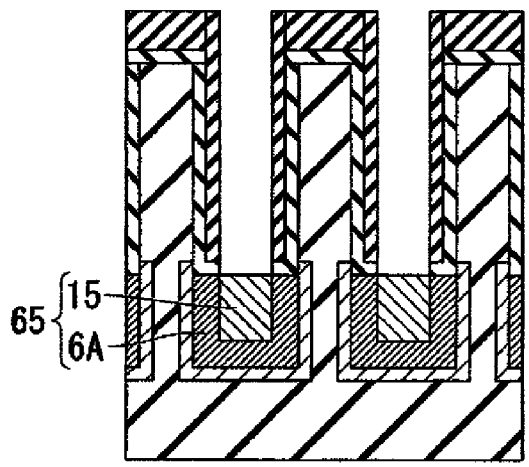
Figure 20D:
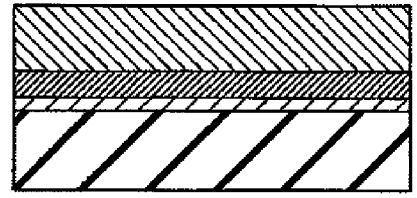

FIG. 20A is a fragmentary cross sectional elevation view illustrating a step, subsequent to the step of FIG. 19A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 20B is a fragmentary cross sectional elevation view illustrating the step, subsequent to the step of FIG. 19B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 20C is a fragmentary cross sectional elevation view illustrating the step, subsequent to the step of FIG. 19C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 20D is a fragmentary cross sectional elevation view illustrating the step, subsequent to the step of FIG. 19D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 20A to 20D, in this embodiment, the metal material is formed and filled in the second trench 1E formed in the silicide layer 6A using the CVD method to form the metal layer 15.

Figure 21A:
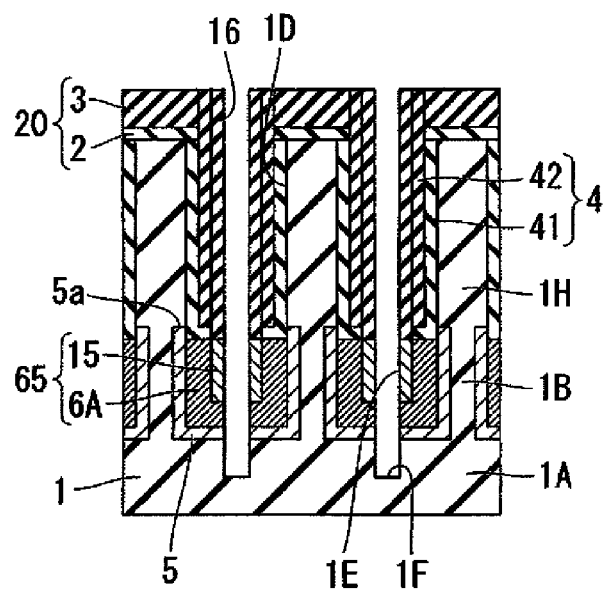
Figure 21B:
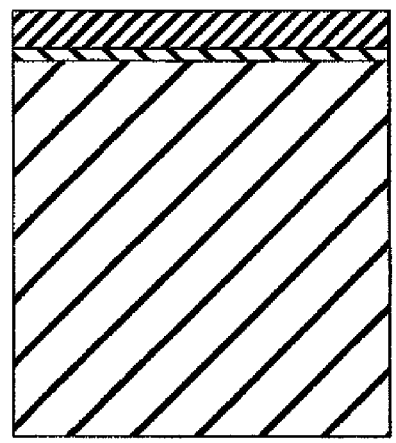
Figure 21C:
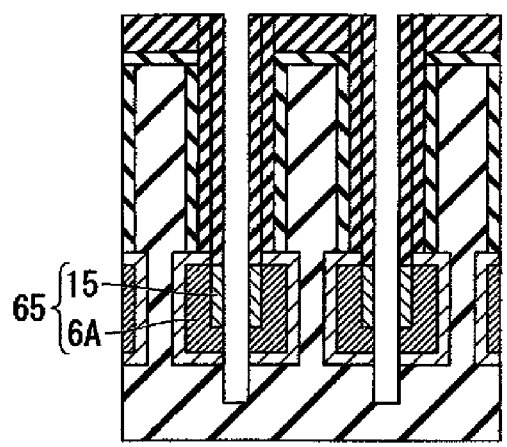
Figure 21D:

FIG. 21A is a fragmentary cross sectional elevation view illustrating a step, subsequent to the step of FIG. 20A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 21B is a fragmentary cross sectional elevation view illustrating the step, subsequent to the step of FIG. 20B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 21C is a fragmentary cross sectional elevation view illustrating the step, subsequent to the step of FIG. 20C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 21D is a fragmentary cross sectional elevation view illustrating the step, subsequent to the step of FIG. 20D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 21A to 21D, a sidewall nitride film 16 is made to grow, for example, to a thickness of 10 nm in the first trench 1D using the CVD method. Then, the sidewall nitride film 16 is etched back, the metal layer 15 is dry-etched, and the silicide layer 6A is dry-etched. The third trench 1F is formed by etching the body 1A.

Figure 22A:
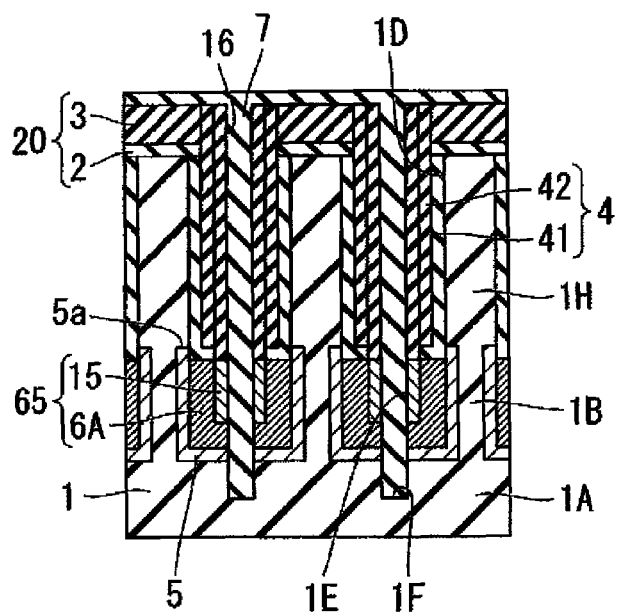
Figure 22B:
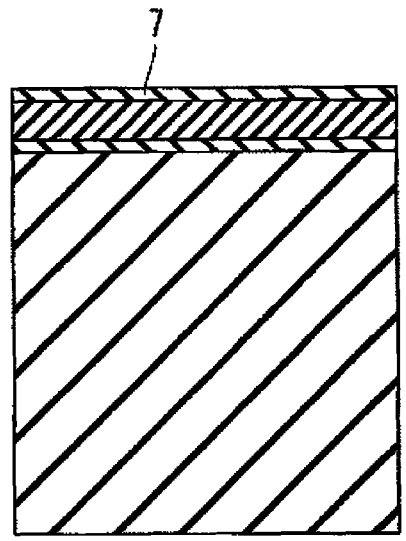
Figure 22C:
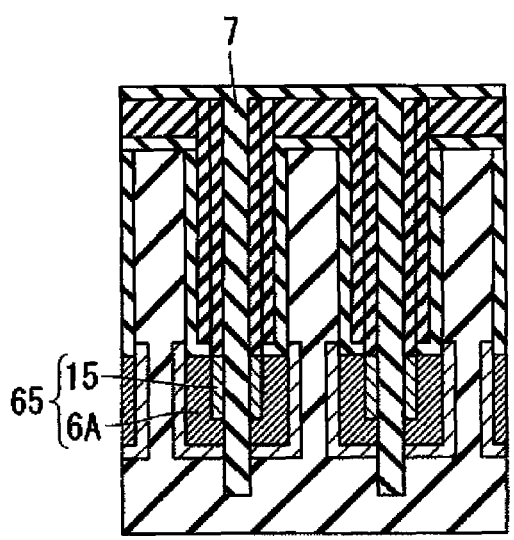
Figure 22D:
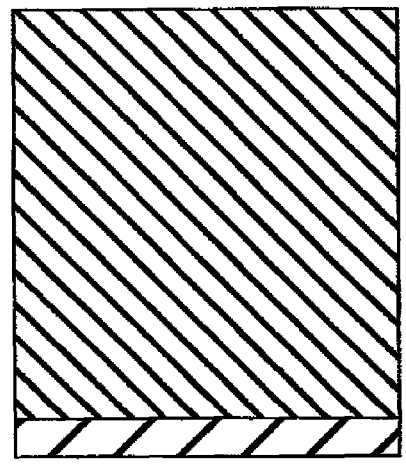

FIG. 22A is a fragmentary cross sectional elevation view illustrating a step, subsequent to the step of FIG. 21A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 22B is a fragmentary cross sectional elevation view illustrating the step, subsequent to the step of FIG. 21B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 22C is a fragmentary cross sectional elevation view illustrating the step, subsequent to the step of FIG. 21C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 22D is a fragmentary cross sectional elevation view illustrating the step, subsequent to the step of FIG. 21D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 22A to 22D, by forming an oxide film using the CVD method, the interlayer insulating film 7 is formed to cover the insides of the trenches and the top portions thereof.

Figure 23A:
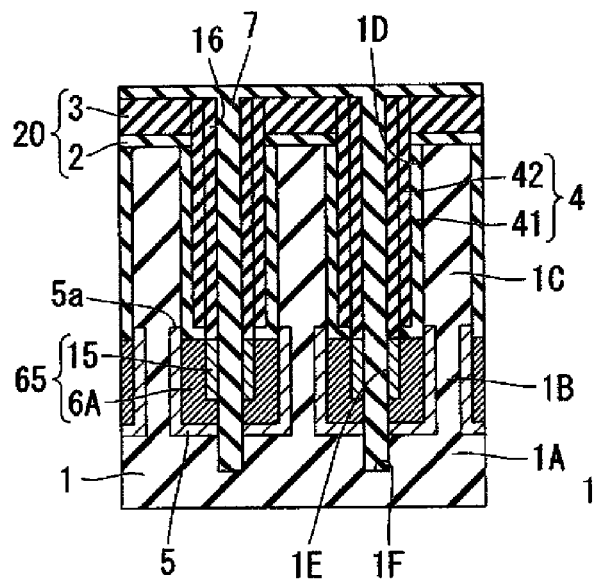
Figure 23B:
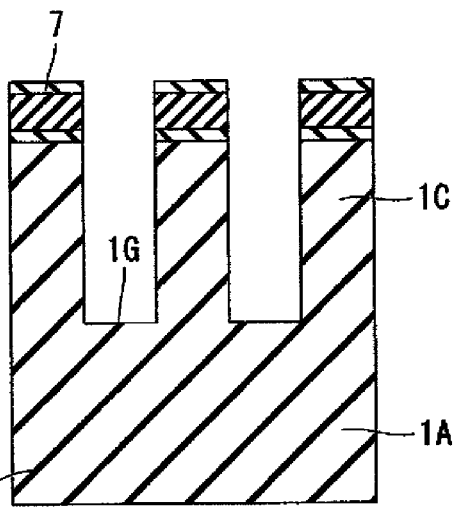
Figure 23C:
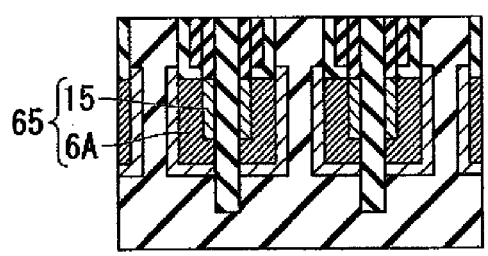
Figure 23D:
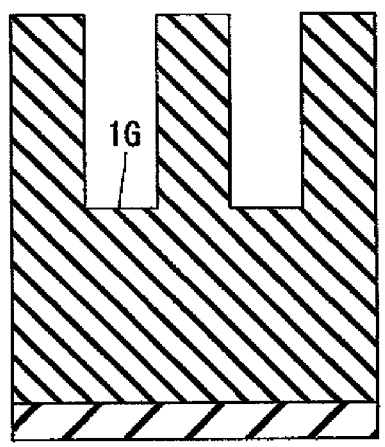

FIG. 23A is a fragmentary cross sectional elevation view illustrating a step, subsequent to the step of FIG. 22A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 23B is a fragmentary cross sectional elevation view illustrating the step, subsequent to the step of FIG. 22B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 23C is a fragmentary cross sectional elevation view illustrating the step, subsequent to the step of FIG. 22C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 23D is a fragmentary cross sectional elevation view illustrating the step, subsequent to the step of FIG. 22D, involved in a method of forming the semiconductor device shown in FIGS. 18A, 18B, 18C, 18D, 42 and 43, taken along a D-D' line of FIGS. 18A, 18B, 18C, 18D, 42 and 43.

Then, as shown in FIGS. 23A to 23D, the fourth groove 1G is formed by patterning and dry-etching the silicon substrate 1 in the direction parallel to the gate line using the lithography method along with the interlayer insulating film 7, the first nitride film 3, and the first oxide film 2.

Figure 24A:
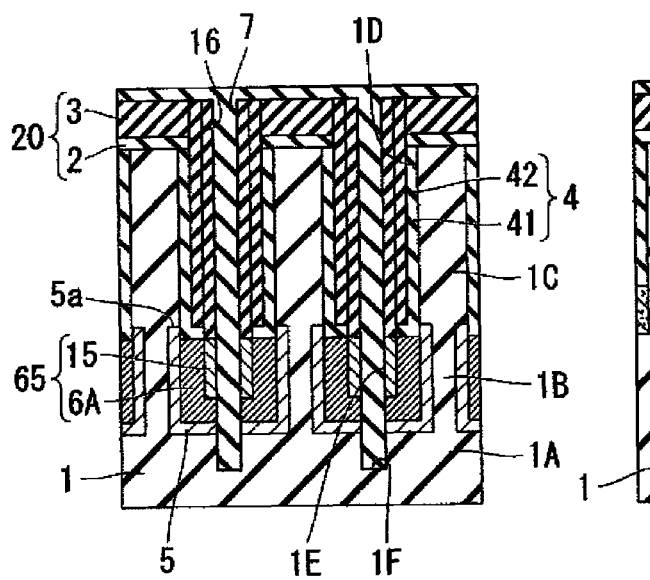
Figure 24B:
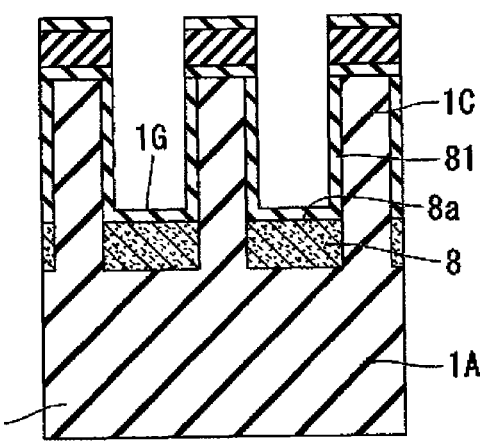
Figure 24C:
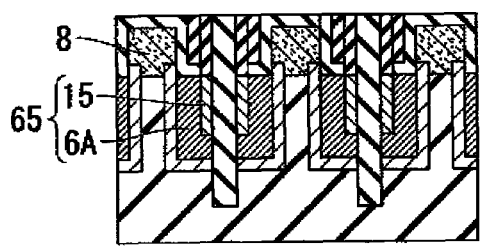
Figure 24D:
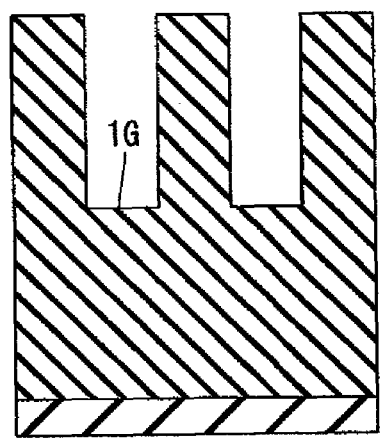

FIG. 24A is a fragmentary cross sectional elevation view illustrating a step, subsequent to the step of FIG. 23A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 24B is a fragmentary cross sectional elevation view illustrating the step, subsequent to the step of FIG. 23B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 24C is a fragmentary cross sectional elevation view illustrating the step, subsequent to the step of FIG. 23C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 24D is a fragmentary cross sectional elevation view illustrating the step, subsequent to the step of FIG. 23D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 24A to 24D, by thermally oxidizing the bottom of the fourth groove 1G, silicon of that portion is oxidized. Then, impurities are introduced in the same flow as the first embodiment to form the first diffusion layer 8 in that portion.

FIG. 25A is a fragmentary cross sectional elevation view illustrating a step, subsequent to the step of FIG. 24A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 25B is a fragmentary cross sectional elevation view illustrating the step, subsequent to the step of FIG. 24B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 25C is a fragmentary cross sectional elevation view illustrating the step, subsequent to the step of FIG. 24C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 25D is a fragmentary cross sectional elevation view illustrating the step, subsequent to the step of FIG. 24D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 25A to 25D, the fifth oxide film 9 is formed in the bottom of the fourth groove 1G using the HDP method. Then, the sidewalls of the fourth groove 1G are exposed by the wet etching process and then a gate oxidizing process is performed.

Figure 26A:
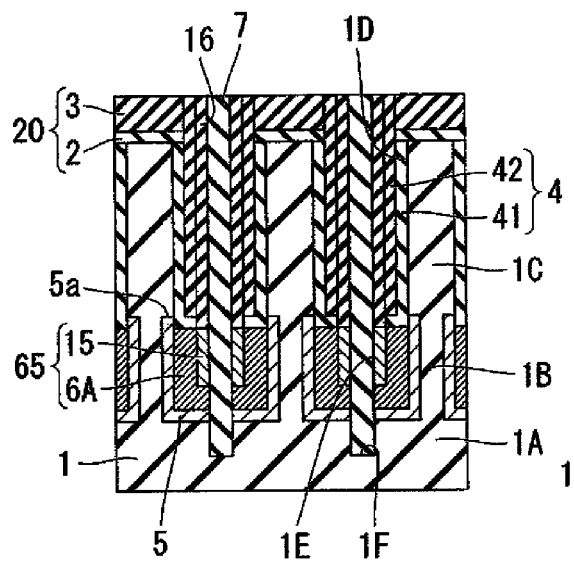
Figure 26B:
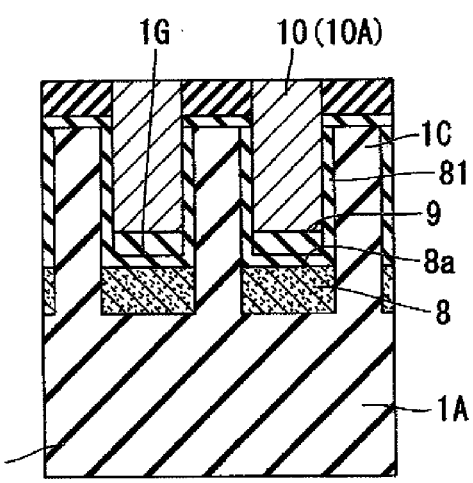
Figure 26C:
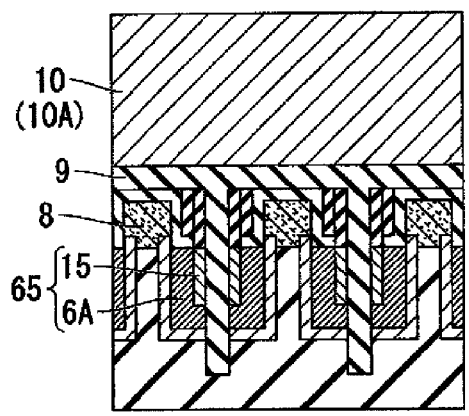
Figure 26D:
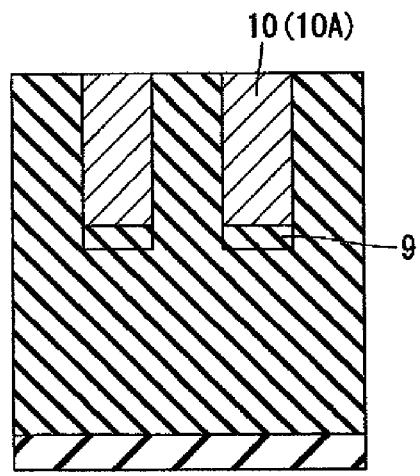

FIG. 26A is a fragmentary cross sectional elevation view illustrating a step, subsequent to the step of FIG. 25A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 26B is a fragmentary cross sectional elevation view illustrating the step, subsequent to the step of FIG. 25B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 26C is a fragmentary cross sectional elevation view illustrating the step, subsequent to the step of FIG. 25C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 26D is a fragmentary cross sectional elevation view illustrating the step, subsequent to the step of FIG. 25D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 26A through 26D, the gate electrode material is made to grow in the fourth groove 1G using the CVD method and then is planarized by the CMP method, whereby the word line 10 is formed.

Figure 27A:
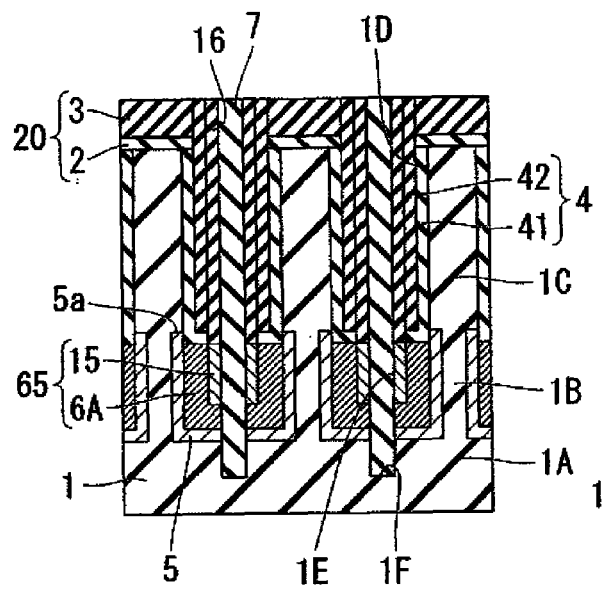
Figure 27B:
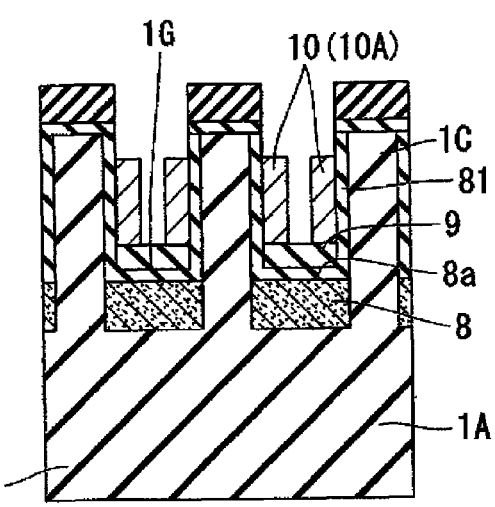
Figure 27C:
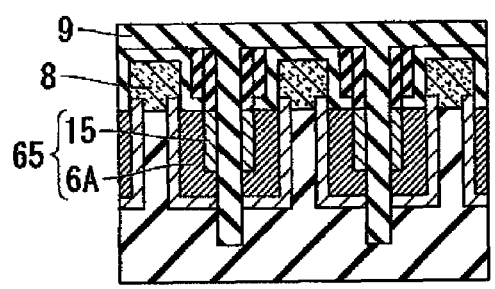
Figure 27D:
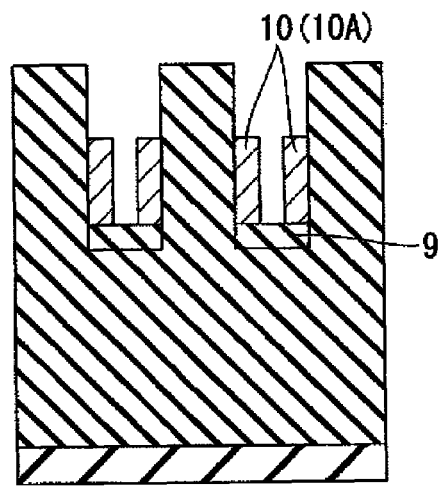

FIG. 27A is a fragmentary cross sectional elevation view illustrating a step, subsequent to the step of FIG. 26A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 27B is a fragmentary cross sectional elevation view illustrating the step, subsequent to the step of FIG. 26B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 27C is a fragmentary cross sectional elevation view illustrating the step, subsequent to the step of FIG. 26C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 27D is a fragmentary cross sectional elevation view illustrating the step, subsequent to the step of FIG. 26D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 27A through 27D, by patterning the word line 10 in the direction parallel to the gate line using the lithography method, the word line is divided into line pieces and the resist is removed. Then, the top portions of the word lines 10 are etched and removed, thereby reducing the height thereof.

Figure 28A:
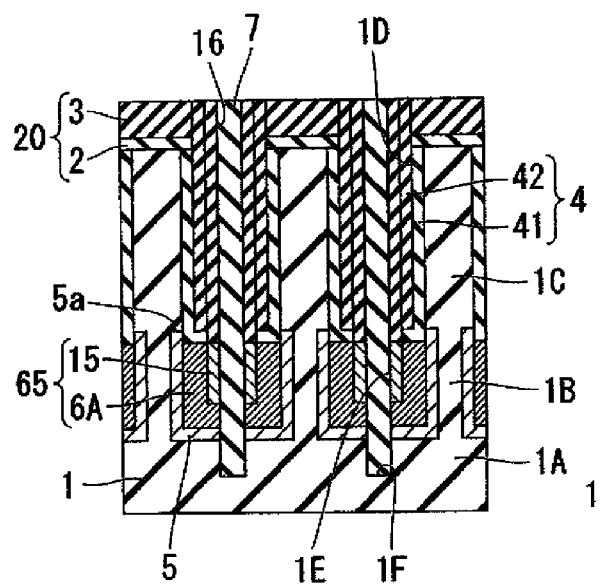
Figure 28B:
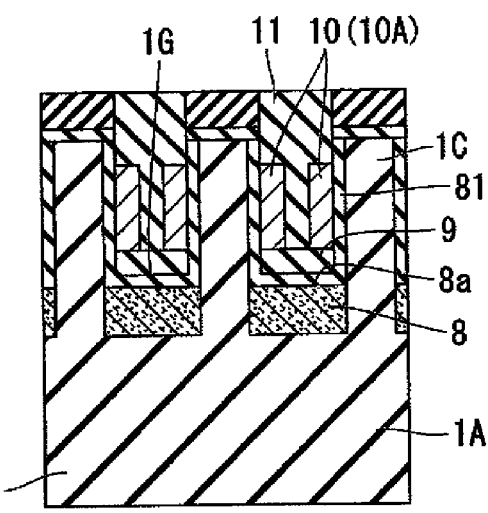
Figure 28C:
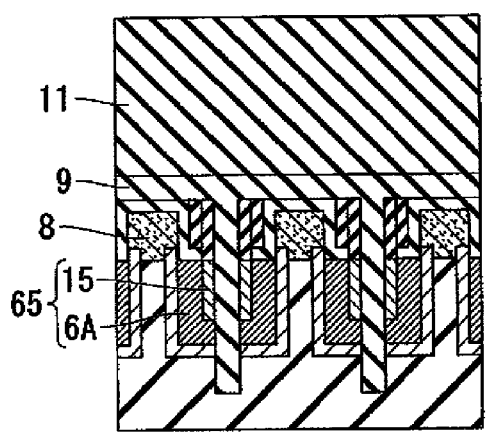
Figure 28D:
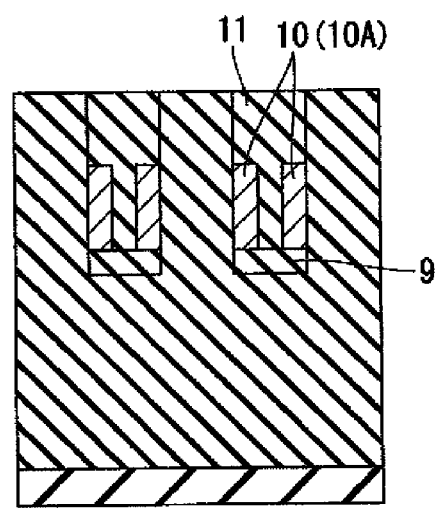

FIG. 28A is a fragmentary cross sectional elevation view illustrating a step, subsequent to the step of FIG. 27A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 28B is a fragmentary cross sectional elevation view illustrating the step, subsequent to the step of FIG. 27B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 28C is a fragmentary cross sectional elevation view illustrating the step, subsequent to the step of FIG. 27C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 28D is a fragmentary cross sectional elevation view illustrating the step, subsequent to the step of FIG. 27D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 28A through 28D, the interlayer insulating film 11 is deposited in the fourth groove 1G and is then planarized by the CMP method.

Figure 29A:
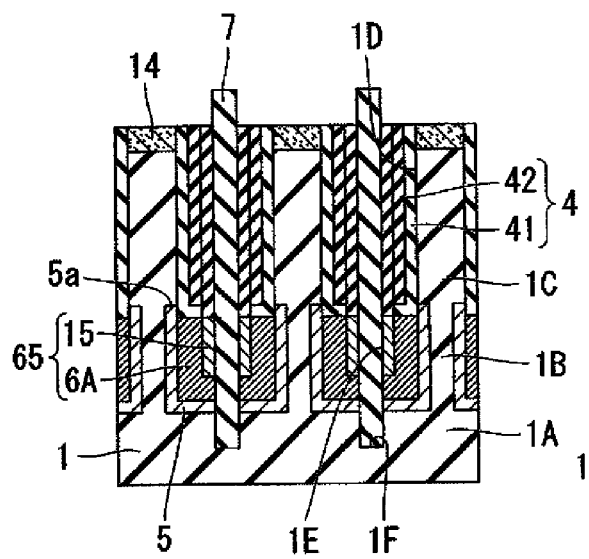
Figure 29B:
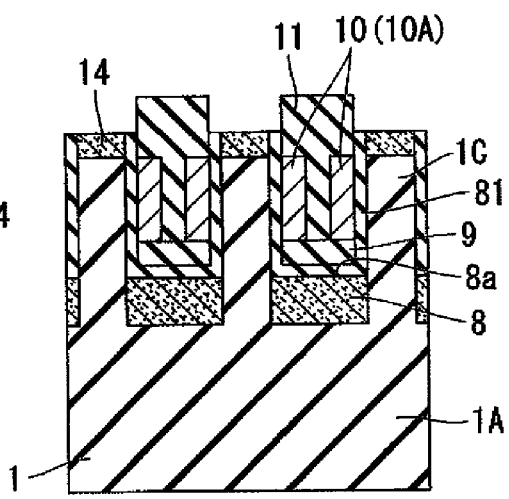
Figure 29C:
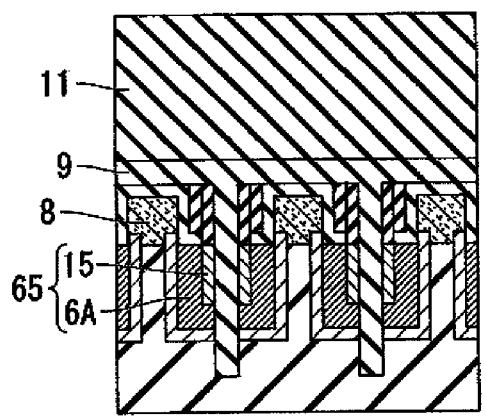
Figure 29D:
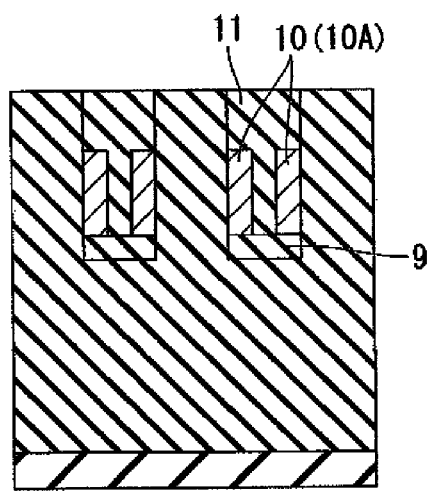

FIG. 29A is a fragmentary cross sectional elevation view illustrating a step, subsequent to the step of FIG. 28A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 29B is a fragmentary cross sectional elevation view illustrating the step, subsequent to the step of FIG. 28B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 29C is a fragmentary cross sectional elevation view illustrating the step, subsequent to the step of FIG. 28C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 29D is a fragmentary cross sectional elevation view illustrating the step, subsequent to the step of FIG. 28D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 29A through 29D, the first nitride film 3 is removed in the same flow as the first embodiment and impurities are introduced from the top surface 1d of the pillar 1C under the same condition, whereby the second diffusion layer 14 is formed. Then, the first oxide film 2 is etched and removed similarly to expose the second diffusion layer 14.

Figure 30A:
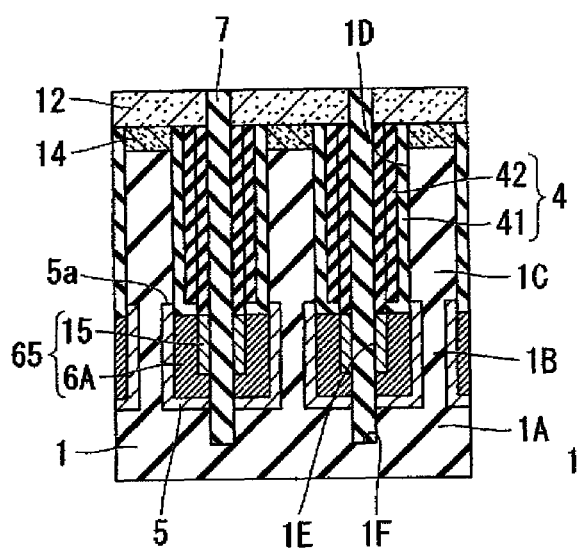
Figure 30B:
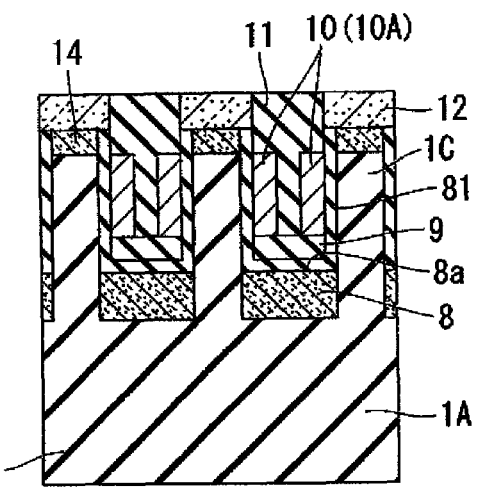
Figure 30C:
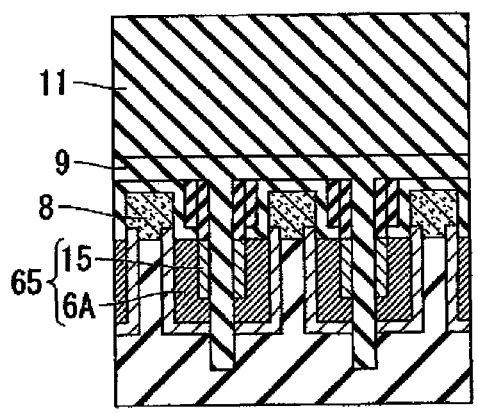
Figure 30D:
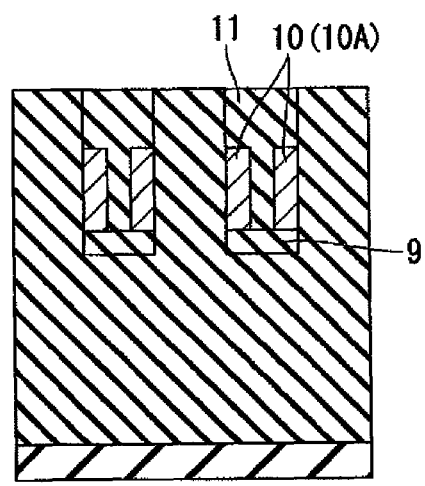

FIG. 30A is a fragmentary cross sectional elevation view illustrating a step, subsequent to the step of FIG. 29A, involved in a method of forming a semiconductor device shown in FIGS. 18A, 18B, 18C, 18D, 42 and 43, taken along an A-A' line of FIGS. 18A, 18B, 18C, 18D, 42 and 43. FIG. 30B is a fragmentary cross sectional elevation view illustrating the step, subsequent to the step of FIG. 29B, involved in a method of forming the semiconductor device shown in FIGS. 18A, 18B, 18C, 18D, 42 and 43, taken along a B-B' line of FIGS. 18A, 18B, 18C, 18D, 42 and 43. FIG. 30C is a fragmentary cross sectional elevation view illustrating the step, subsequent to the step of FIG. 29C, involved in a method of forming the semiconductor device shown in FIGS. 18A, 18B, 18C, 18D, 42 and 43, taken along a C-C' line of FIGS. 18A, 18B, 18C, 18D, 42 and 43. FIG. 30D is a fragmentary cross sectional elevation view illustrating the step, subsequent to the step of FIG. 29D, involved in a method of forming the semiconductor device shown in FIGS. 18A, 18B, 18C, 18D, 42 and 43, taken along a D-D' line of FIGS. 18A, 18B, 18C, 18D, 42 and 43.

As shown in FIGS. 30A through 30D, a contact material is made to grow on the second diffusion layer 14 to form the contact 12. Then, as shown in FIGS. 18A to 18D, the capacitor 13 is formed on the contact 12.

From the above-mentioned flow of processes, the semiconductor device B according to this embodiment is obtained as shown in FIGS. 18A to 18D.

Third Embodiment

A semiconductor device according to a third embodiment of the invention will be described with reference to FIGS. 31 through 34.

FIGS. 31 to 34 are diagrams schematically illustrating the steps of the method of manufacturing the semiconductor device according to the third embodiment and are sectional views taken along the section indicating line A-A' in the schematic plan views of FIGS. 42 and 43.

In this embodiment, like elements common to those of the semiconductor devices A and B according to the first and second embodiments are referenced by like reference numerals and detailed description thereof is not repeated.

Figure 31:
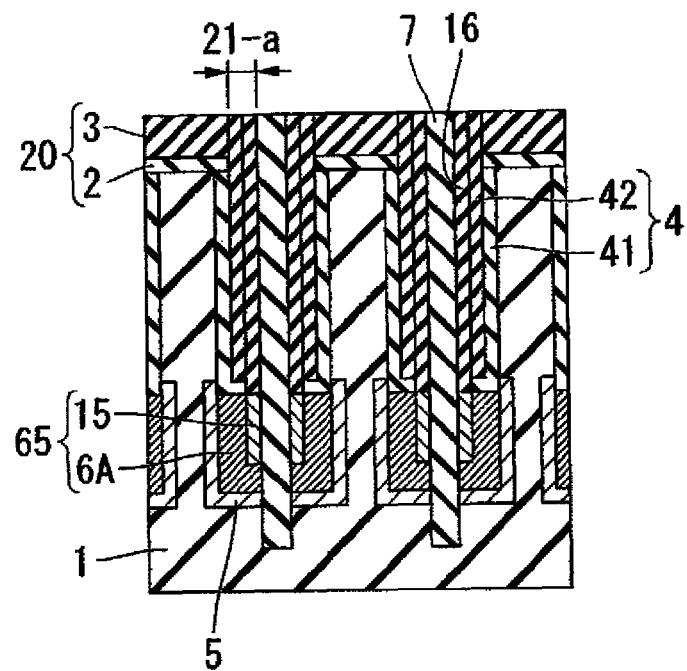
FIG. 31 is a fragmentary cross sectional elevation view illustrating a semiconductor device shown in FIGS. 42 and 43 in accordance with a third embodiment of the present invention.
Figure 32:
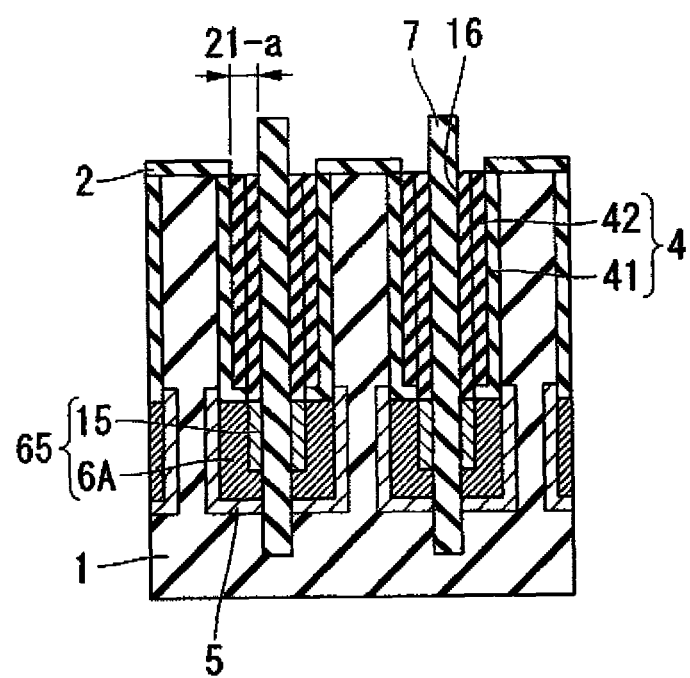
FIGS. 32 through 34 are fragmentary cross sectional elevation views illustrating a method of forming a semiconductor device shown in FIGS. 31A, 31B, 31C, 31D, 42 and 43 in accordance with the third embodiment of the present invention.
Figure 33:
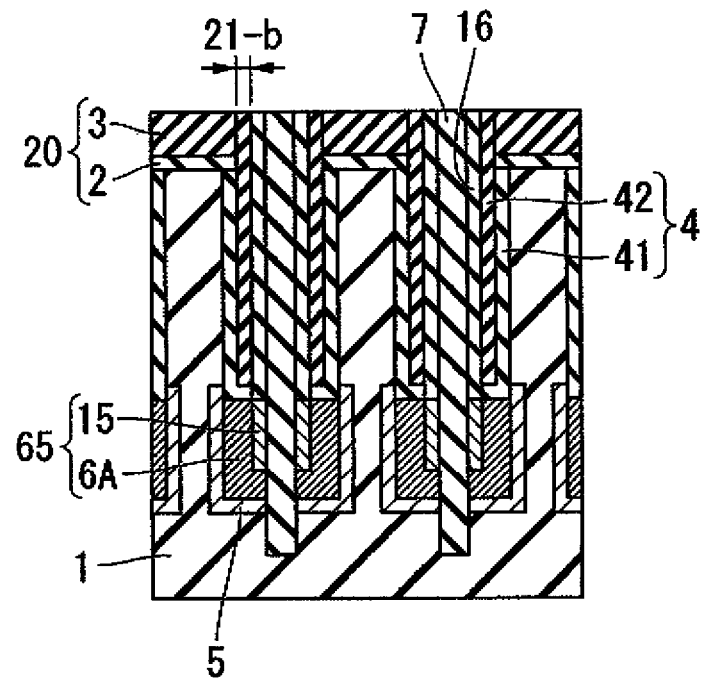
Figure 34:
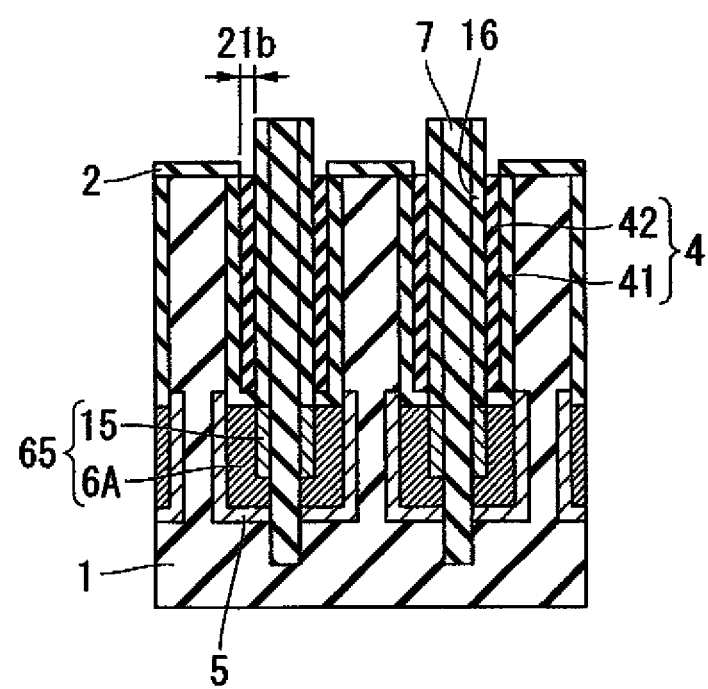

FIG. 31 is a fragmentary cross sectional elevation view illustrating a semiconductor device shown in FIGS. 42 and 43, taken along an A-A' line of FIGS. 42 and 43. FIG. 32 is a fragmentary cross sectional elevation view illustrating a step involved in a method of forming a semiconductor device shown in FIGS. 31A, 31B, 31C, 31D, 42 and 43, taken along an A-A' line of FIGS. 31A, 31B, 31C, 31D, 42 and 43. FIG. 33 is a fragmentary cross sectional elevation view illustrating a step, subsequent to the step of FIG. 32, involved in a method of forming a semiconductor device shown in FIGS. 31A, 31B, 31C, 31D, 42 and 43, taken along an A-A' line of FIGS. 31A, 31B, 31C, 31D, 42 and 43. FIG. 34 is a fragmentary cross sectional elevation view illustrating a step, subsequent to the step of FIG. 33, involved in a method of forming a semiconductor device shown in FIGS. 31A, 31B, 31C, 31D, 42 and 43, taken along an A-A' line of FIGS. 31A, 31B, 31C, 31D, 42 and 43.

As shown in FIG. 31, in this embodiment, the width of the first nitride film on one side is greater by the size indicated by reference sign 21-$a$ in the drawing than the width of the first nitride film 3 formed at the first time in the manufacturing steps of the semiconductor device B according to the second embodiment shown in FIGS. 26A through 26D. Accordingly, as shown in FIG. 32, by wet-etching the first nitride film, the recessed area is widened by the reference numeral 21-$a$ and the area in which the contact can be formed is widened by that portion. For example, when the film formed in the second embodiment shown in FIGS. 26A to 26D is an oxide film, the oxide film 31 shown in FIG. 33 is formed by performing the similar process steps.

In the example shown in FIG. 33, the width of the nitride film on one side is greater by reference numeral 21-$b$ than the width of the first nitride film 3 formed at the first time, but the width difference is smaller than reference numeral 21-$a$. Accordingly, as shown in FIG. 34, the recessed area is widened by reference numeral 21-$b$ after wet-etching the first nitride film 3, but the width difference is smaller than reference sign 21-$a$. In consideration of this point, by suitably selecting the material of the mask, the material of the sidewall, and the thickness of the sidewall, it is possible to control the area in which the contact can be formed. Accordingly, by increasing the contact forming area, it is possible to reduce the contact resistance.

Fourth Embodiment

A semiconductor device according to a fourth embodiment of the invention will be described with reference to FIG. 35.

Figure 35:
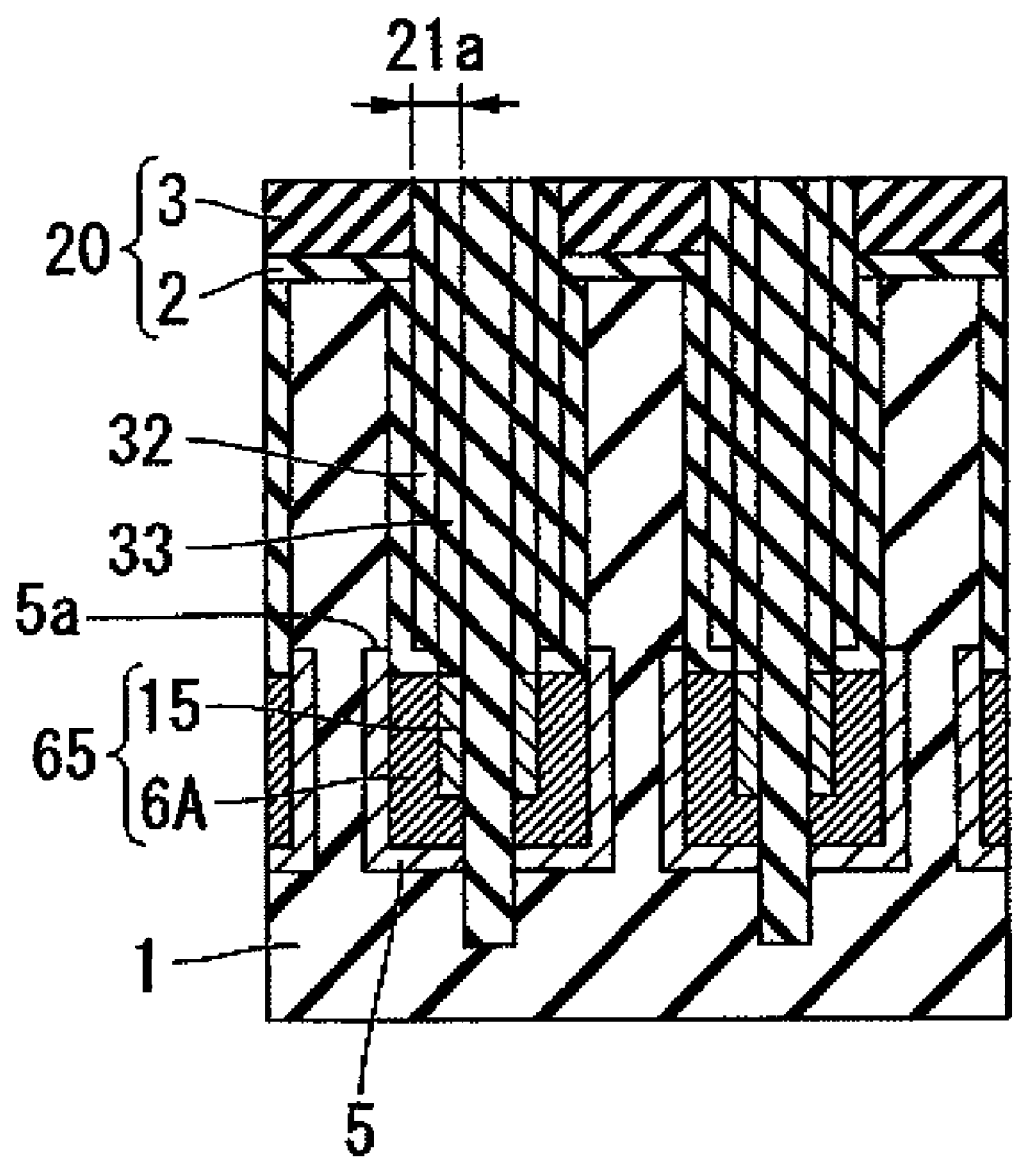
FIG. 35 is a fragmentary cross sectional elevation view illustrating a semiconductor device shown in FIGS. 42 and 43 in accordance with a fourth embodiment of the present invention.

FIG. 35 is a fragmentary cross sectional elevation view illustrating a semiconductor device shown in FIGS. 42 and 43, taken along an A-A' line of FIGS. 42 and 43.

Regarding the film formed as the sidewall of the pillar 1C, the sidewall nitride film 16 and the second nitride film 42 are both formed of a nitride film in the method of manufacturing the semiconductor device B according to the second embodiment shown in FIGS. 26A to 26D. In this embodiment, as shown in FIG. 35, the films are formed as oxide films 32 and 33. By this configuration, since no sidewall nitride film exists at the time of dry-etching the silicon substrate 1 in the direction parallel to the word line, it is not necessary to consider the selectivity of the nitride film after etching the first nitride film 3, whereby the shaping is facilitated.

Fifth Embodiment

A semiconductor device according to a fifth embodiment of the invention will be described with reference to FIGS. 36A through 41D.

FIG. 36A is a fragmentary cross sectional elevation view illustrating a semiconductor device shown in FIGS. 42 and 43, taken along an A-A' line of FIGS. 42 and 43. FIG. 36B is a fragmentary cross sectional elevation view illustrating the semiconductor device shown in FIGS. 42 and 43, taken along a B-B' line of FIGS. 42 and 43. FIG. 36C is a fragmentary cross sectional elevation view illustrating the semiconductor device shown in FIGS. 42 and 43, taken along a C-C' line of FIGS. 42 and 43. FIG. 36D is a fragmentary cross sectional elevation view illustrating the semiconductor device shown in FIGS. 42 and 43, taken along a D-D' line of FIGS. 42 and 43.

Here, the diagrams shown in FIGS. 36A through 36D are the same as the diagrams shown in FIGS. 20A through 20D according to the second embodiment.

Figure 37A:
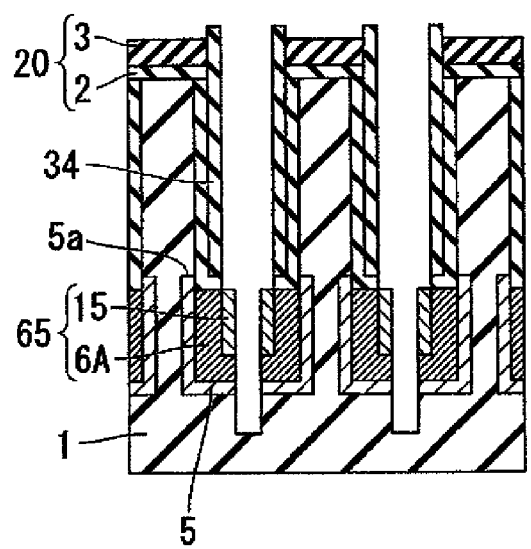
FIGS. 37A through 41D are fragmentary cross sectional elevation view illustrating a method of forming a semiconductor device shown in FIGS. 36A, 36B, 36C, 36D, 42 and 43 in accordance with the fifth embodiment of the present invention.
Figure 37B:
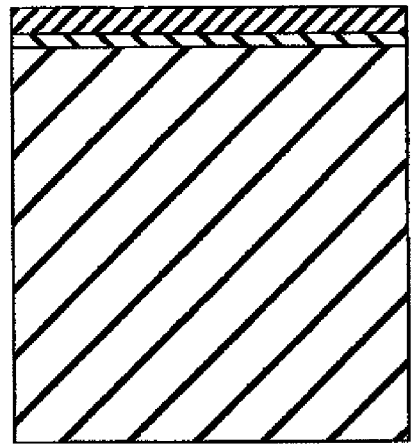
Figure 37C:
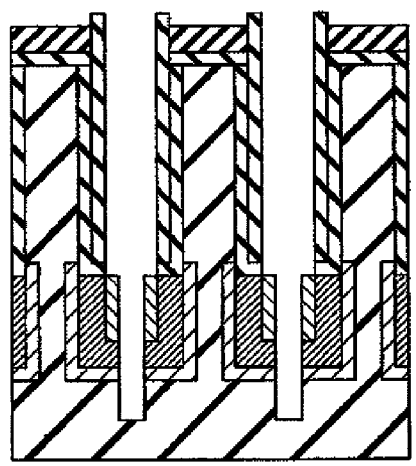
Figure 37D:

FIG. 37A is a fragmentary cross sectional elevation view illustrating a step involved in a method of forming a semiconductor device shown in FIGS. 36A, 36B, 36C, 36D, 42 and 43, taken along an A-A' line of FIGS. 36A, 36B, 36C, 36D, 42 and 43. FIG. 37B is a fragmentary cross sectional elevation view illustrating the step involved in a method of forming the semiconductor device shown in FIGS. 36A, 36B, 36C, 36D, 42 and 43, taken along a B-B' line of FIGS. 36A, 36B, 36C, 36D, 42 and 43. FIG. 37C is a fragmentary cross sectional elevation view illustrating the step involved in a method of forming the semiconductor device shown in FIGS. 36A, 36B, 36C, 36D, 42 and 43, taken along a C-C' line of FIGS. 36A, 36B, 36C, 36D, 42 and 43. FIG. 37D is a fragmentary cross sectional elevation view illustrating the step involved in a method of forming the semiconductor device shown in FIGS. 36A, 36B, 36C, 36D, 42 and 43, taken along a D-D' line of FIGS. 36A, 36B, 36C, 36D, 42 and 43.

Thereafter, as shown in FIGS. 37A through 37D, a sidewall nitride film 35 and the first nitride film 3 corresponding to the thickness of the sidewall nitride film 35 are wet-etched.

Figure 38A:
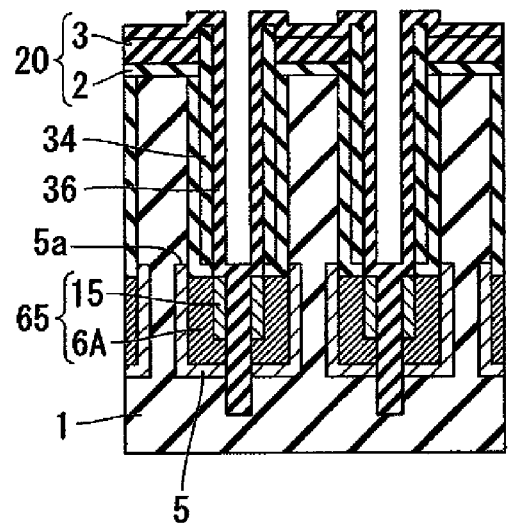
Figure 38B:
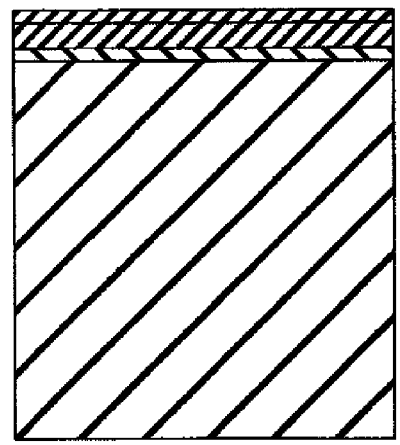
Figure 38C:
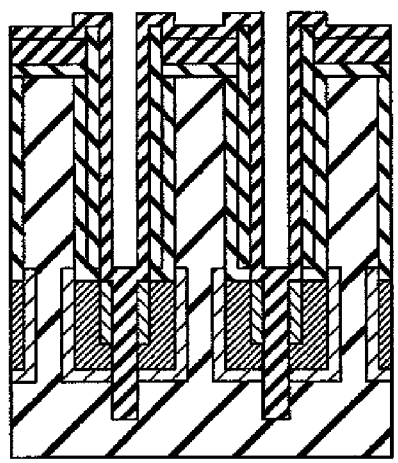
Figure 38D:
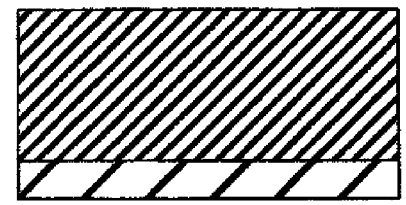

FIG. 38A is a fragmentary cross sectional elevation view illustrating a step, subsequent to the step of FIG. 37A, involved in a method of forming a semiconductor device shown in FIGS. 36A, 36B, 36C, 36D, 42 and 43, taken along an A-A' line of FIGS. 36A, 36B, 36C, 36D, 42 and 43. FIG. 38B is a fragmentary cross sectional elevation view illustrating the step, subsequent to the step of FIG. 37B, involved in a method of forming the semiconductor device shown in FIGS. 36A, 36B, 36C, 36D, 42 and 43, taken along a B-B' line of FIGS. 36A, 36B, 36C, 36D, 42 and 43. FIG. 38C is a fragmentary cross sectional elevation view illustrating the step, subsequent to the step of FIG. 37C, involved in a method of forming the semiconductor device shown in FIGS. 36A, 36B, 36C, 36D, 42 and 43, taken along a C-C' line of FIGS. 36A, 36B, 36C, 36D, 42 and 43. FIG. 38D is a fragmentary cross sectional elevation view illustrating the step, subsequent to the step of FIG. 37D, involved in a method of forming the semiconductor device shown in FIGS. 36A, 36B, 36C, 36D, 42 and 43, taken along a D-D' line of FIGS. 36A, 36B, 36C, 36D, 42 and 43.

As shown in FIGS. 38A through 38D, a nitride film is made to grow again, the first nitride film 3 is made to grow again, and a sidewall nitride film 36 is formed in a shape in which the top end covers the edge of the first nitride film 3.

Figure 39A:
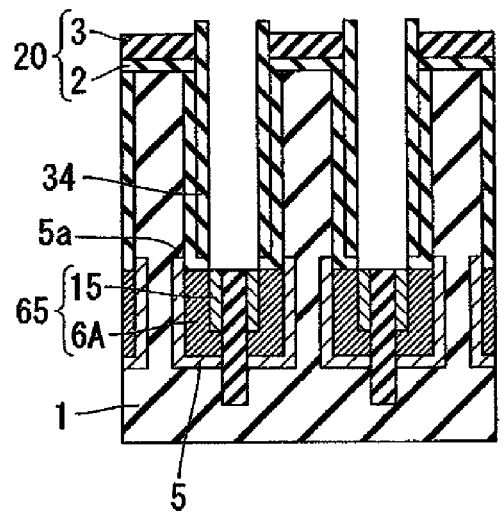
Figure 39B:
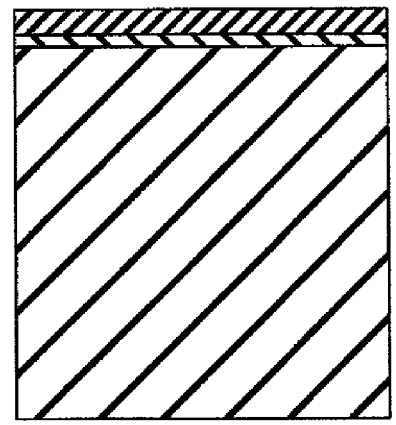
Figure 39C:
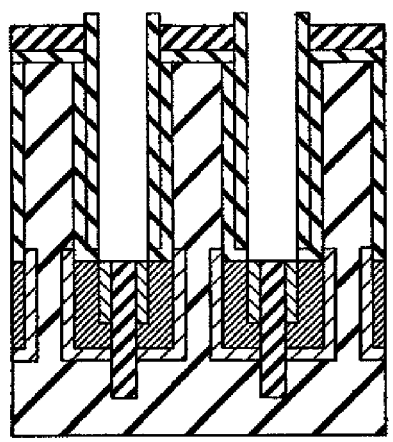
Figure 39D:
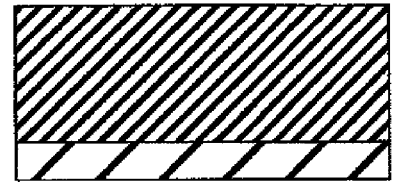

FIG. 39A is a fragmentary cross sectional elevation view illustrating a step, subsequent to the step of FIG. 38A, involved in a method of forming a semiconductor device shown in FIGS. 36A, 36B, 36C, 36D, 42 and 43, taken along an A-A' line of FIGS. 36A, 36B, 36C, 36D, 42 and 43. FIG. 39B is a fragmentary cross sectional elevation view illustrating the step, subsequent to the step of FIG. 38B, involved in a method of forming the semiconductor device shown in FIGS. 36A, 36B, 36C, 36D, 42 and 43, taken along a B-B' line of FIGS. 36A, 36B, 36C, 36D, 42 and 43. FIG. 39C is a fragmentary cross sectional elevation view illustrating the step, subsequent to the step of FIG. 38C, involved in a method of forming the semiconductor device shown in FIGS. 36A, 36B, 36C, 36D, 42 and 43, taken along a C-C' line of FIGS. 36A, 36B, 36C, 36D, 42 and 43. FIG. 39D is a fragmentary cross sectional elevation view illustrating the step, subsequent to the step of FIG. 38D, involved in a method of forming the semiconductor device shown in FIGS. 36A, 36B, 36C, 36D, 42 and 43, taken along a D-D' line of FIGS. 36A, 36B, 36C, 36D, 42 and 43.

Then, as shown in FIGS. 39A through 39D, the first nitride film 3 and the sidewall nitride film 36 are wet-etched again.

Figure 40A:
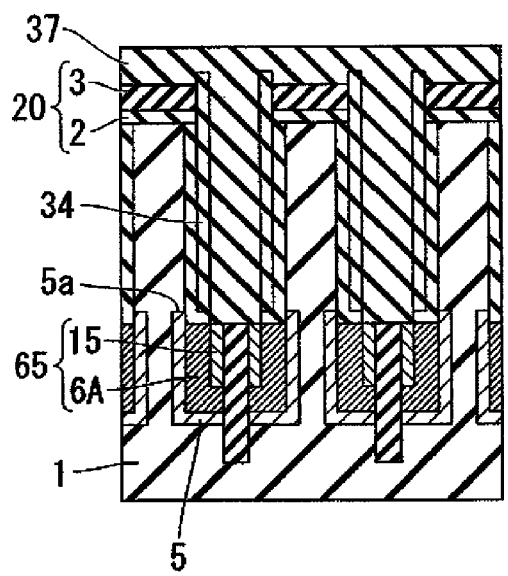
Figure 40B:
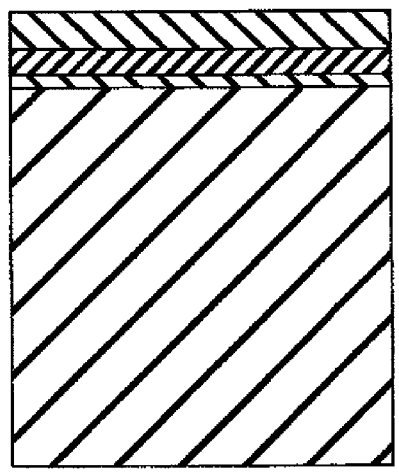
Figure 40C:
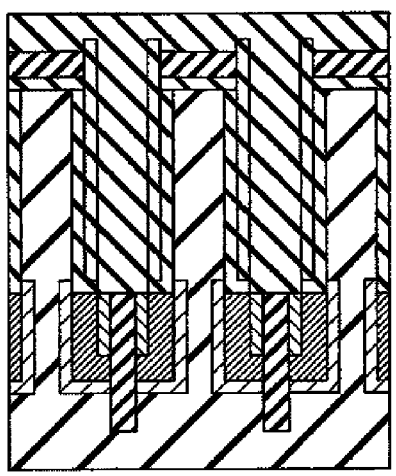
Figure 40D:
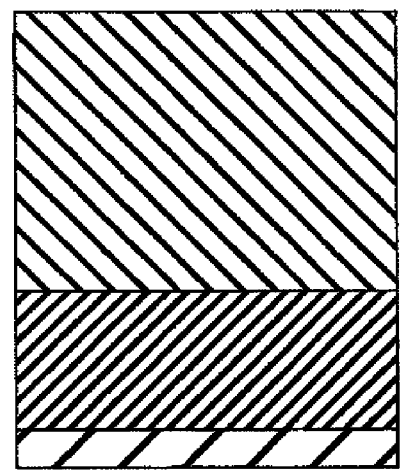

FIG. 40A is a fragmentary cross sectional elevation view illustrating a step, subsequent to the step of FIG. 39A, involved in a method of forming a semiconductor device shown in FIGS. 36A, 36B, 36C, 36D, 42 and 43, taken along an A-A' line of FIGS. 36A, 36B, 36C, 36D, 42 and 43. FIG. 40B is a fragmentary cross sectional elevation view illustrating the step, subsequent to the step of FIG. 39B, involved in a method of forming the semiconductor device shown in FIGS. 36A, 36B, 36C, 36D, 42 and 43, taken along a B-B' line of FIGS. 36A, 36B, 36C, 36D, 42 and 43. FIG. 40C is a fragmentary cross sectional elevation view illustrating the step, subsequent to the step of FIG. 39C, involved in a method of forming the semiconductor device shown in FIGS. 36A, 36B, 36C, 36D, 42 and 43, taken along a C-C' line of FIGS. 36A, 36B, 36C, 36D, 42 and 43. FIG. 40D is a fragmentary cross sectional elevation view illustrating the step, subsequent to the step of FIG. 39D, involved in a method of forming the semiconductor device shown in FIGS. 36A, 36B, 36C, 36D, 42 and 43, taken along a D-D' line of FIGS. 36A, 36B, 36C, 36D, 42 and 43.

As shown in FIGS. 40A through 40D, an interlayer film 37 is deposited.

Figure 41A:
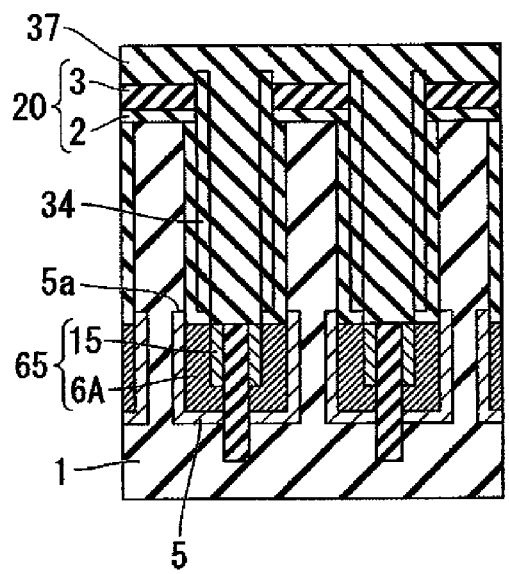
Figure 41B:
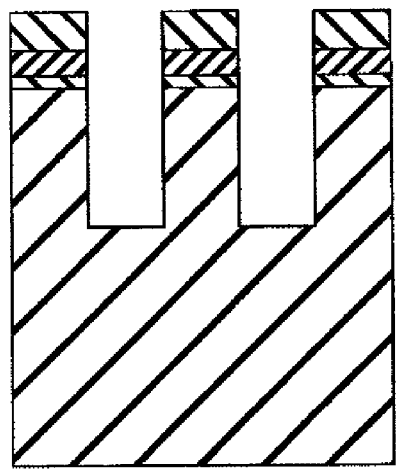
Figure 41C:
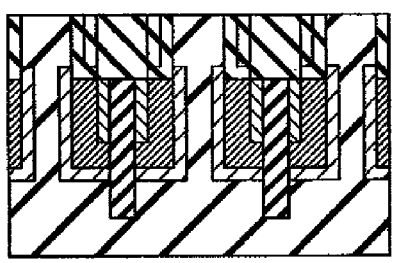
Figure 41D:
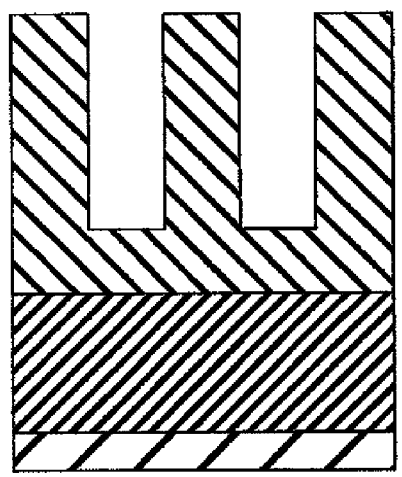

FIG. 41A is a fragmentary cross sectional elevation view illustrating a step, subsequent to the step of FIG. 40A, involved in a method of forming a semiconductor device shown in FIGS. 36A, 36B, 36C, 36D, 42 and 43, taken along an A-A' line of FIGS. 36A, 36B, 36C, 36D, 42 and 43. FIG. 41B is a fragmentary cross sectional elevation view illustrating the step, subsequent to the step of FIG. 40B, involved in a method of forming the semiconductor device shown in FIGS. 36A, 36B, 36C, 36D, 42 and 43, taken along a B-B' line of FIGS. 36A, 36B, 36C, 36D, 42 and 43. FIG. 41C is a fragmentary cross sectional elevation view illustrating the step, subsequent to the step of FIG. 40C, involved in a method of forming the semiconductor device shown in FIGS. 36A, 36B, 36C, 36D, 42 and 43, taken along a C-C' line of FIGS. 36A, 36B, 36C, 36D, 42 and 43. FIG. 41D is a fragmentary cross sectional elevation view illustrating the step, subsequent to the step of FIG. 40D, involved in a method of forming the semiconductor device shown in FIGS. 36A, 36B, 36C, 36D, 42 and 43, taken along a D-D' line of FIGS. 36A, 36B, 36C, 36D, 42 and 43.

As shown in FIGS. 41A through 41D, the interlayer film 37, the first nitride film 3, the first oxide film 2, and the silicon substrate 1 are dry-etched using the lithography method. In this flow of processes, since no nitride film exists in the side wall, it is not necessary to consider the selectivity of the nitride film at the time of dry-etching the silicon substrate 1 after etching the first nitride film 3, whereby the shaping is facilitated.

Sixth Embodiment

A semiconductor device according to a sixth embodiment of the invention will be described with reference to FIGS. 44 through 58D.

Figure 44:
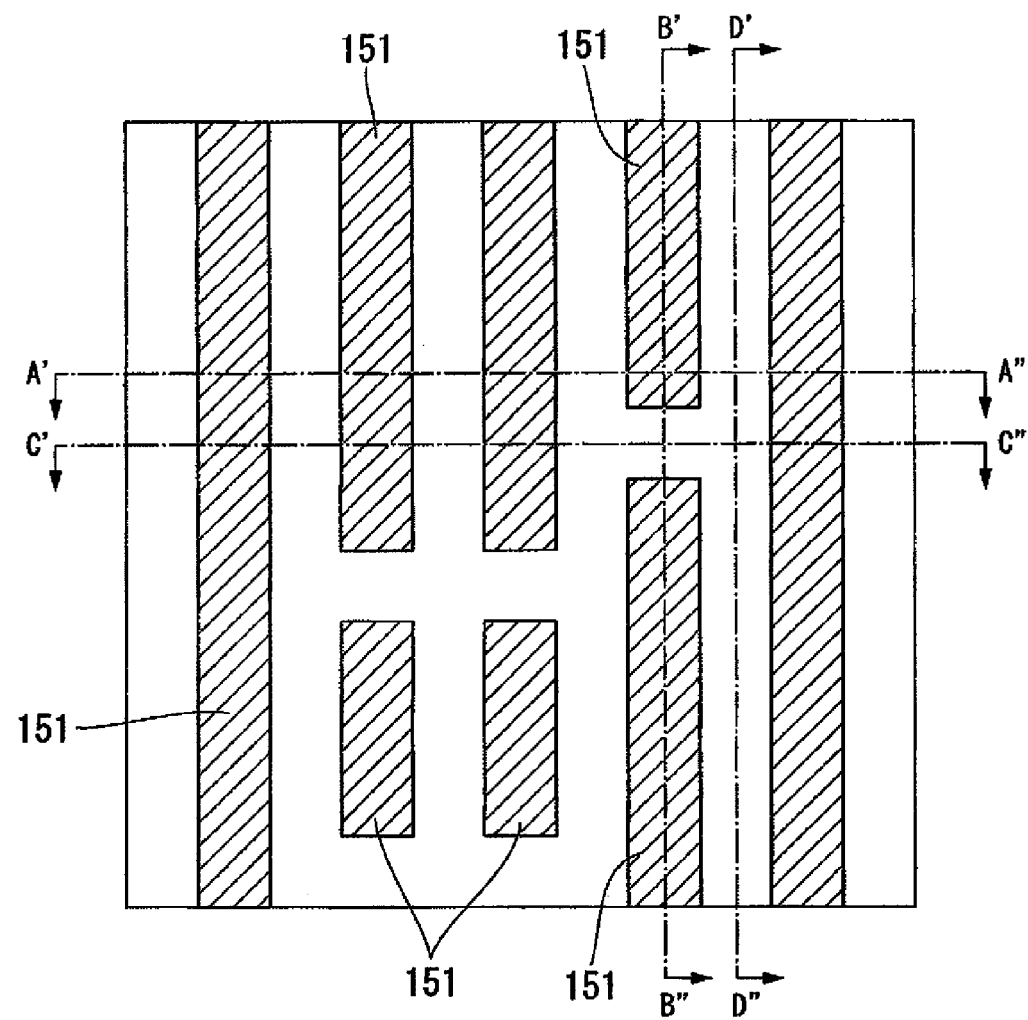
FIG. 44 is a fragmentary plan view illustrating a semiconductor device in accordance with a sixth embodiment of the present invention.

FIG. 44 is a fragmentary plan view illustrating a semiconductor device.

In the descriptions of the first to fifth embodiments, crosspoint type memory cells are assumed as the bit lines (embedded lines) and the word lines (gate lines). More generally, as shown in FIG. 44, the bit lines may be simply replaced with simple lines.

In the diagram shown in FIG. 44, the line patterns 151 are partially disconnected, but the line patterns may be formed in arbitrary shapes. Accordingly, the step shown in the diagram can be applied to arbitrary arrangements of patterns and arbitrary line patterns, as well as the simple arrangement of patterns such as memory cells.

Figure 45:
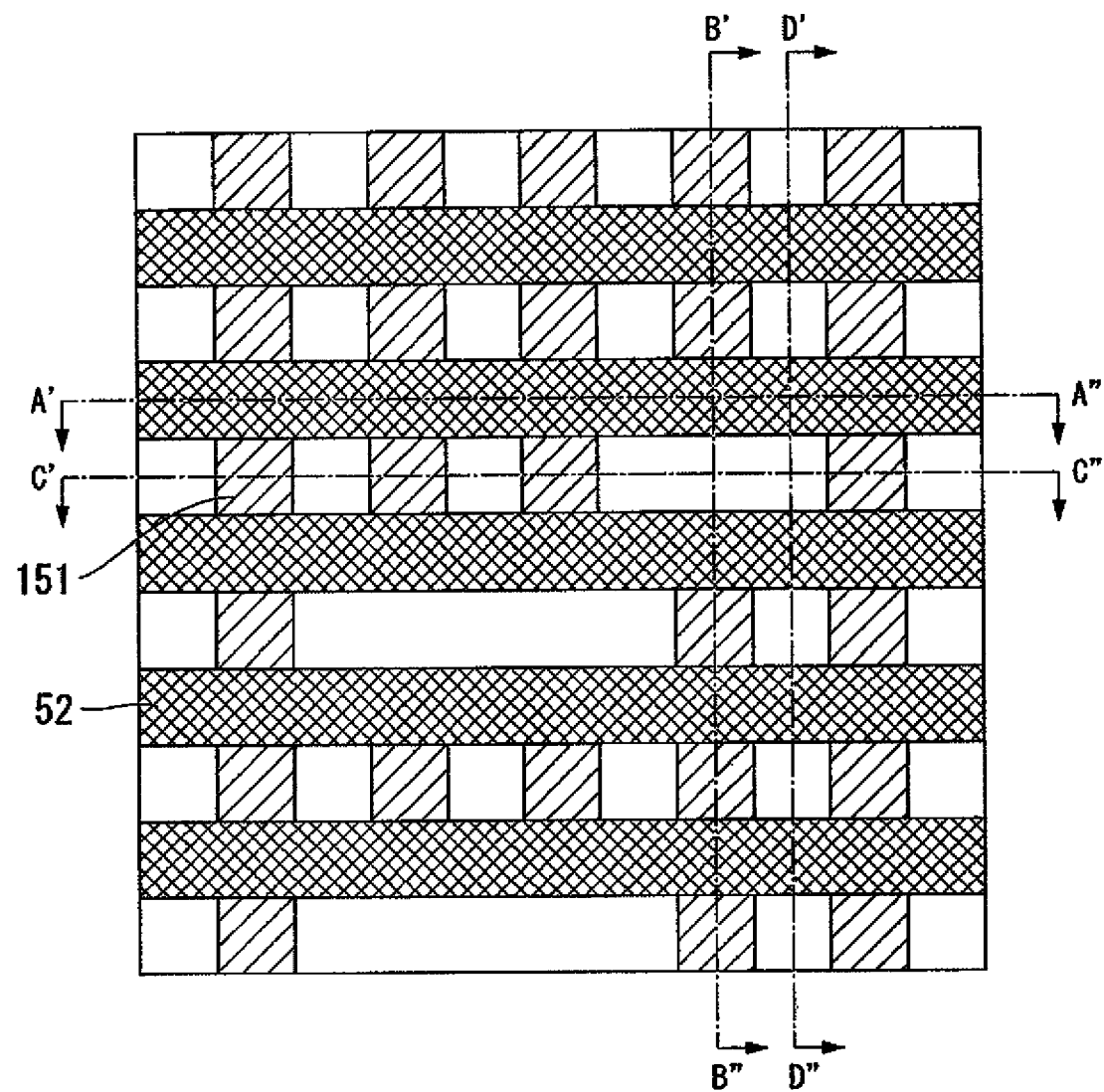
FIG. 45 is a fragmentary plan view illustrating a semiconductor device in accordance with the sixth embodiment of the present invention.
Figure 46:
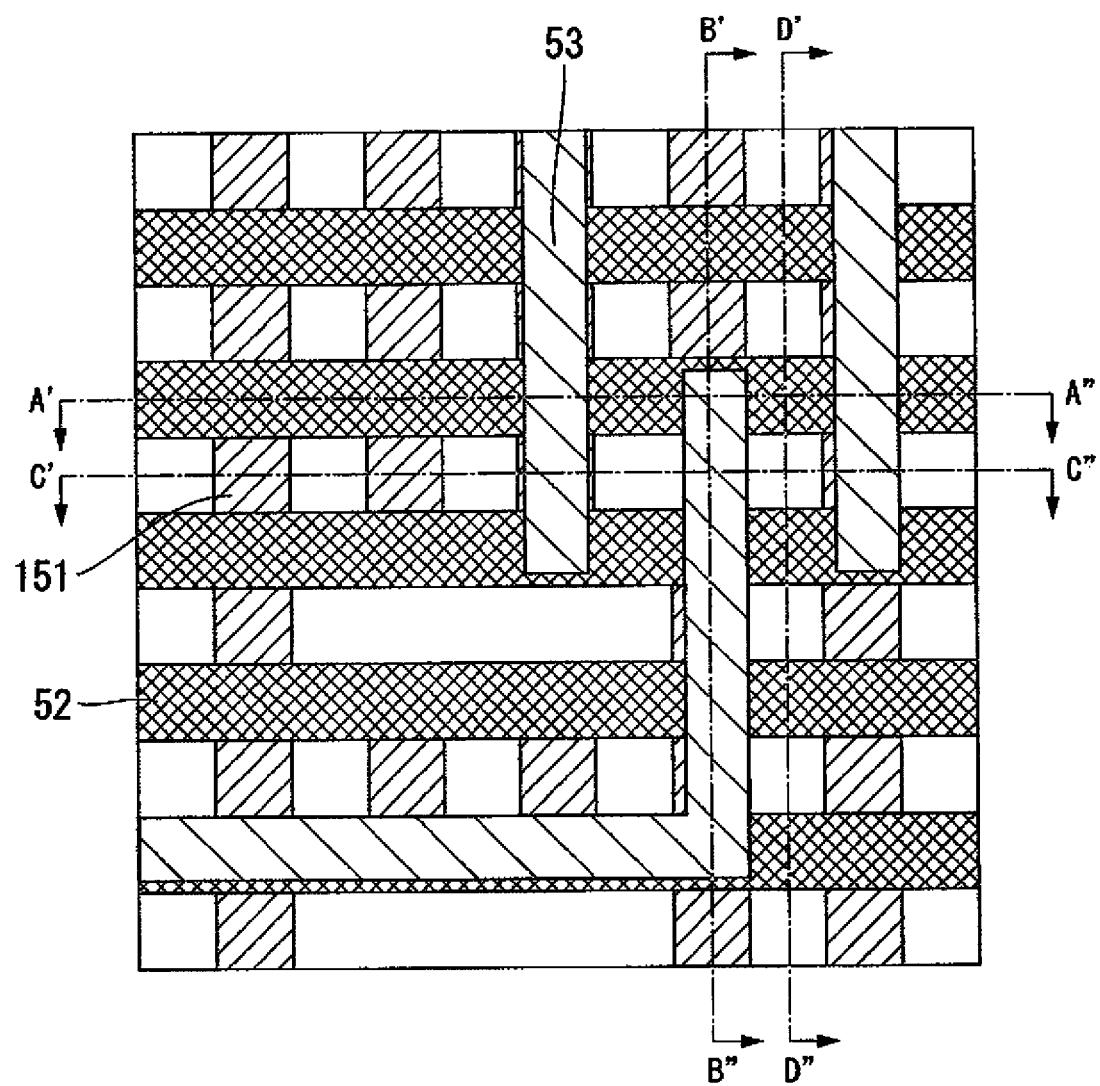
FIG. 46 is a fragmentary plan view illustrating a semiconductor device in accordance with the sixth embodiment of the present invention.
Figure 47A:
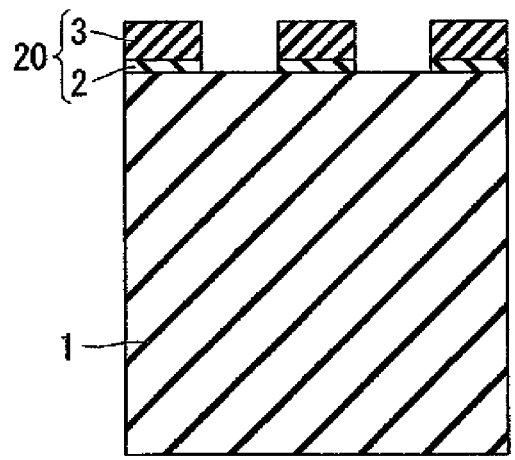
FIGS. 47A through 58D are fragmentary cross sectional elevation views illustrating a method of forming the semiconductor device shown in FIGS. 44, 45 and 46.
Figure 47B:
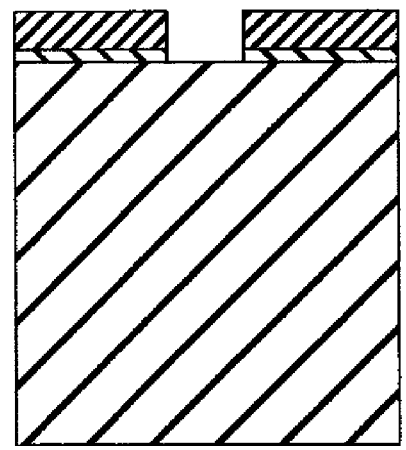
Figure 47C:
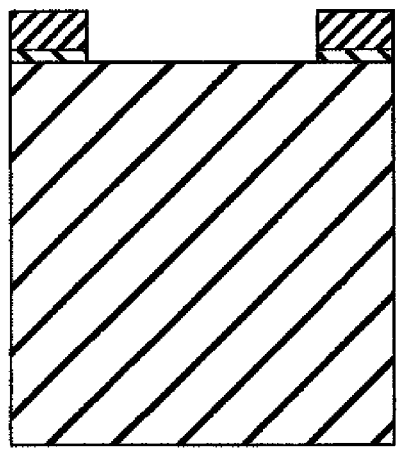

FIG. 45 is a fragmentary plan view illustrating a semiconductor device in which word lines 52 are superposed. FIG. 46 is a fragmentary plan view illustrating a semiconductor device in which line patterns 53 are superposed on the second diffusion layers. FIG. 47A is a fragmentary cross sectional elevation view illustrating a step involved in a method of forming the semiconductor device shown in FIGS. 44, 45 and 46, taken along an A-A' line of FIGS. 44, 45 and 46. FIG. 47B is a fragmentary cross sectional elevation view illustrating the step involved in the method of forming the semiconductor device shown in FIGS. 44, 45 and 46, taken along a B-B' line of FIGS. 44, 45 and 46. FIG. 47C is a fragmentary cross sectional elevation view illustrating the step involved in the method of forming the semiconductor device shown in FIGS. 44, 45 and 46, taken along a C-C' line of FIGS. 44, 45 and 46.

Figure 47D:
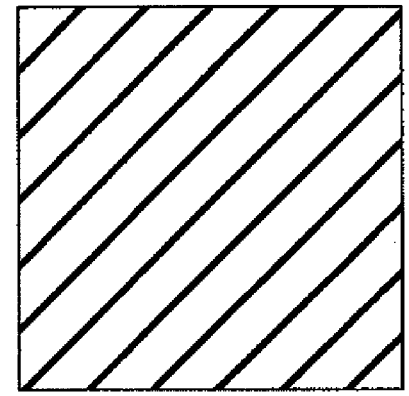

FIG. 47D is a fragmentary cross sectional elevation view illustrating the step involved in the method of forming the semiconductor device shown in FIGS. 44, 45 and 46, taken along a D-D' line of FIGS. 44, 45 and 46.

The flow (processes) is the same as the above-mentioned embodiments, and when the processing is performed with the patterns shown in FIGS. 44 through 46, the shapes shown in FIGS. 47A through 58 are obtained.

First, as shown in FIGS. 47A through 47D, the silicon substrate 1 is thermally oxidized to form the first oxide film 2 and the first nitride film 3 is formed using the CVD method. The line patterns 151 shown in FIG. 44 are patterned using the lithography method, the first nitride film 3 is dry-etched, and the first oxide film 2 is dry-etched again, whereby the shapes shown in the sectional views are obtained.

Figure 48A:
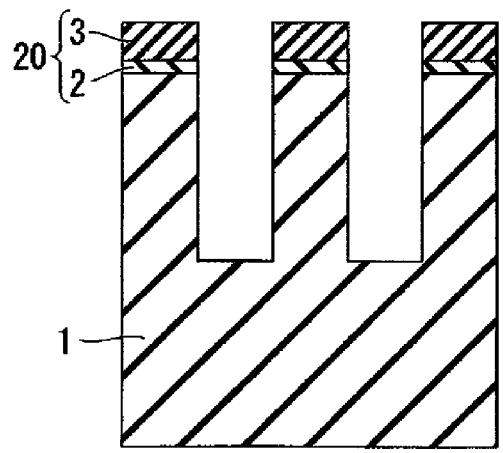
Figure 48B:
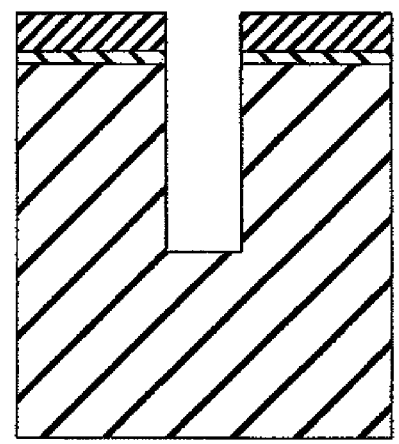
Figure 48C:
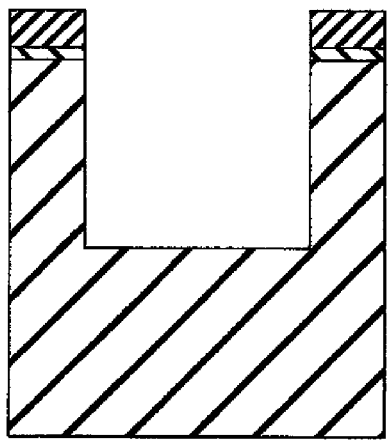
Figure 48D:
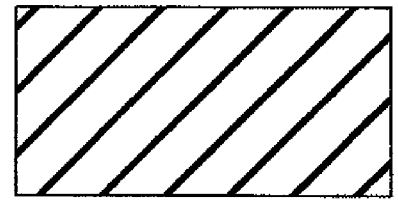
Figure 49A:
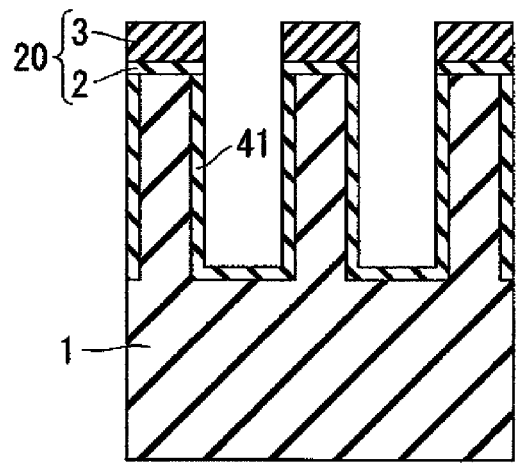
Figure 49B:
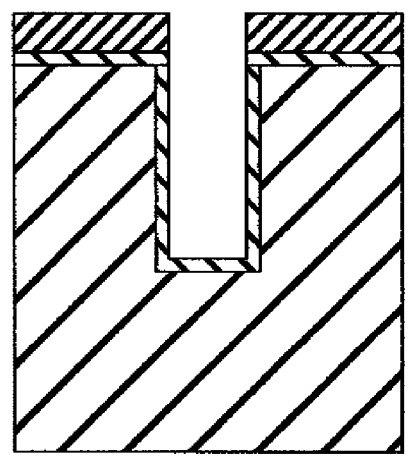
Figure 49C:
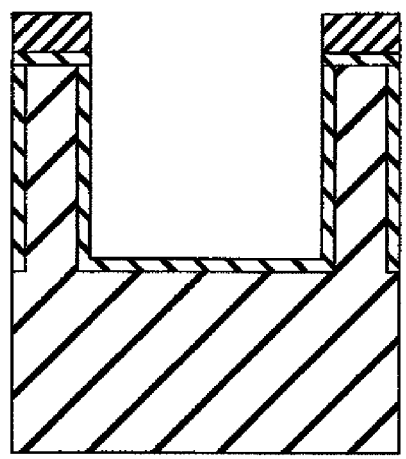
Figure 49D:
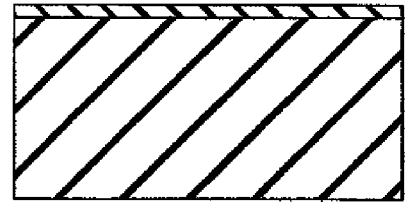

FIG. 48A is a fragmentary cross sectional elevation view illustrating a step, subsequent to the step of FIG. 47A, involved in a method of forming the semiconductor device shown in FIGS. 44, 45 and 46, taken along an A-A' line of FIGS. 44, 45 and 46. FIG. 48B is a fragmentary cross sectional elevation view illustrating the step, subsequent to the step of FIG. 47B, involved in the method of forming the semiconductor device shown in FIGS. 44, 45 and 46, taken along a B-B' line of FIGS. 44, 45 and 46. FIG. 48C is a fragmentary cross sectional elevation view illustrating the step, subsequent to the step of FIG. 47C, involved in the method of forming the semiconductor device shown in FIGS. 44, 45 and 46, taken along a C-C' line of FIGS. 44, 45 and 46. FIG. 48D is a fragmentary cross sectional elevation view illustrating the step, subsequent to the step of FIG. 47D, involved in the method of forming the semiconductor device shown in FIGS. 44, 45 and 46, taken along a D-D' line of FIGS. 44, 45 and 46. FIG. 49A is a fragmentary cross sectional elevation view illustrating a step, subsequent to the step of FIG. 48A, involved in a method of forming the semiconductor device shown in FIGS. 44, 45 and 46, taken along an A-A' line of FIGS. 44, 45 and 46. FIG. 49B is a fragmentary cross sectional elevation view illustrating the step, subsequent to the step of FIG. 48B, involved in the method of forming the semiconductor device shown in FIGS. 44, 45 and 46, taken along a B-B' line of FIGS. 44, 45 and 46. FIG. 49C is a fragmentary cross sectional elevation view illustrating the step, subsequent to the step of FIG. 48C, involved in the method of forming the semiconductor device shown in FIGS. 44, 45 and 46, taken along a C-C' line of FIGS. 44, 45 and 46. FIG. 49D is a fragmentary cross sectional elevation view illustrating the step, subsequent to the step of FIG. 48D, involved in the method of forming the semiconductor device shown in FIGS. 44, 45 and 46, taken along a D-D' line of FIGS. 44, 45 and 46.

The silicon substrate 1 is dry-etched as shown in FIGS. 48A through 48D and is subjected to the thermal oxidation process as shown in FIGS. 49A through 49D to form the second oxide film 41.

Figure 50A:
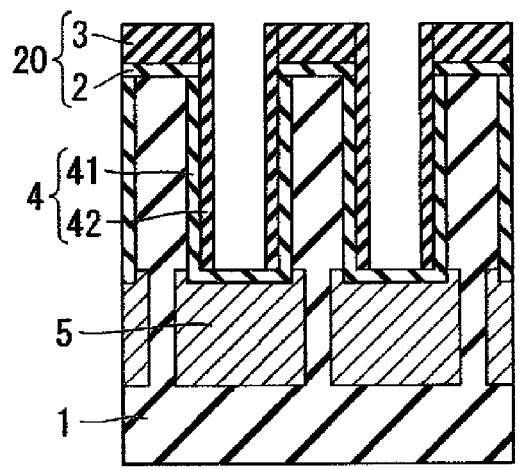
Figure 50B:
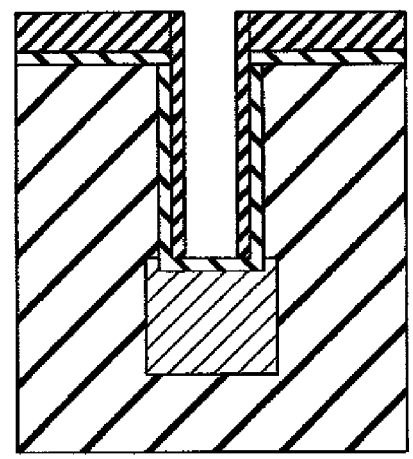
Figure 50C:
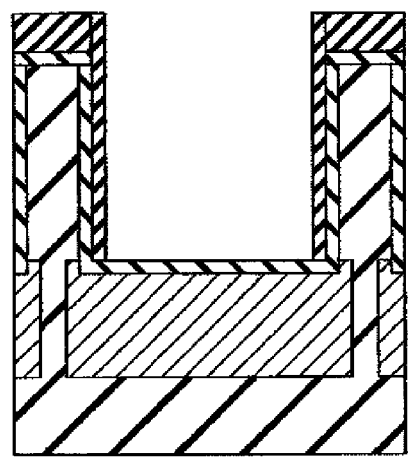
Figure 50D:
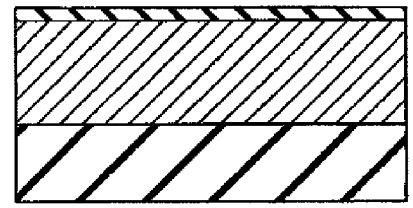

FIG. 50A is a fragmentary cross sectional elevation view illustrating a step, subsequent to the step of FIG. 49A, involved in a method of forming the semiconductor device shown in FIGS. 44, 45 and 46, taken along an A-A' line of FIGS. 44, 45 and 46. FIG. 50B is a fragmentary cross sectional elevation view illustrating the step, subsequent to the step of FIG. 49B, involved in the method of forming the semiconductor device shown in FIGS. 44, 45 and 46, taken along a B-B' line of FIGS. 44, 45 and 46. FIG. 50C is a fragmentary cross sectional elevation view illustrating the step, subsequent to the step of FIG. 49C, involved in the method of forming the semiconductor device shown in FIGS. 44, 45 and 46, taken along a C-C' line of FIGS. 44, 45 and 46. FIG. 50D is a fragmentary cross sectional elevation view illustrating the step, subsequent to the step of FIG. 49D, involved in the method of forming the semiconductor device shown in FIGS. 44, 45 and 46, taken along a D-D' line of FIGS. 44, 45 and 46.

Then, as shown in FIGS. 50A through 50D, the gate insulating film 4 is formed by forming the second nitride film 42 using the CVD method, the third diffusion layer 5 is formed by performing the impurity implantation process, and then the second nitride film 41 is etched back into a side well.

Figure 51A:
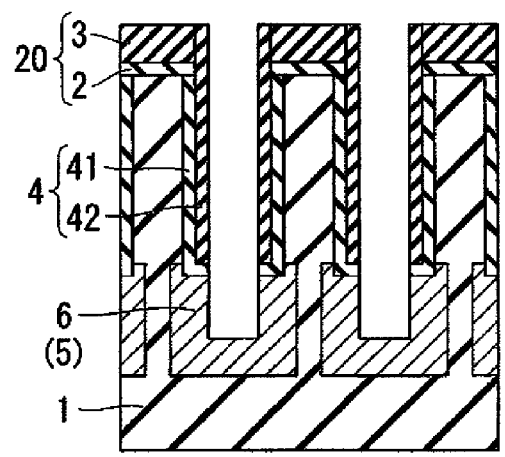
Figure 51B:
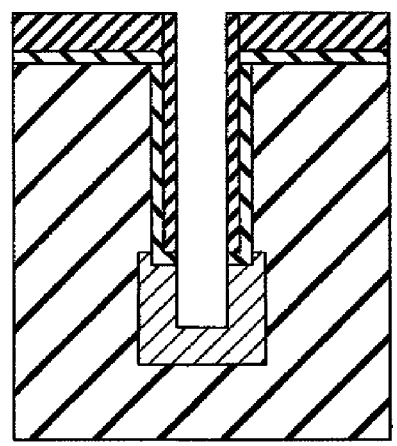
Figure 51C:
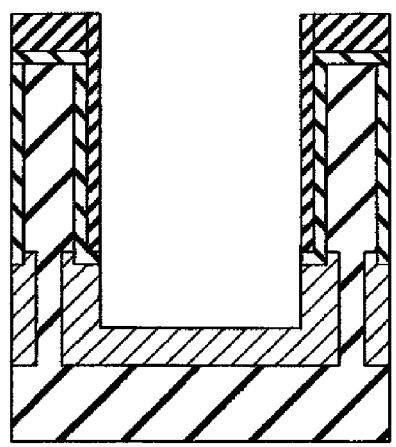
Figure 51D:
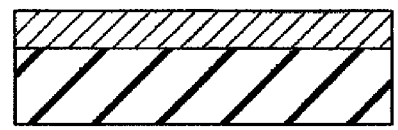

FIG. 51A is a fragmentary cross sectional elevation view illustrating a step, subsequent to the step of FIG. 50A, involved in a method of forming the semiconductor device shown in FIGS. 44, 45 and 46, taken along an A-A' line of FIGS. 44, 45 and 46. FIG. 51B is a fragmentary cross sectional elevation view illustrating the step, subsequent to the step of FIG. 50B, involved in the method of forming the semiconductor device shown in FIGS. 44, 45 and 46, taken along a B-B' line of FIGS. 44, 45 and 46. FIG. 51C is a fragmentary cross sectional elevation view illustrating the step, subsequent to the step of FIG. 50C, involved in the method of forming the semiconductor device shown in FIGS. 44, 45 and 46, taken along a C-C' line of FIGS. 44, 45 and 46. FIG. 51D is a fragmentary cross sectional elevation view illustrating the step, subsequent to the step of FIG. 50D, involved in the method of forming the semiconductor device shown in FIGS. 44, 45 and 46, taken along a D-D' line of FIGS. 44, 45 and 46.

Then, as shown in FIGS. 51A through 51D, the oxide film in the first trench is dry-etched and the third diffusion layer 5 is dry-etched. Then, the third diffusion layer 5 is subjected to the silicide reaction using the same method as the above-mentioned embodiments to form the bit line (embedded line) 6 formed of a silicide layer.

Figure 52A:
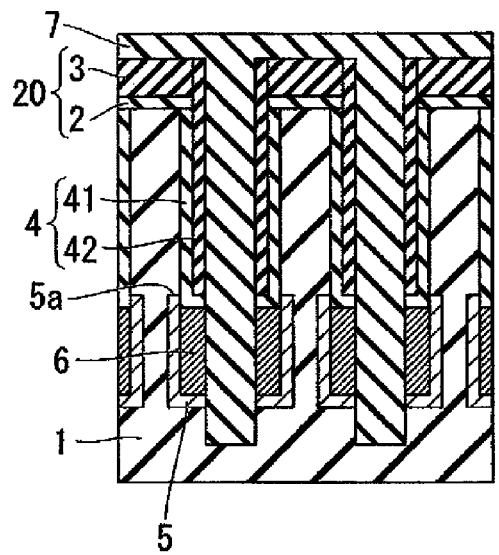
Figure 52B:
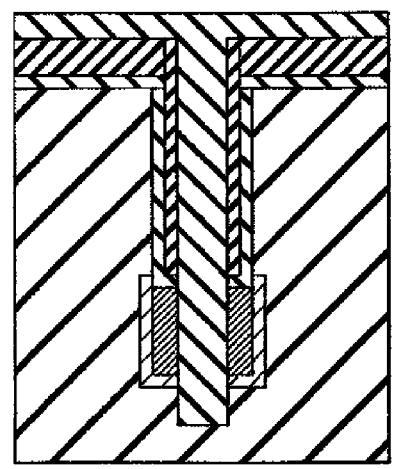
Figure 52C:
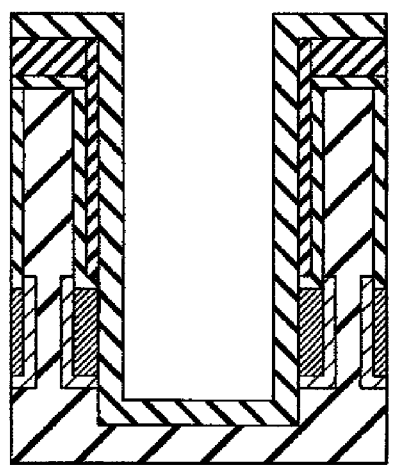
Figure 52D:
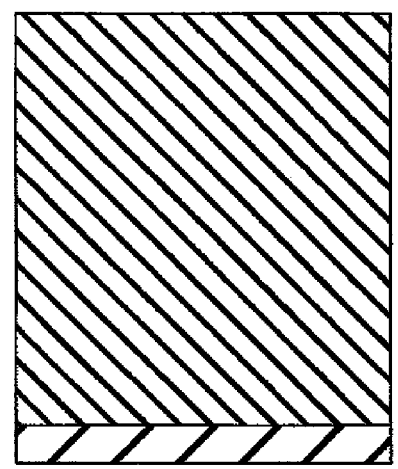

FIG. 52A is a fragmentary cross sectional elevation view illustrating a step, subsequent to the step of FIG. 51A, involved in a method of forming the semiconductor device shown in FIGS. 44, 45 and 46, taken along an A-A' line of FIGS. 44, 45 and 46. FIG. 52B is a fragmentary cross sectional elevation view illustrating the step, subsequent to the step of FIG. 51B, involved in the method of forming the semiconductor device shown in FIGS. 44, 45 and 46, taken along a B-B' line of FIGS. 44, 45 and 46. FIG. 52C is a fragmentary cross sectional elevation view illustrating the step, subsequent to the step of FIG. 51C, involved in the method of forming the semiconductor device shown in FIGS. 44, 45 and 46, taken along a C-C' line of FIGS. 44, 45 and 46. FIG. 52D is a fragmentary cross sectional elevation view illustrating the step, subsequent to the step of FIG. 51D, involved in the method of forming the semiconductor device shown in FIGS. 44, 45 and 46, taken along a D-D' line of FIGS. 44, 45 and 46.

As shown in FIGS. 52A through 52D, the bit line 6 is dry-etched, the silicon substrate 1 is then dry-etched, and the interlayer insulating film 7 is deposited again. As shown in the drawings, when the embedded line patterns are arbitrary, a wide and open space exists which does not exist when the lines are formed in lines and spaces and an area exists which is hardly filled only by the growth of the oxide film using the CVD method. The wide patterns are filled with the interlayer film 100, but the interlayer spaces need not be filled by two steps as described in the above-mentioned embodiments and the interlay film may be formed by a film forming process at a time.

Figure 53A:
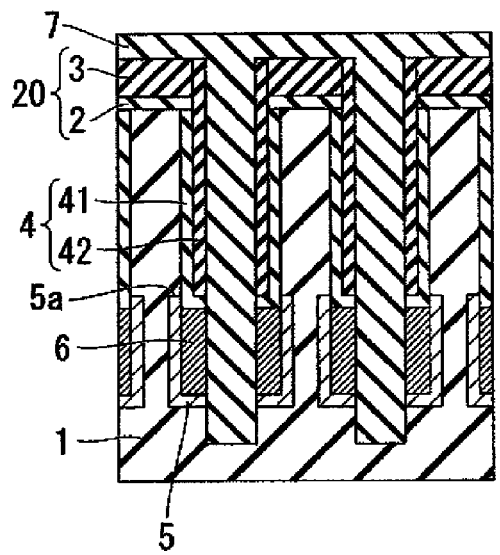
Figure 53B:
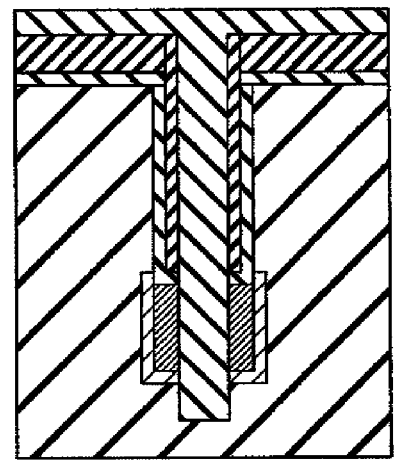
Figure 53C:
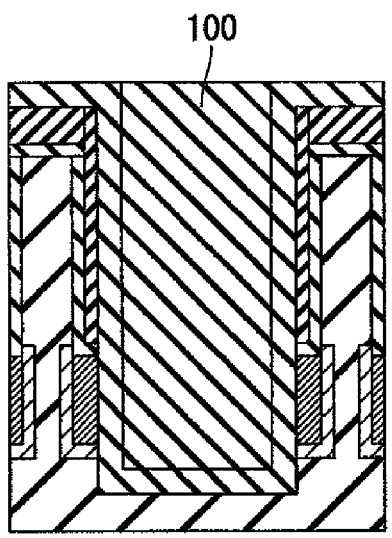
Figure 53D:
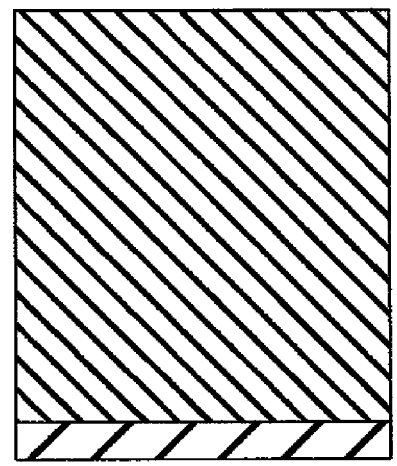

FIG. 53A is a fragmentary cross sectional elevation view illustrating a step, subsequent to the step of FIG. 52A, involved in a method of forming the semiconductor device shown in FIGS. 44, 45 and 46, taken along an A-A' line of FIGS. 44, 45 and 46. FIG. 53B is a fragmentary cross sectional elevation view illustrating the step, subsequent to the step of FIG. 52B, involved in the method of forming the semiconductor device shown in FIGS. 44, 45 and 46, taken along a B-B' line of FIGS. 44, 45 and 46. FIG. 53C is a fragmentary cross sectional elevation view illustrating the step, subsequent to the step of FIG. 52C, involved in the method of forming the semiconductor device shown in FIGS. 44, 45 and 46, taken along a C-C' line of FIGS. 44, 45 and 46. FIG. 53D is a fragmentary cross sectional elevation view illustrating the step, subsequent to the step of FIG. 52D, involved in the method of forming the semiconductor device shown in FIGS. 44, 45 and 46, taken along a D-D' line of FIGS. 44, 45 and 46.

Then, as shown in FIGS. 53A through 53D, the CMP process is performed to planarized the oxide film and the oxide film is deposited again.

Figure 54A:
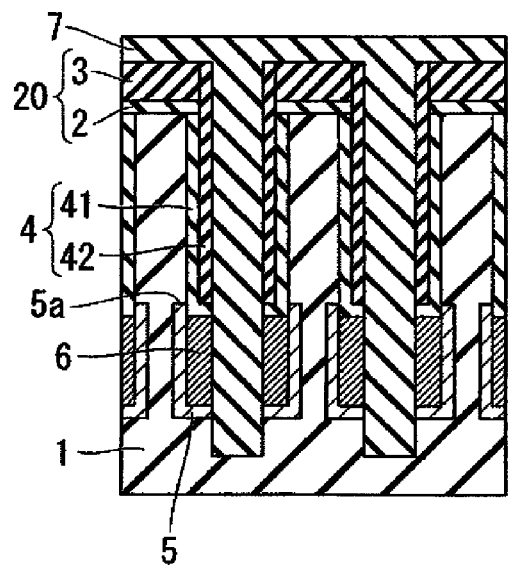
Figure 54B:
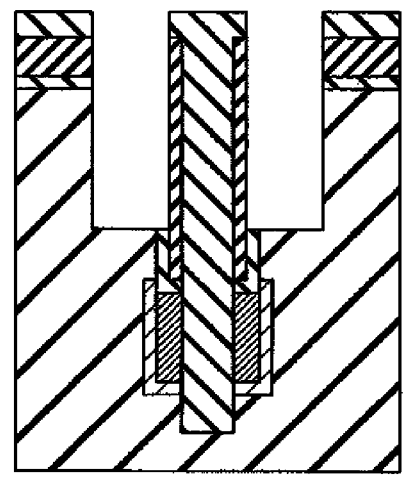
Figure 54C:
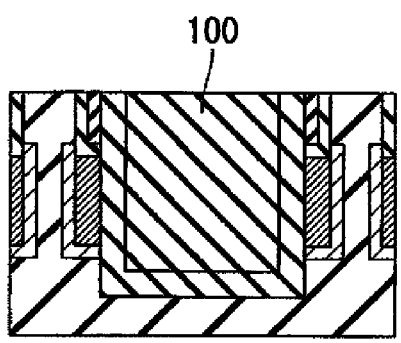
Figure 54D:
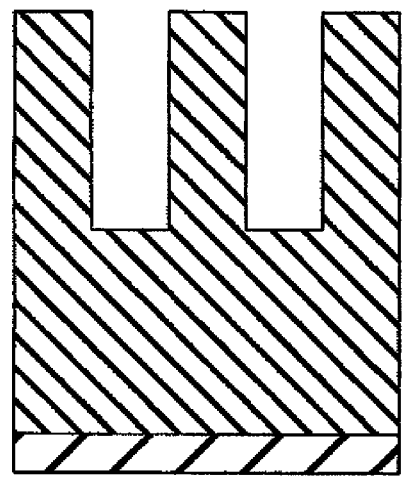

FIG. 54A is a fragmentary cross sectional elevation view illustrating a step, subsequent to the step of FIG. 53A, involved in a method of forming the semiconductor device shown in FIGS. 44, 45 and 46, taken along an A-A' line of FIGS. 44, 45 and 46. FIG. 54B is a fragmentary cross sectional elevation view illustrating the step, subsequent to the step of FIG. 53B, involved in the method of forming the semiconductor device shown in FIGS. 44, 45 and 46, taken along a B-B' line of FIGS. 44, 45 and 46. FIG. 54C is a fragmentary cross sectional elevation view illustrating the step, subsequent to the step of FIG. 53C, involved in the method of forming the semiconductor device shown in FIGS. 44, 45 and 46, taken along a C-C' line of FIGS. 44, 45 and 46. FIG. 54D is a fragmentary cross sectional elevation view illustrating the step, subsequent to the step of FIG. 53D, involved in the method of forming the semiconductor device shown in FIGS. 44, 45 and 46, taken along a D-D' line of FIGS. 44, 45 and 46.

As shown in FIGS. 54A through 54D, the word line (gate line) is patterned using the lithography and the interlayer insulating film 7, the first nitride film 3, the first oxide film 2, and the silicon substrate are sequentially dry-etched.

Figure 55A:
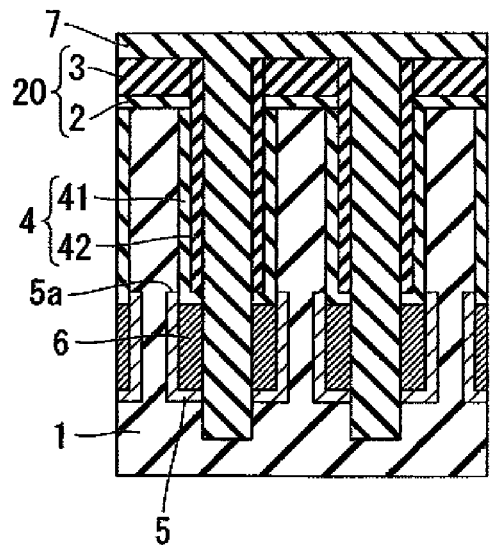
Figure 55B:
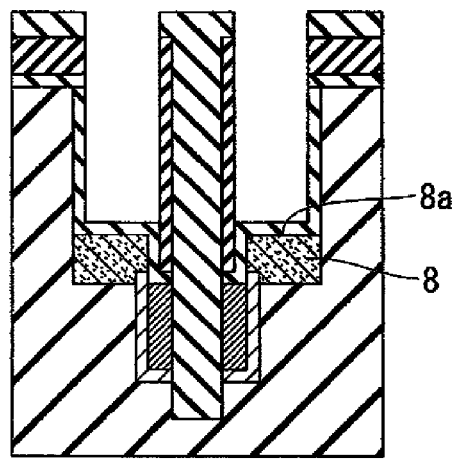
Figure 55C:
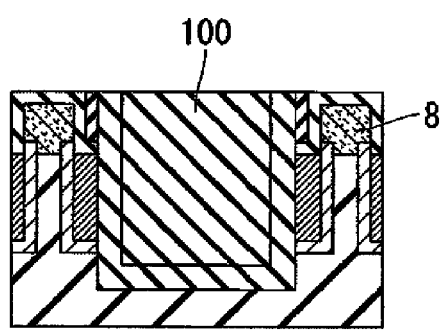
Figure 55D:
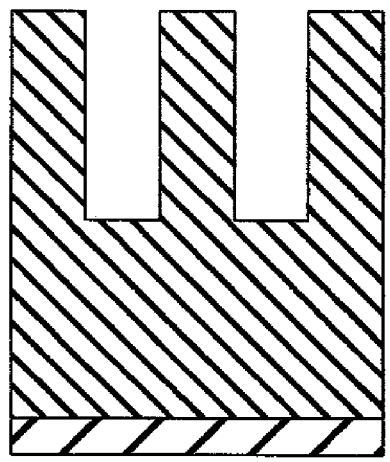

FIG. 55A is a fragmentary cross sectional elevation view illustrating a step, subsequent to the step of FIG. 54A, involved in a method of forming the semiconductor device shown in FIGS. 44, 45 and 46, taken along an A-A' line of FIGS. 44, 45 and 46. FIG. 55B is a fragmentary cross sectional elevation view illustrating the step, subsequent to the step of FIG. 54B, involved in the method of forming the semiconductor device shown in FIGS. 44, 45 and 46, taken along a B-B' line of FIGS. 44, 45 and 46. FIG. 55C is a fragmentary cross sectional elevation view illustrating the step, subsequent to the step of FIG. 54C, involved in the method of forming the semiconductor device shown in FIGS. 44, 45 and 46, taken along a C-C' line of FIGS. 44, 45 and 46. FIG. 55D is a fragmentary cross sectional elevation view illustrating the step, subsequent to the step of FIG. 54D, involved in the method of forming the semiconductor device shown in FIGS. 44, 45 and 46, taken along a D-D' line of FIGS. 44, 45 and 46.

As shown in FIGS. 55A to 55D, the thermal oxidation process is performed and the impurity implantation process is performed.

Figure 56A:
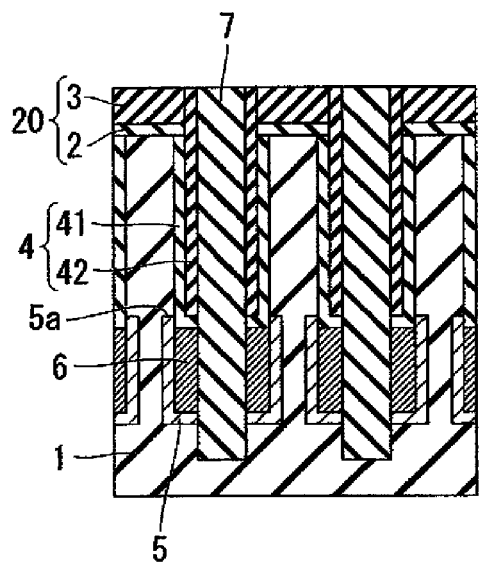
Figure 56B:
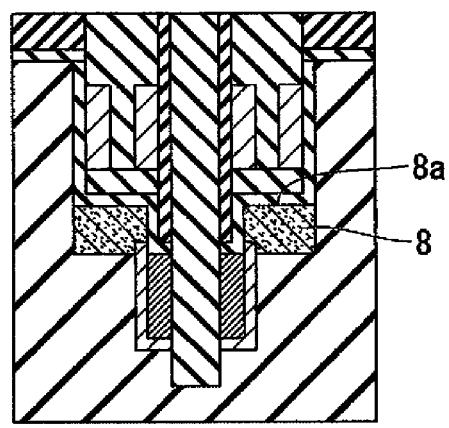
Figure 56C:
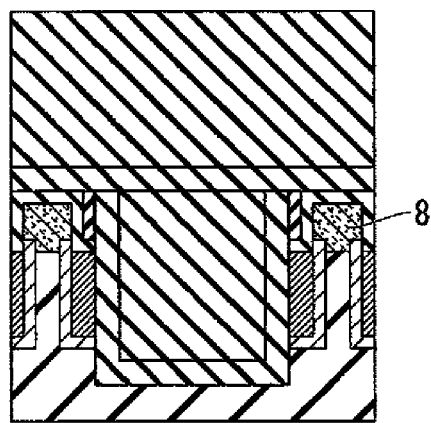
Figure 56D:
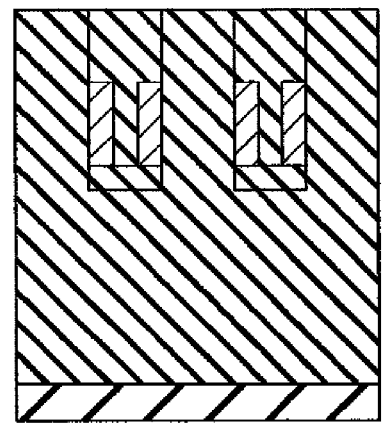

FIG. 56A is a fragmentary cross sectional elevation view illustrating a step, subsequent to the step of FIG. 55A, involved in a method of forming the semiconductor device shown in FIGS. 44, 45 and 46, taken along an A-A' line of FIGS. 44, 45 and 46. FIG. 56B is a fragmentary cross sectional elevation view illustrating the step, subsequent to the step of FIG. 55B, involved in the method of forming the semiconductor device shown in FIGS. 44, 45 and 46, taken along a B-B' line of FIGS. 44, 45 and 46. FIG. 56C is a fragmentary cross sectional elevation view illustrating the step, subsequent to the step of FIG. 55C, involved in the method of forming the semiconductor device shown in FIGS. 44, 45 and 46, taken along a C-C' line of FIGS. 44, 45 and 46. FIG. 56D is a fragmentary cross sectional elevation view illustrating the step, subsequent to the step of FIG. 55D, involved in the method of forming the semiconductor device shown in FIGS. 44, 45 and 46, taken along a D-D' line of FIGS. 44, 45 and 46.

As shown in FIGS. 56A through 56D, the gate material is deposited, is planarized using the CMP method, is patterned and divided using the lithography method. Then, the interlayer film is deposited and is planarized using the CMP method. At this time, the gate material may be formed as the sidewalls in the trench and may be etched back.

Figure 57A:
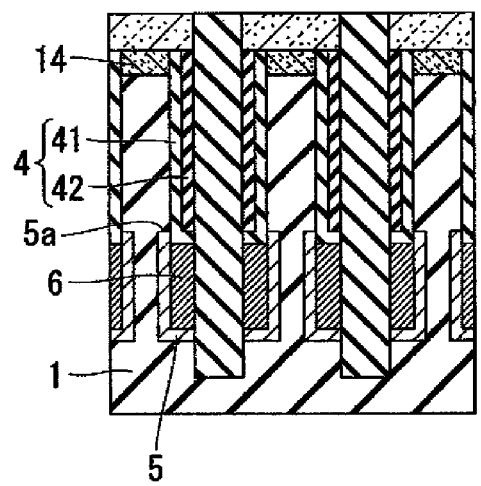
Figure 57B:
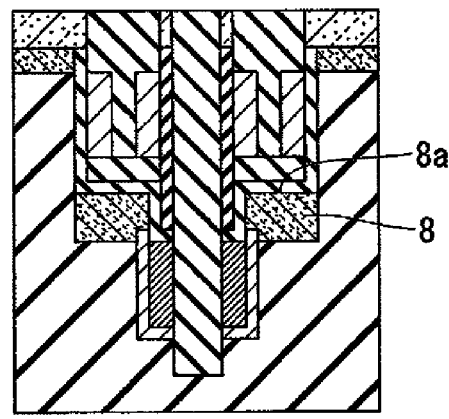
Figure 57C:
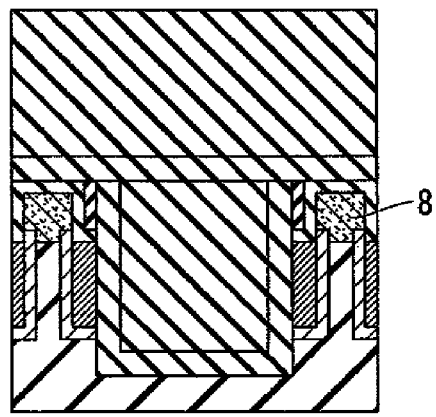
Figure 57D:
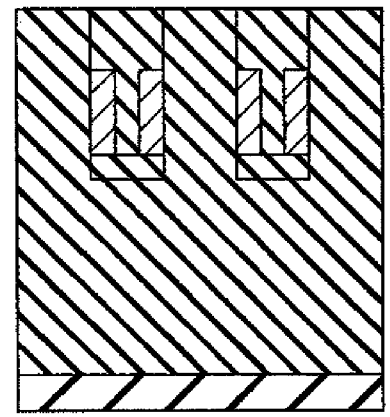

FIG. 57A is a fragmentary cross sectional elevation view illustrating a step, subsequent to the step of FIG. 56A, involved in a method of forming the semiconductor device shown in FIGS. 44, 45 and 46, taken along an A-A' line of FIGS. 44, 45 and 46. FIG. 57B is a fragmentary cross sectional elevation view illustrating the step, subsequent to the step of FIG. 56B, involved in the method of forming the semiconductor device shown in FIGS. 44, 45 and 46, taken along a B-B' line of FIGS. 44, 45 and 46. FIG. 57C is a fragmentary cross sectional elevation view illustrating the step, subsequent to the step of FIG. 56C, involved in the method of forming the semiconductor device shown in FIGS. 44, 45 and 46, taken along a C-C' line of FIGS. 44, 45 and 46. FIG. 57D is a fragmentary cross sectional elevation view illustrating the step, subsequent to the step of FIG. 56D, involved in the method of forming the semiconductor device shown in FIGS. 44, 45 and 46, taken along a D-D' line of FIGS. 44, 45 and 46.

As shown in FIGS. 57A through 57D, the nitride film is wet-etched and is subjected to an impurity implantation process to form the second diffusion layer, an oxide film is dry-etched, a contact material is deposited on the second diffusion layer and is then planarized using the CMP method.

Figure 58A:
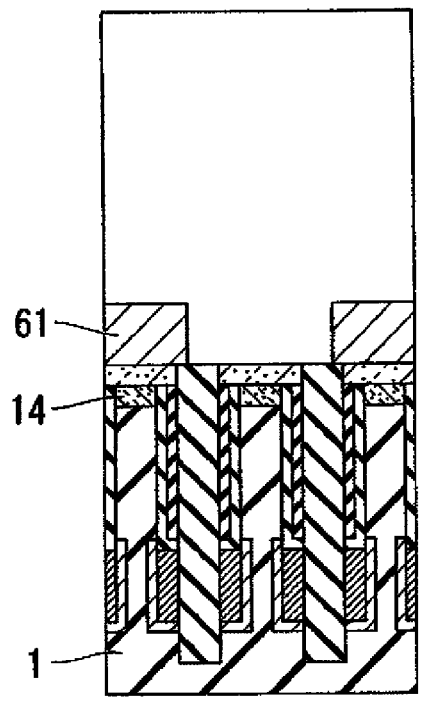
Figure 58B:
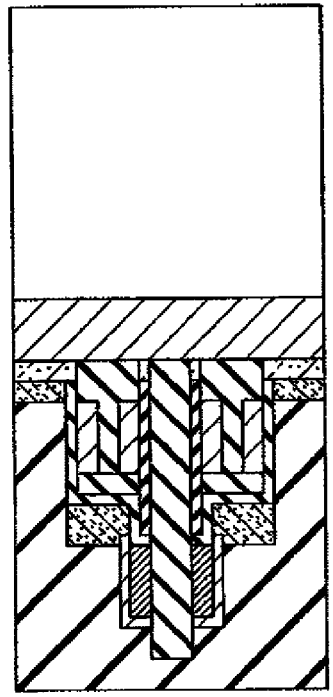
Figure 58C:
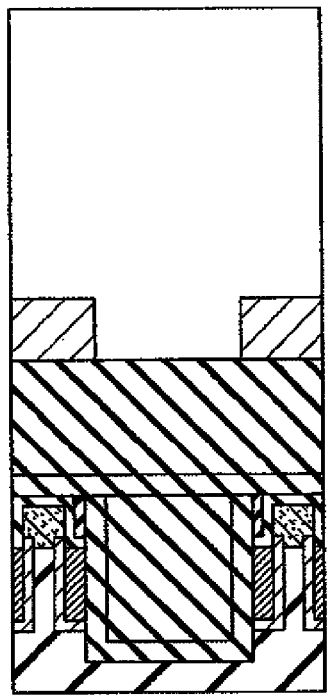
Figure 58D:
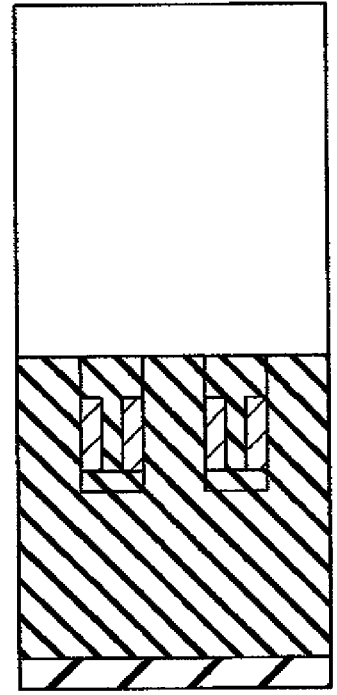

FIG. 58A is a fragmentary cross sectional elevation view illustrating a step, subsequent to the step of FIG. 57A, involved in a method of forming the semiconductor device shown in FIGS. 44, 45 and 46, taken along an A-A' line of FIGS. 44, 45 and 46. FIG. 58B is a fragmentary cross sectional elevation view illustrating the step, subsequent to the step of FIG. 57B, involved in the method of forming the semiconductor device shown in FIGS. 44, 45 and 46, taken along a B-B' line of FIGS. 44, 45 and 46. FIG. 58C is a fragmentary cross sectional elevation view illustrating the step, subsequent to the step of FIG. 57C, involved in the method of forming the semiconductor device shown in FIGS. 44, 45 and 46, taken along a C-C' line of FIGS. 44, 45 and 46. FIG. 58D is a fragmentary cross sectional elevation view illustrating the step, subsequent to the step of FIG. 57D, involved in the method of forming the semiconductor device shown in FIGS. 44, 45 and 46, taken along a D-D' line of FIGS. 44, 45 and 46.

Thereafter, a capacitor may be formed on the contact, but since the line pattern is arbitrary, the line 61 may be formed to come in contact with the top surface of the contact on the second diffusion layer as shown in FIGS. 58A through 58D.

Other Embodiments

Other embodiments of the invention will be described with reference to FIGS. 59 through 63D.

Figure 59:
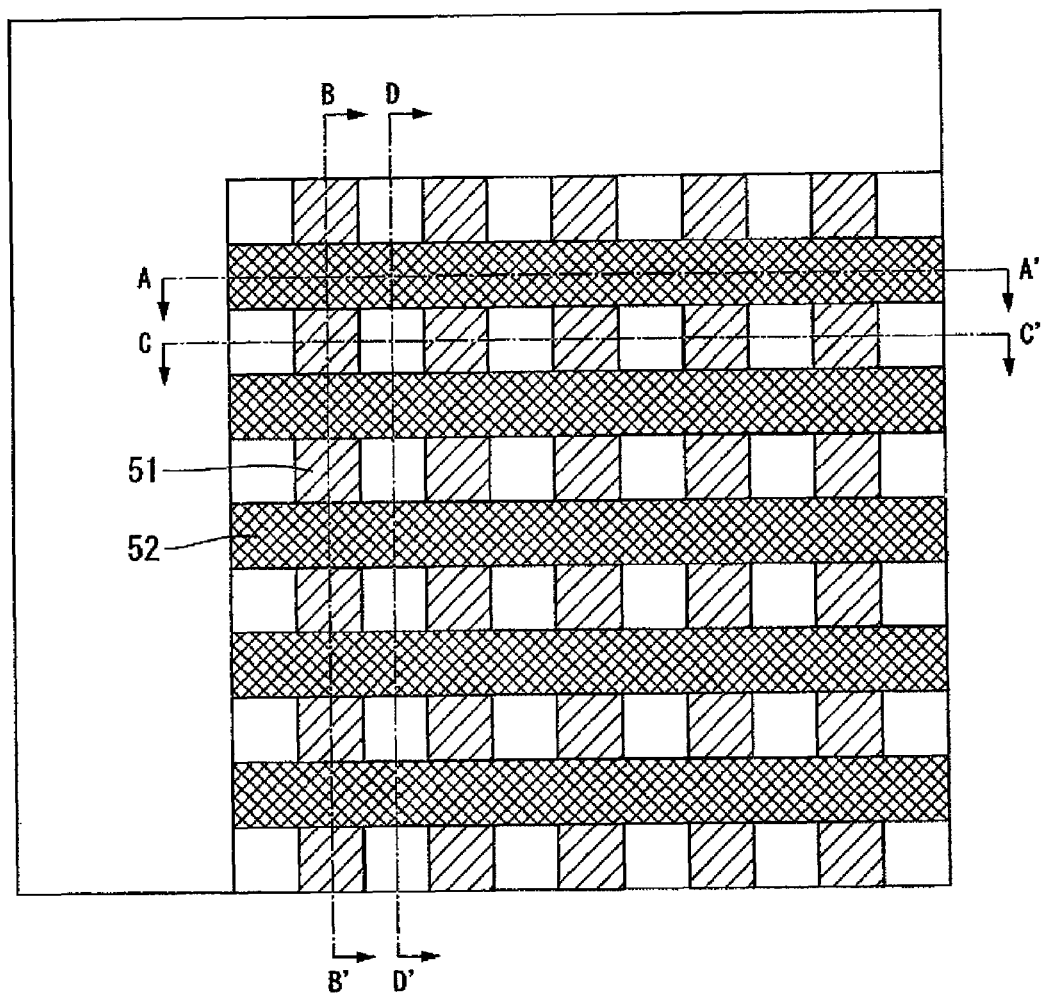
FIG. 59 is a fragmentary plan view illustrating a semiconductor device in accordance with modified embodiments of the present invention.

FIG. 59 is a fragmentary plan view illustrating a semiconductor device.

In the semiconductor device according to the invention, cell edges of the memory cells may be formed in a simple pattern as shown in FIG. 59.

Figure 60A:
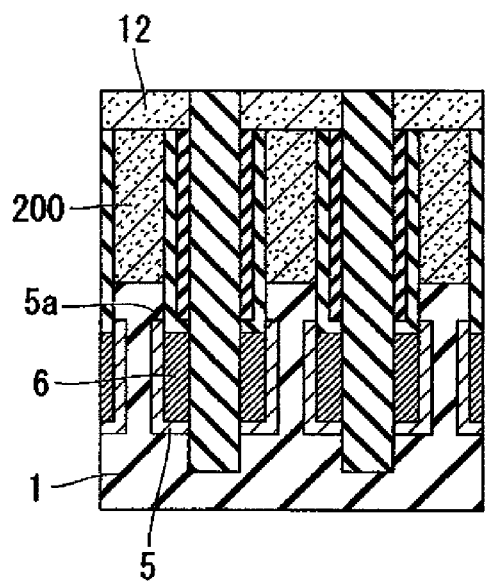
FIGS. 60A through 60D are fragmentary cross sectional elevation views illustrating a method of forming the semiconductor device shown in FIG. 59 in accordance with a first modified embodiment of the present invention.
Figure 60B:
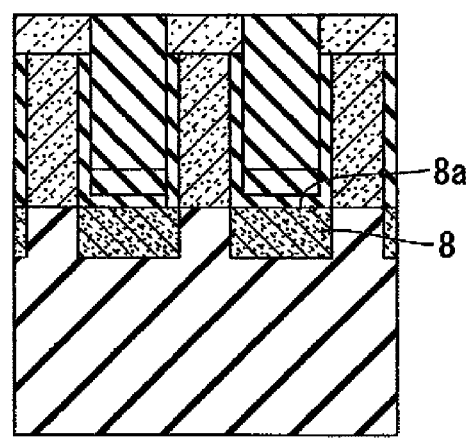
Figure 60C:
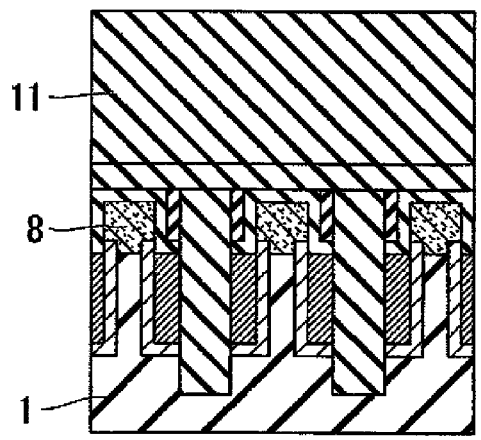
Figure 60D:
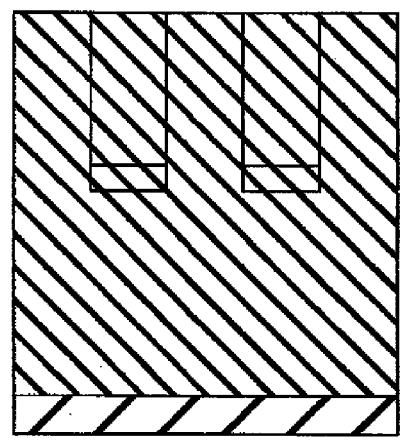

FIG. 60A is a fragmentary cross sectional elevation view illustrating a step involved in a method of forming the semiconductor device shown in FIG. 59, taken along an A-A' line of FIG. 59. FIG. 60B is a fragmentary cross sectional elevation view illustrating the step involved in the method of forming the semiconductor device shown in FIG. 59, taken along a B-B' line of FIG. 59. FIG. 60C is a fragmentary cross sectional elevation view illustrating the step involved in the method of forming the semiconductor device shown in FIG. 59, taken along a C-C' line of FIG. 59. FIG. 60D is a fragmentary cross sectional elevation view illustrating the step involved in the method of forming the semiconductor device shown in FIG. 59, taken along a D-D' line of FIG. 59.

As shown in FIGS. 60A through 60D, even when the gate electrode is not formed, the embedded line can be used without any great problem as a vertical diode by adjusting the concentration of the impurity in the second diffusion layer and adjusting the energy. That is, the impurities can be introduced so that a second diffusion layer 200 is of a P type when the first diffusion layer 8 is of an N type and the second diffusion layer is of an N type when the first diffusion layer 8 is of a P type.

The transistors formed in the semiconductor device may be used as normal transistors, or may be used as a floating body cell (FBC) in which holes are gathered in the transistor body to operate as a memory.

Figure 61A:
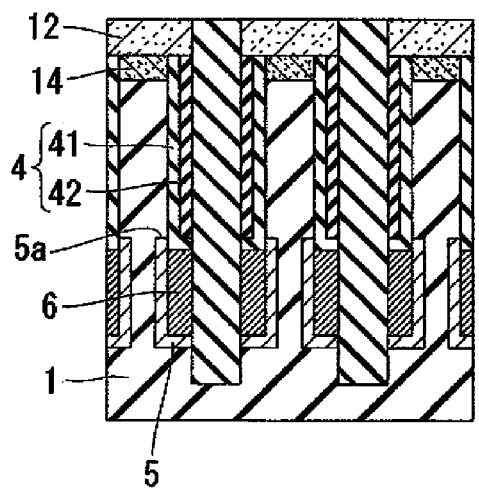
FIGS. 61A through 61D are fragmentary cross sectional elevation views illustrating a method of forming the semiconductor device shown in FIG. 59 in accordance with a second modified embodiment of the present invention.
Figure 61B:
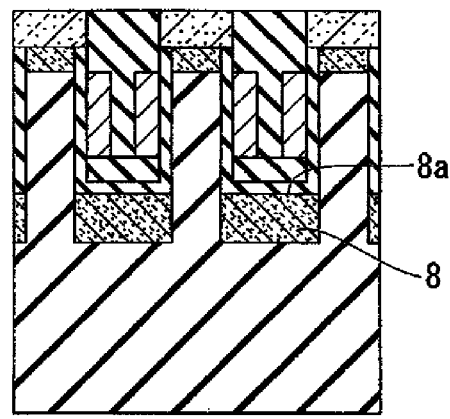
Figure 61C:
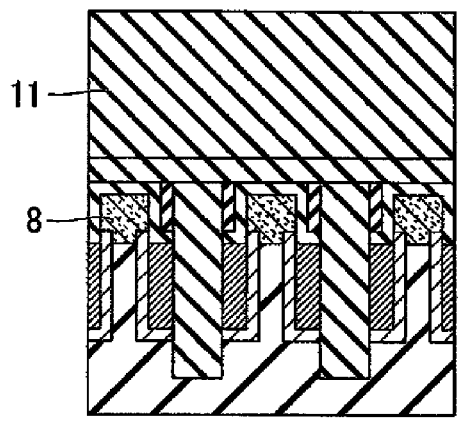
Figure 61D:
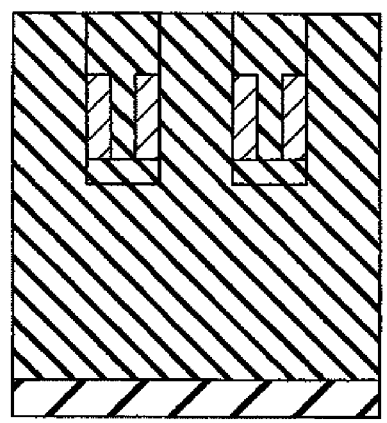

FIG. 61A is a fragmentary cross sectional elevation view illustrating a step involved in a method of forming the semiconductor device shown in FIG. 59, taken along an A-A' line of FIG. 59. FIG. 61B is a fragmentary cross sectional elevation view illustrating the step involved in the method of forming the semiconductor device shown in FIG. 59, taken along a B-B' line of FIG. 59. FIG. 61C is a fragmentary cross sectional elevation view illustrating the step involved in the method of forming the semiconductor device shown in FIG. 59, taken along a C-C' line of FIG. 59. FIG. 61D is a fragmentary cross sectional elevation view illustrating the step involved in the method of forming the semiconductor device shown in FIG. 59, taken along a D-D' line of FIG. 59.

As shown in FIGS. 61A through 61D, the first diffusion layer 8 may be formed over the bit line 6.

Figure 62A:
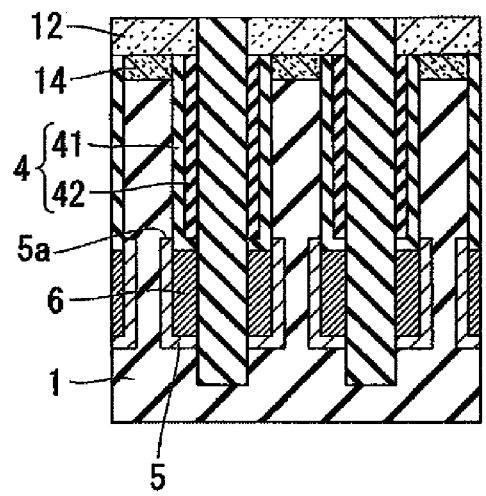
FIGS. 62A through 62D are fragmentary cross sectional elevation views illustrating a method of forming the semiconductor device shown in FIG. 59 in accordance with a third modified embodiment of the present invention.
Figure 62B:
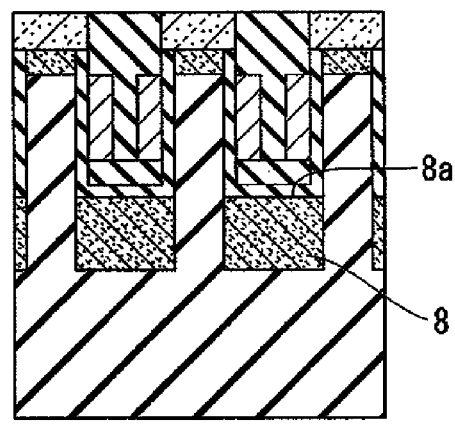
Figure 62C:
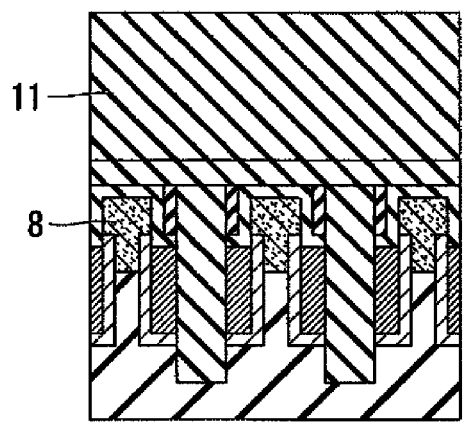
Figure 62D:
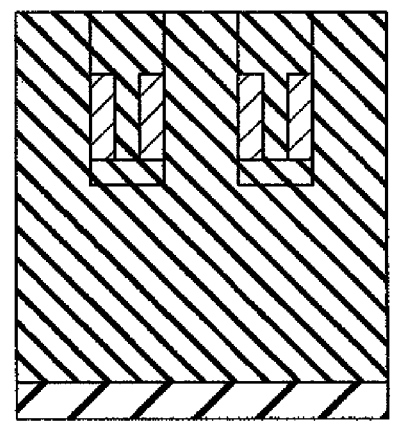

FIG. 62A is a fragmentary cross sectional elevation view illustrating a step involved in a method of forming the semiconductor device shown in FIG. 59, taken along an A-A' line of FIG. 59. FIG. 62B is a fragmentary cross sectional elevation view illustrating the step involved in the method of forming the semiconductor device shown in FIG. 59, taken along a B-B' line of FIG. 59. FIG. 62C is a fragmentary cross sectional elevation view illustrating the step involved in the method of forming the semiconductor device shown in FIG. 59, taken along a C-C' line of FIG. 59. FIG. 62D is a fragmentary cross sectional elevation view illustrating the step involved in the method of forming the semiconductor device shown in FIG. 59, taken along a D-D' line of FIG. 59.

As shown in FIGS. 62A through 62D, the portions between the embedded lines lower than the bottom surfaces of the embedded lines may not be divided with the insulating film.

An electron trapping portion such as a floating portion or a nitride film may be disposed in the gate, which may be used as a flash memory.

Figure 63A:
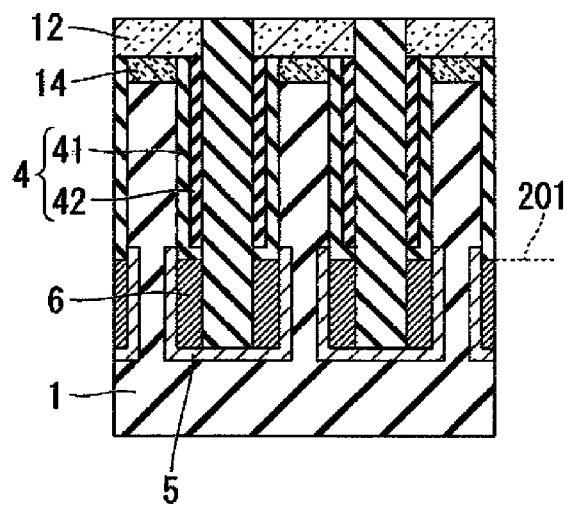
FIGS. 63A through 63D are fragmentary cross sectional elevation views illustrating a method of forming the semiconductor device shown in FIG. 59 in accordance with a fourth modified embodiment of the present invention.
Figure 63B:
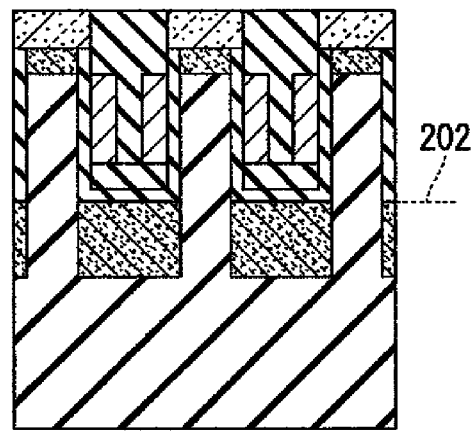
Figure 63C:
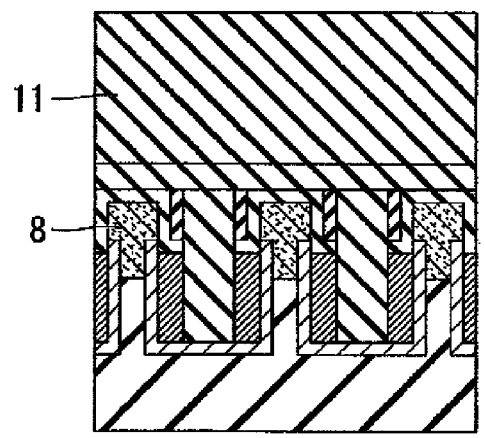
Figure 63D:
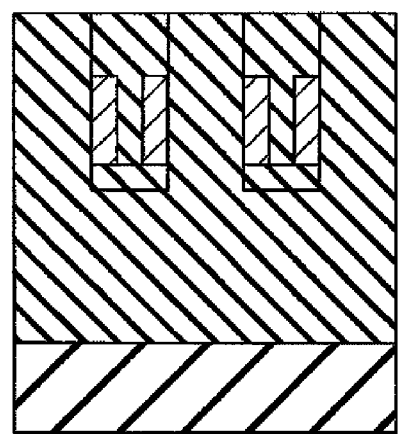

FIG. 63A is a fragmentary cross sectional elevation view illustrating a step involved in a method of forming the semiconductor device shown in FIG. 59, taken along an A-A' line of FIG. 59. FIG. 63B is a fragmentary cross sectional elevation view illustrating the step involved in the method of forming the semiconductor device shown in FIG. 59, taken along a B-B' line of FIG. 59. FIG. 63C is a fragmentary cross sectional elevation view illustrating the step involved in the method of forming the semiconductor device shown in FIG. 59, taken along a C-C' line of FIG. 59. FIG. 63D is a fragmentary cross sectional elevation view illustrating the step involved in the method of forming the semiconductor device shown in FIG. 59, taken along a D-D' line of FIG. 59.

As shown in FIGS. 63A through 63D, the silicide buried line 6 has a top level 201 which is lower in level than a top level 202 of the first diffusion layer 8. Namely, there is a difference in level between the top level 201 of the silicide buried line 6 and the top level 202 of the first diffusion layer 8.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
    a semiconductor substrate comprising a substrate body, a base over the substrate body and a pillar over a first region of the base;
    a buried line adjacent to a side surface of the base;
    a first diffusion layer over a second region of the base;
    a second diffusion layer over the pillar, the second diffusion layer being higher in level than the first diffusion layer; and
    a third diffusion layer disposed between the buried line and the semiconductor substrate, the third diffusion layer being different in level from the first diffusion layer, the top level of the third diffusion layer being lower than the top level of the first diffusion layer.

2. The semiconductor device according to claim 1, wherein the buried line is different in level or depth from the first diffusion layer, and the top level of the buried line is lower than the top level of the first diffusion layer.

3. The semiconductor device according to claim 1, further comprising:
    a gate insulating film covering a side surface of the pillar; and
    a gate electrode separated by the gate insulating film from the side surface of the pillar.

4. The semiconductor device according to claim 1, wherein the semiconductor substrate comprises a single crystal silicon.

5. The semiconductor device according to claim 1, wherein the third diffusion layer has a low potential barrier.

6. The semiconductor device according to claim 1, wherein the buried line comprises a silicide layer.

7. The semiconductor device according to claim 1, wherein the buried line comprises at least one of a single crystal silicon, a polycrystal silicon and an amorphous silicon.

8. The semiconductor device according to claim 1, wherein the buried line comprises a silicide layer includes at least one of $CoSi_2$, $NiSi$, $Ni_2Si$, $Ni_3Si$, $NiSi_2$, $WSi_2$, $TiSi_2$, $VSi_2$, $CrSi_2$, $ZrSi_2$, $NbSi_2$, $MoSi_2$, $TaSi_2$, $CoSi$, $CoSi_2$, $PtSi$, $Pt_2Si$, and $Pd_2Si$.

9. The semiconductor device according to claim 1, further comprising:
   a contact connected to the second diffusion layer; and
   a capacitor connected through the contact to the second diffusion layer.

10. The semiconductor device according to claim 1, further comprising an additional third diffusion layer which is different in impurity concentration than the third diffusion layer, and the third diffusion layer and the additional third diffusion layer are each connected to the buried line.

11. The semiconductor device according to claim 1, wherein the buried line comprises a silicide layer and a metal layer.

12. The semiconductor device according to claim 11, wherein the metal layer comprises at least one of a tungsten layer and a tungsten nitride layer.

13. The semiconductor device according to claim 1, wherein the semiconductor substrate comprises an additional base over the substrate body and an additional pillar over a first region of the additional bases, and
   the semiconductor device comprises an additional first diffusion layer over the second region of the additional bases, the first diffusion layer and the additional first diffusion layer forming first and second transistor regions included in first and second memory cells.

14. The semiconductor device according to claim 13, wherein the first diffusion layer and the additional first diffusion layer are different in impurity concentration from each other, and the first and second transistor regions are each connected to the buried line.

15. The semiconductor device according to claim 13, wherein the first and second transistor regions each have a floating body cell structure.

16. A semiconductor device comprising:
   a semiconductor substrate comprising a substrate body, a base over the substrate body and a pillar over a first region of the base;
   a buried line adjacent to a side surface of the base;
   a first diffusion layer over a second region of the base;
   a second diffusion layer over the pillar, the second diffusion layer being higher in level than the first diffusion layer; and
   a third diffusion layer disposed between the buried line and the semiconductor substrate,
   wherein the buried line is different in level or depth from the first diffusion layer, and the top level of the buried line is lower than the top level of the first diffusion layer.

17. A semiconductor device comprising:
   a semiconductor substrate comprising a substrate body, a base over the substrate body and a pillar over a first region of the base;
   a buried line adjacent to a side surface of the base as a bit line which extends in a first direction as viewed from up;
   a first diffusion layer over a second region of the base, the second region of the base being adjacent to the first region of the base;
   a second diffusion layer over the pillar, the second diffusion layer being higher in level than the first diffusion layer;
   a capacitor formed over the second diffusion layer;
   a word line formed over the first diffusion layer and extending in a second direction substantially perpendicular to the first direction as viewed from the up; and
   a third diffusion layer disposed between the buried line and the semiconductor substrate, the third diffusion layer at least surrounding a portion of the buried line, the third diffusion layer being different in level from the first diffusion layer, the top level of the third diffusion layer being lower than the top level of the first diffusion layer.

* * * * *